(12) United States Patent
Hussein et al.

(10) Patent No.: US 8,766,702 B2
(45) Date of Patent: Jul. 1, 2014

(54) POWER SEMICONDUCTOR DEVICE HAVING PLURALITY OF SWITCHING ELEMENTS CONNECTED IN PARALLEL

(75) Inventors: Khalid Hassan Hussein, Chiyoda-ku (JP); Toshiyuki Kumagai, Fukuoka (JP); Shoji Saito, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/440,404

(22) Filed: Apr. 5, 2012

(65) Prior Publication Data

US 2012/0280728 A1 Nov. 8, 2012

(30) Foreign Application Priority Data

May 2, 2011 (JP) .................................. 2011-102779
Mar. 12, 2012 (JP) .................................. 2012-054269

(51) Int. Cl.
*H03K 17/687* (2006.01)
(52) U.S. Cl.
USPC ........... 327/427; 327/108; 327/109; 327/434; 327/170; 327/374
(58) Field of Classification Search
USPC .......................................................... 327/427
See application file for complete search history.

(56) References Cited

U.S. PATENT DOCUMENTS

2001/0050853 A1    12/2001  Morita et al.
2003/0231047 A1 *  12/2003  Deaton .......................... 327/427
2008/0197908 A1 *   8/2008  Williams ........................ 327/431

FOREIGN PATENT DOCUMENTS

| CN | 1329389 A | 1/2002 |
|---|---|---|
| JP | 5-291913 | 11/1993 |
| JP | 529193 | * 11/1993 |
| JP | 6-209565 | 7/1994 |
| JP | 6-209566 | 7/1994 |
| JP | 2000-92820 | 3/2000 |
| JP | 2004-516767 | 6/2004 |
| JP | 2009-135626 A | 6/2009 |

OTHER PUBLICATIONS

Office Action issued Dec. 18, 2012, in German Patent Application No. 10 2012 207 222.5 with English translation.
U.S. Appl. No. 13/370,858, filed Feb. 10, 2012, Hussein, et al.
Korean Office Action issued Jul. 22, 2013, in Korea Patent Application No. 10-2012-0044400 (with English translation).

* cited by examiner

*Primary Examiner* — Long Nguyen
*Assistant Examiner* — Patrick Chen
(74) *Attorney, Agent, or Firm* — Oblon, Spivak, McClelland, Maier & Neustadt, L.L.P.

(57) ABSTRACT

A power semiconductor device includes first and second power semiconductor elements connected in parallel to each other and a drive control unit. The drive control unit turns on or off each of the first and second power semiconductor elements in response to an ON instruction and an OFF instruction repeatedly received from outside. Specifically, the drive control unit can switch between a case where the first and second power semiconductor elements are simultaneously turned on and a case where one of the first and second power semiconductor elements is turned on first and thereafter the other thereof is turned on, in response to the ON instruction. The drive control unit turns off one of the first and second power semiconductor elements first and thereafter turns off the other thereof, in response to the OFF instruction.

16 Claims, 36 Drawing Sheets

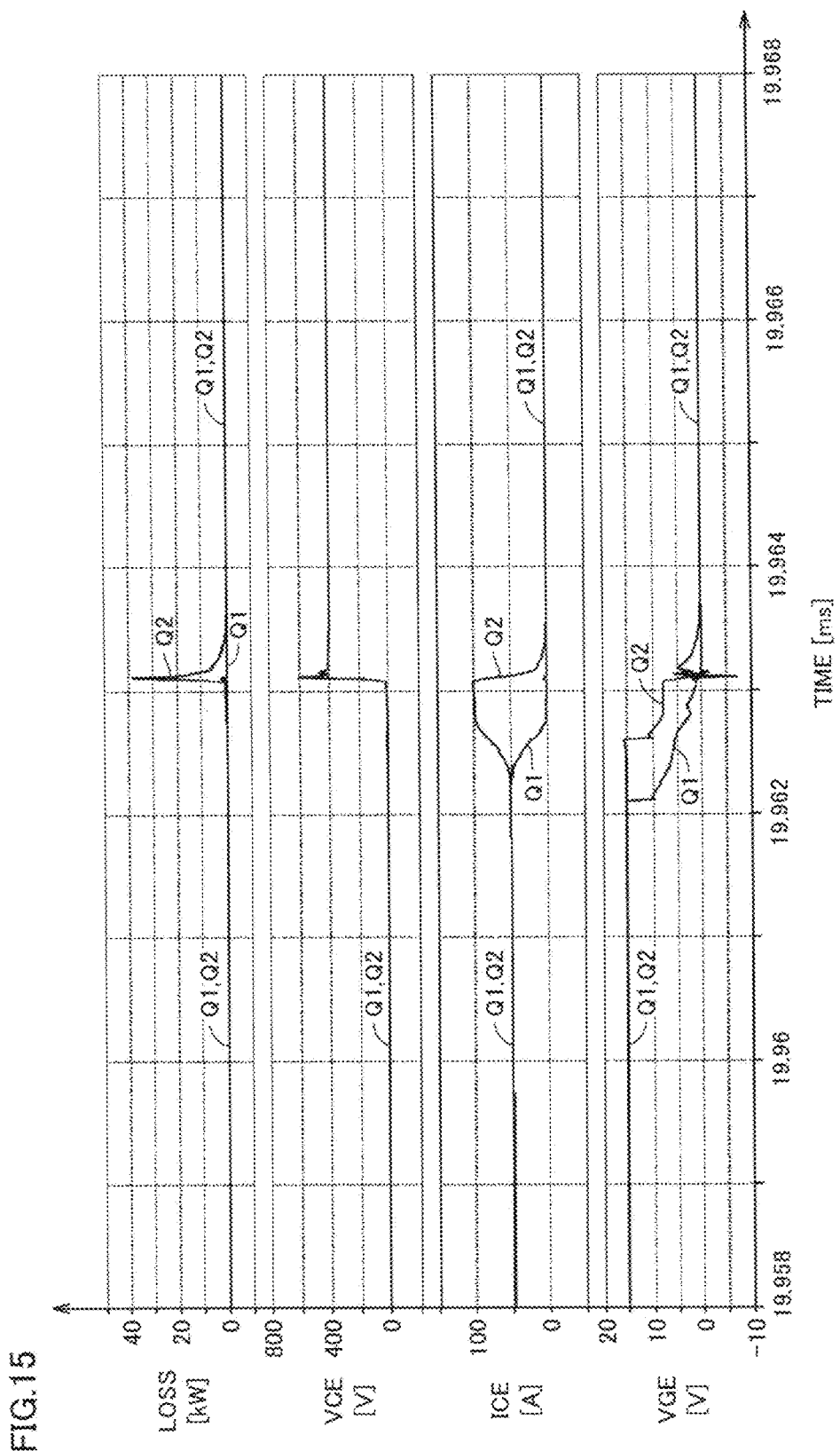

POWER SEMICONDUCTOR DEVICE HAVING PLURALITY OF SWITCHING ELEMENTS CONNECTED IN PARALLEL

BACKGROUND OF THE INVENTION

1. Field of the Invention

The present invention relates to a power semiconductor device used in power conversion equipment or the like.

2. Description of the Background Art

A power semiconductor element such as a power MOSFET (Metal-Oxide-Semiconductor Field-Effect Transistor) or an IGBT (Insulated Gate Bipolar Transistor) is used for controlling power equipment such as a motor drive inverter, an uninterruptible power supply, and a frequency conversion device. Since a rated voltage and a rated current of such power equipment tend to increase, a power semiconductor element is also required to adapt to a higher withstand voltage and a higher current.

A method of connecting a plurality of power semiconductor elements in parallel has been known as a method of increasing an amount of current that can be controlled by the power semiconductor element (see, for example, Japanese Patent Laying-Open No. 2000-92820).

In such a case as in the document above where a plurality of power semiconductor elements are connected in parallel, these elements are normally simultaneously switched by using the same drive signal. Therefore, as the number of power semiconductor elements in parallel is greater or a switching frequency is higher, switching loss (turn-on loss and turn-off loss) increases.

For example, a method described in Japanese Patent Laying-Open No. 05-291913 has been known as a method for reducing turn-off loss in power semiconductor elements connected in parallel. According to the method in this document, a first IGBT having a low saturation voltage and a long fall time and a second IGBT having a high saturation voltage and a short fall time are connected in parallel and an input resistor is inserted in a gate of the second IGBT. As the first and second IGBTs are operated by a common drive signal, a time point of disconnection of the second IGBT is later than a time point of disconnection of the first IGBT and hence a turn-off operation can be performed based on a short fall time of the second IGBT.

A similar technique is described in Japanese Patent Laying-Open No. 06-209565 and Japanese Patent Laying-Open No. 06-209566, although they do not aim to reduce switching loss. Both of the documents disclose switching circuits connected in series, each of which is constituted of a main semiconductor element and a detection semiconductor element connected in parallel thereto. Specifically, according to the technique described in former Japanese Patent Laying-Open No. 06-209565, a gate of the main semiconductor element and a gate drive circuit are connected to each other with an OFF delay circuit being interposed, and a gate of the detection semiconductor element and the gate drive circuit are connected to each other with an ON delay circuit being interposed. According to the technique described in latter Japanese Patent Laying-Open No. 06-209566, a gate of the detection semiconductor element and a gate drive circuit are connected to each other with an OFF delay circuit being interposed, and a gate of the main semiconductor element and the gate drive circuit are connected to each other with an ON delay circuit being interposed.

Japanese Patent Laying-Open No. 05-291913 above considers reduction of switching loss, however, it pays attention only to reduction of turn-off loss and it does not consider turn-on loss. In addition, since the method described in this document includes connecting the first IGBT having a low saturation voltage and a long fall time and the second IGBT having a high saturation voltage and a short fall time in parallel to each other, it is not applicable to a case where power semiconductor elements having the same characteristics are connected in parallel.

SUMMARY OF THE INVENTION

An object of the present invention is to reduce switching loss in a case where a plurality of power semiconductor elements are connected in parallel as compared with a conventional example.

A power semiconductor device according to one aspect of the present invention includes first and second power semiconductor elements connected in parallel to each other and a drive control unit. The drive control unit turns on or off each of the first and second power semiconductor elements in response to an ON instruction and an OFF instruction repeatedly received from outside. Specifically, the drive control unit is capable of switching between a case where the first and second power semiconductor elements are simultaneously turned on and a case where one of the first and second power semiconductor elements is turned on first and thereafter the other thereof is turned on, in response to the ON instruction. The drive control unit turns off one of the first and second power semiconductor elements first and thereafter turns off the other thereof, in response to the OFF instruction.

According to the present invention, in response to the ON instruction, switching between a case where the first and second power semiconductor elements are simultaneously turned on and a case where they are turned on at different timing can be made, and in response to the OFF instruction, the first and second power semiconductor elements are turned off at different timing. Therefore, a primary advantage of the present invention resides in ability to reduce switching loss as compared with a conventional example.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15 is an enlarged view at the time of turn-off in FIG. 13.

FIG. 38 is a circuit diagram showing a configuration of a power semiconductor device 213 according to Embodiment 20 of the present invention.

DESCRIPTION OF THE PREFERRED EMBODIMENTS

Figure 1:
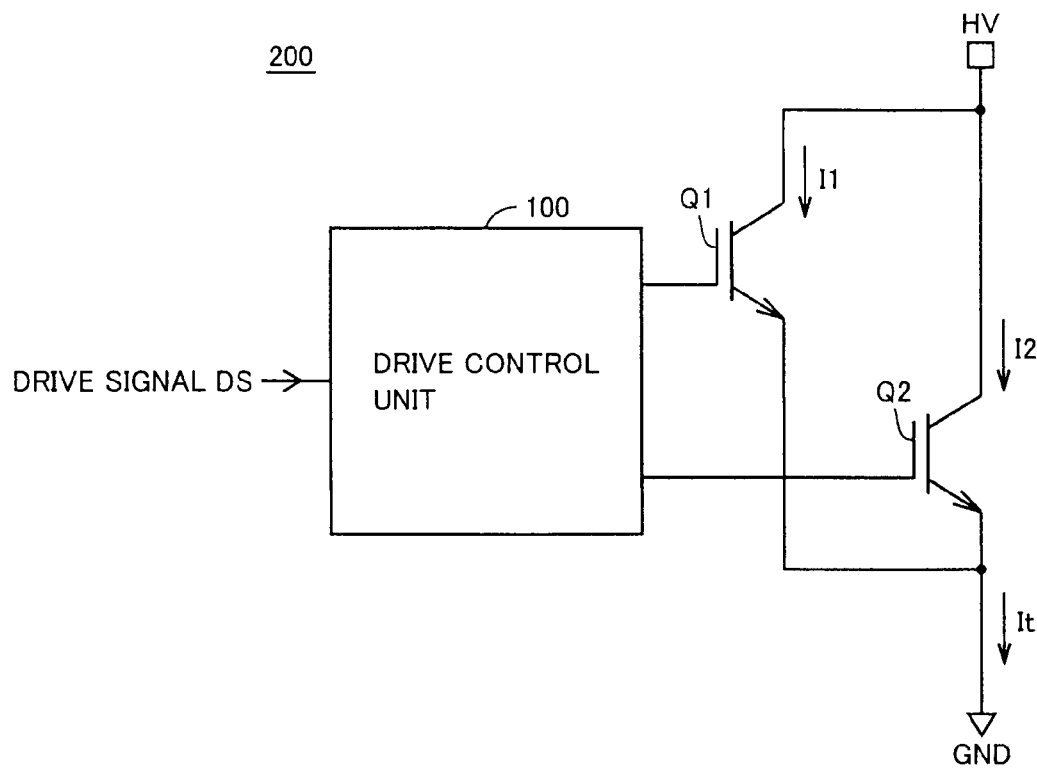
FIG. 1 is a diagram of a configuration of a power semiconductor device 200 according to Embodiment 1 of the present invention.

An embodiment of the present invention will be described hereinafter in detail with reference to the drawings. It is noted that the same or corresponding elements have the same reference characters allotted and description thereof will not be repeated.

Embodiment 1

[Configuration of Power Semiconductor Device 200]

FIG. 1 is a diagram of a configuration of a power semiconductor device 200 according to Embodiment 1 of the present invention. Referring to FIG. 1, power semiconductor device 200 includes power semiconductor elements Q1, Q2 connected in parallel to each other between a high-voltage node HV and a ground node GND and a drive control unit 100. Though FIG. 1 exemplifies an IGBT as power semiconductor element Q1, Q2, other semiconductor elements such as a power MOSFET and a bipolar transistor may be applicable.

Power semiconductor elements Q1, Q2 are hereinafter also referred to as Q1, Q2, respectively. High-voltage node HV to which collectors of respective IGBTs Q1, Q2 are connected is connected to electric equipment to be controlled, and a high voltage is applied thereto.

Drive control unit 100 switches IGBTs Q1, Q2 to ON or OFF in accordance with a logic level of a drive signal DS received from the outside. Drive control unit 100 according to this embodiment is assumed to turn on power semiconductor elements Q1, Q2 when it receives drive signal DS at a high level (the H level) and turns off power semiconductor elements Q1, Q2 when it receives drive signal DS at a low level (the L level). Drive signal DS at the H level is also referred to as an ON instruction, while drive signal DS at the L level is also referred to as an OFF instruction. The ON instruction and the OFF instruction are alternately and repeatedly provided to drive control unit 100. A specific configuration example of drive control unit 100 will be described in Embodiment 2 and so on.

[Operation of Power Semiconductor Device 200]

Figure 2A:
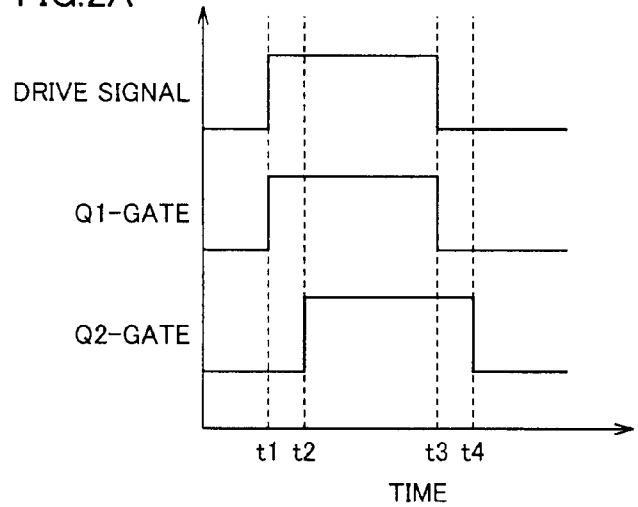
FIG. 2A is a timing chart showing relation between a drive signal DS and gate voltages of power semiconductor elements Q1, Q2 (in a case where magnitude of a total current It is relatively small).
Figure 2B:
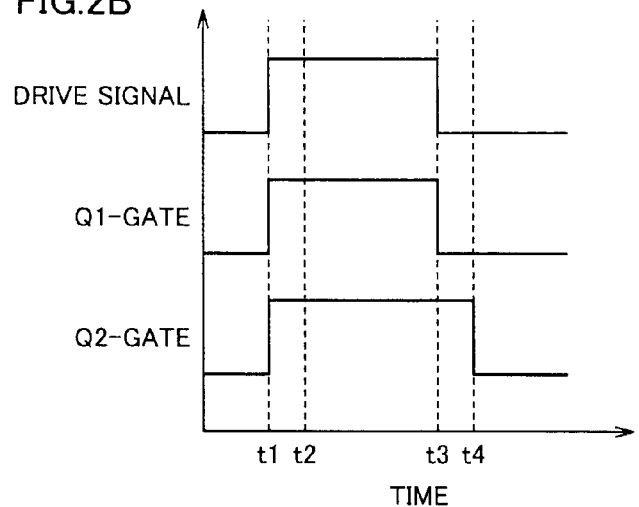
FIG. 2B is a timing chart showing relation between drive signal DS and gate voltages of power semiconductor elements Q1, Q2 (in a case where magnitude of total current It is moderate).
Figure 2C:
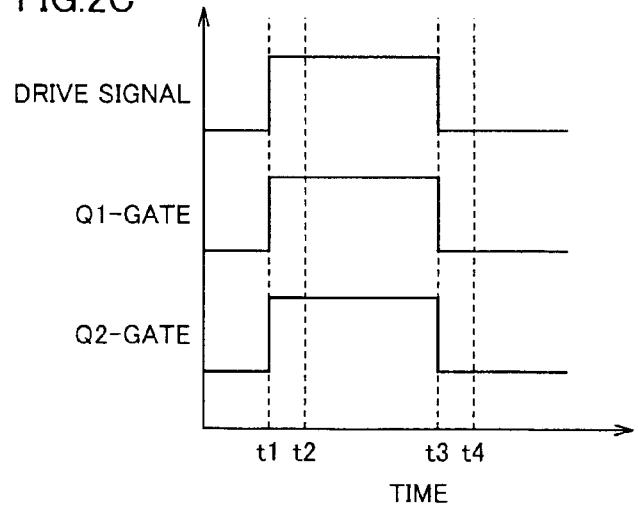
FIG. 2C is a timing chart showing relation between drive signal DS and gate voltages of power semiconductor elements Q1, Q2 (in a case where magnitude of total current It is relatively great).

FIGS. 2A to 2C are timing charts showing relation between drive signal DS and gate voltages of power semiconductor elements Q1, Q2. Referring to FIGS. 1 and 2A to 2C, when drive control unit 100 receives the ON instruction and switches IGBTs Q1, Q2 to ON, it can switch between a case where IGBTs Q1, Q2 are simultaneously turned on and a case where one of IGBTs Q1, Q2 (for example, IGBT Q1) is turned on first and thereafter the other thereof is turned on. In addition, when drive control unit 100 receives the OFF instruction and switches IGBTs Q1, Q2 to OFF, it can switch between a case where IGBTs Q1, Q2 are simultaneously turned off and a case where one of IGBTs Q1, Q2 (for example, IGBT Q1) is turned off first and thereafter the other thereof is turned off. Whether to simultaneously switch IGBTs Q1, Q2 or to independently switch them at different timing can be determined based on magnitude of main currents I1, I2 (or total current It which is combination of main currents I1 and I2) that flow through IGBTs Q1, Q2 respectively when IGBTs Q1, Q2 are turned on (conducting) in response to the ON instruction. Specifically, in Embodiment 1, total current It that flows through power semiconductor elements Q1, Q2 is divided into three regions based on magnitude.

FIG. 2A shows a case where magnitude of total current It is relatively small. Here, as drive signal DS switches from the L level to the H level at time t1, drive control unit 100 switches IGBT Q1 to ON by applying a voltage at the H level to a gate of IGBT Q1. At subsequent time t2, drive control unit 100 switches IGBT Q2 to ON by applying a voltage at the H level to a gate of IGBT Q2. As drive signal DS switches from the H level to the L level at time t3, drive control unit 100 switches IGBT Q1 to OFF by applying a voltage at the L level to the gate of IGBT Q1. At subsequent time t4, drive control unit 100 switches IGBT Q2 to OFF by applying a voltage at the L level to the gate of IGBT Q2. Therefore, at the time of turn-on, switching loss (turn-on loss Eon) is mainly caused in IGBT Q1 that is turned on first, whereas at the time of turn-off, switching loss (turn-off loss Eoff) is mainly caused in IGBT Q2 that is subsequently turned off.

FIG. 2B shows a case where magnitude of total current It is moderate. Here, as drive signal DS switches from the L level to the H level at time t1, drive control unit 100 simultaneously switches IGBTs Q1, Q2 to ON by applying a voltage at the H level to gates of both of IGBTs Q1, Q2. As drive signal DS switches from the H level to the L level at time t3, drive control unit 100 switches IGBT Q1 to OFF by applying a voltage at the L level to the gate of IGBT Q1. At subsequent time t4, drive control unit 100 switches IGBT Q2 to OFF by applying a voltage at the L level to the gate of IGBT Q2. Therefore, at the time of turn-on, switching loss (turn-on loss Eon) is caused in both of IGBTs Q1, Q2. At the time of turn-off, switching loss (turn-off loss Eoff) is mainly caused in IGBT Q2 that is subsequently turned off.

FIG. 2C shows a case where magnitude of total current It is relatively great. In this case, as drive signal DS switches from the L level to the H level at time t1, drive control unit 100 simultaneously switches IGBTs Q1, Q2 to ON by applying a voltage at the H level to the gates of both of IGBTs Q1, Q2. As drive signal DS switches from the H level to the L level at time t3, drive control unit 100 simultaneously switches IGBTs Q1, Q2 to OFF by applying a voltage at the L level to the gates of both of IGBTs Q1, Q2. Therefore, at the time of both of turn-on and turn-off, switching loss is caused in both of IGBTs Q1, Q2.

Though IGBT Q1 is switched to ON or OFF earlier than IGBT Q2 in successively switching IGBTs Q1, Q2 at different timing in the above, any of them may be switched first if IGBTs Q1, Q2 are identical in characteristics.

[Reasons why Method in FIGS. 2A to 2C is used for Controlling Switching]

Reasons why switching of IGBTs Q1, Q2 is controlled with the method above will now be described.

Figure 3A:
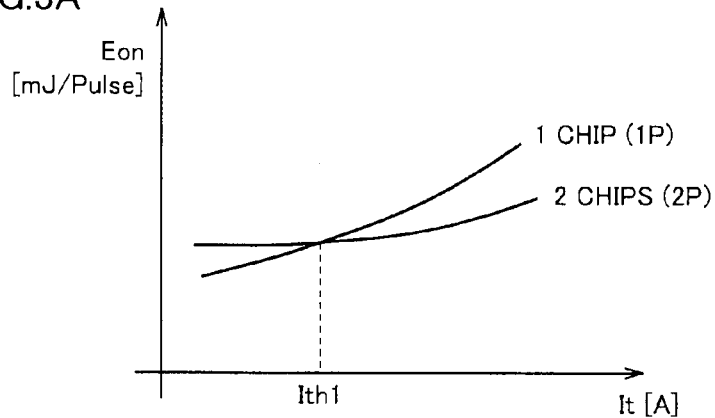
FIG. 3A is a diagram showing relation between magnitude of total current It that flows through IGBTs Q1, Q2 in an ON state and magnitude of turn-on loss Eon.
Figure 3B:
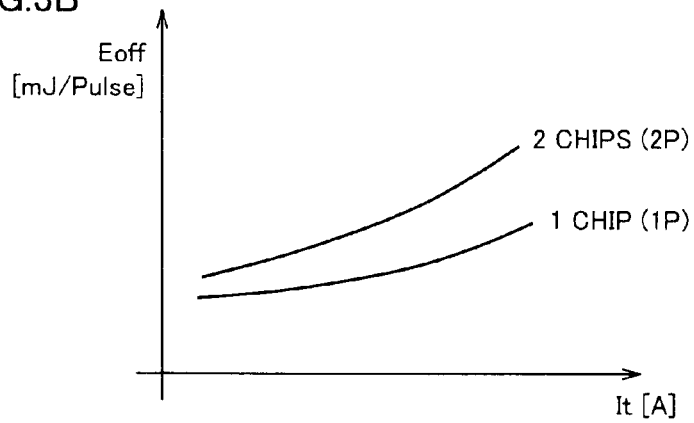
FIG. 3B is a diagram showing relation between magnitude of total current It that flows through IGBTs Q1, Q2 in the ON state and magnitude of turn-off loss Eoff.

FIG. 3A is a diagram showing relation between magnitude of total current It that flows through IGBTs Q1, Q2 in the ON state and magnitude of turn-on loss Eon. FIG. 3B is a diagram showing relation between magnitude of total current It that flows through IGBTs Q1, Q2 in the ON state and magnitude of turn-off loss Eoff. In FIGS. 3A and 3B, turn-on loss Eon and turn-off loss Eoff are expressed as electric power (mJ) consumed per one pulse (Pulse) of drive signal DS. A case where IGBTs Q1, Q2 are each switched alone at different timing is denoted as 1 chip (1P), whereas a case where IGBTs Q1, Q2 are simultaneously switched is denoted as 2 chips (2P).

Referring to FIG. 3A, in a case where total current It that flows through IGBTs Q1, Q2 is smaller than a certain threshold value Ith1, IGBTs Q1, Q2 turned on alone at different timing result in turn-on loss Eon less than in a case where IGBTs Q1, Q2 are simultaneously turned on. In a case where total current It is greater than threshold value Ith1, IGBTs Q1, Q2 simultaneously turned on result in turn-on loss Eon less than in a case where IGBTs Q1, Q2 are each turned on alone. Therefore, when total current It is equal to or smaller than threshold value Ith1, drive control unit 100 in FIG. 1 turns on IGBT Q1 first and subsequently turns on IGBT Q2 as shown in FIG. 2A. When total current It is greater than threshold value Ith1, drive control unit 100 simultaneously turns on IGBTs Q1, Q2 as shown in FIG. 2B. Thus, turn-on loss Eon can be reduced as compared with the conventional example.

Referring to FIG. 3B, in a case of turn-off loss Eoff, IGBTs Q1, Q2 turned off alone at different timing regardless of magnitude of total current It that flows through IGBTs Q1, Q2 in a conducting state result in turn-off loss Eoff less than in a case where they are simultaneously turned off. Therefore, as shown in FIGS. 2A and 2B, drive control unit 100 in FIG. 1 turns off IGBT Q1 first and subsequently turns off IGBT Q2. Thus, as compared with a case where IGBTs Q1, Q2 are simultaneously turned off, turn-off loss Eoff can be reduced.

It is noted that, in a case where IGBTs Q1, Q2 are each turned off alone, total current It that flows through IGBTs Q1, Q2 exceeding maximum rating per one element may break an element to be turned off subsequently. Then, in order to prevent breakage of an element, when total current It is close to the maximum rating per one element, IGBTs Q1, Q2 are simultaneously turned off as shown in FIG. 2C.

Figure 4:
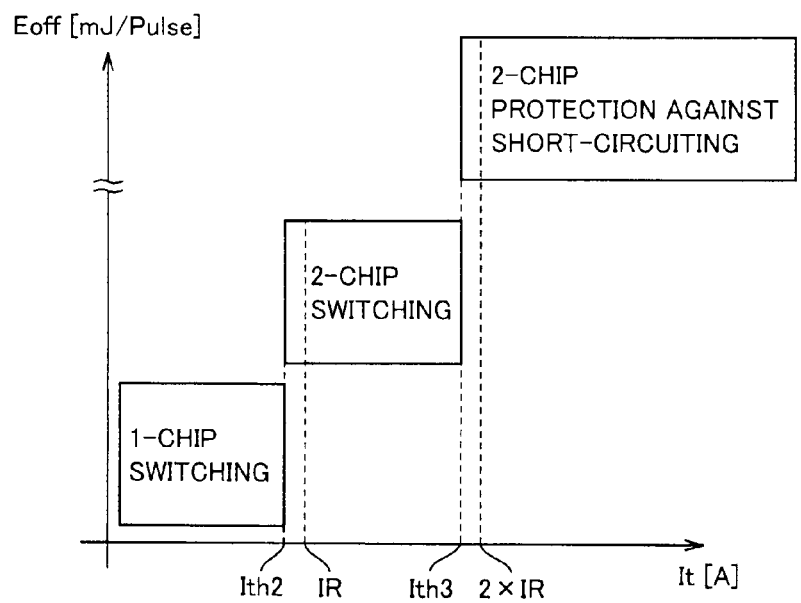
FIG. 4 is a conceptual diagram for illustrating timing control when IGBTs Q1, Q2 are turned off.

FIG. 4 is a conceptual diagram for illustrating timing control at the time of turn-off of IGBTs Q1, Q2.

Referring to FIG. 4, maximum rating of a main current per one element of IGBTs Q1, Q2 is assumed as IR. A threshold value Ith2 is set to a value slightly lower than maximum rating IR and a threshold value Ith3 is set to a value slightly lower than twice maximum rating IR (2×IR). When total current It that flows through IGBTs Q1, Q2 in a conducting state is lower than threshold value Ith2, drive control unit 100 in FIG. 1 controls IGBTs Q1, Q2 such that each of them is successively turned off in response to the OFF instruction. When total current It is equal to or higher than threshold value Ith2 and lower than threshold value Ith3, drive control unit 100 controls IGBTs Q1, Q2 such that they are simultaneously turned off in response to the OFF instruction. Though turn-off loss Eoff increases as compared with a case where each one element is successively turned off, such switching control is carried out for protection against short-circuiting of an IGBT. When total current It is equal to or higher than threshold value Ith3, protection against short-circuiting for controlling IGBTs Q1, Q2 such that they are both turned off regardless of a logic level of drive signal DS is provided.

[Reasons why Switching Characteristics in FIGS. 3A and 3B are Obtained]

Reasons why switching characteristics shown in FIGS. 3A and 3B are obtained will now be described.

Figure 5:
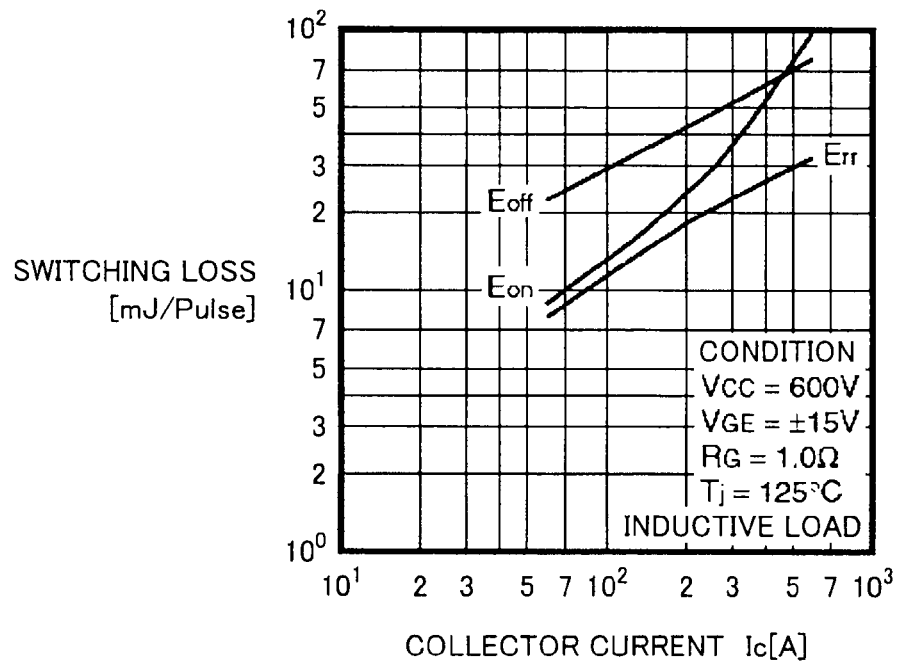
FIG. 5 is a diagram showing relation between switching loss and a collector current of the IGBT.

FIG. 5 is a diagram showing relation between switching loss and a collector current of the IGBT. FIG. 5 shows dependency on collector current Ic, of turn-on loss Eon, turn-off loss Eoff, and switching loss Err in a reverse recovery operation.

Figure 6:
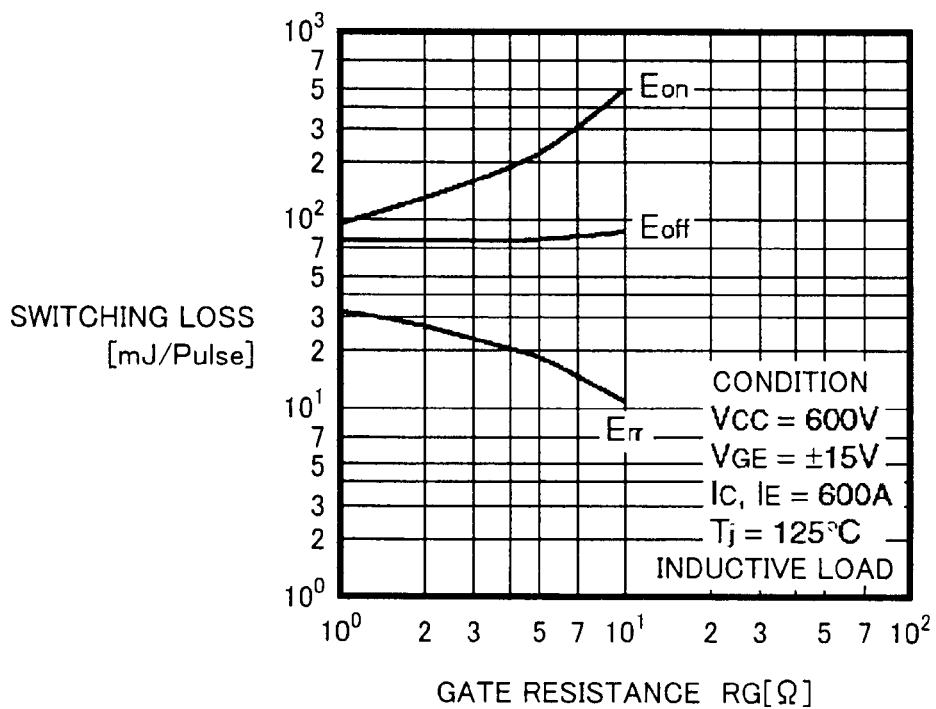
FIG. 6 is a diagram showing relation between switching loss and a gate resistance of the IGBT.

FIG. 6 is a diagram showing relation between switching loss and a gate resistance of the IGBT. FIG. 6 shows dependency on a gate resistance RG, of turn-on loss Eon, turn-off loss Eoff, and switching loss Err in a reverse recovery operation. The characteristics diagrams shown in FIGS. 5 and 6 are extracted from data sheets of an IGBT module (model number: CM600HX-24A) of Mitsubishi Electric Corporation.

(1. Turn-Off Loss Eoff)

Referring to FIG. 5, turn-off loss Eoff is expressed as a power function of collector current Ic (that is, in a double logarithmic graph shown in FIG. 5, turn-off loss Eoff is in proportion to collector current Ic). Denoting an exponent with a symbol "^", turn-off loss Eoff can be expressed by using constants a, b as follows.

$$Eoff = a \times Ic^b \quad (1)$$

Denoting a current that flows through each of IGBTs Q1, Q2 in FIG. 1 as Io [A], turn-off loss Eoff_1P at the time when an element is turned off one by one is expressed as follows.

$$Eoff\_1P = a \times (2 \times Io)^b \quad (2)$$

Turn-off loss Eoff_2P at the time when two elements are simultaneously turned off is expressed as follows.

$$Eoff\_2P = 2 \times a \times Io^b \quad (3)$$

A ratio between Equations (2) and (3) above is expressed as follows.

$$Eoff\_1P / Eoff\_2P = 2^{(b-1)} \quad (4)$$

Therefore, if b<1, relation shown below is satisfied.

$$Eoff\_1P < Eoff\_2P \quad (5)$$

Relation of b<1 means that a slope of the graph in FIG. 5 is smaller than 1, and this relation of b<1 is normally satisfied.

Verification is conducted by using a specific numeric value. It is assumed that a main current of 200 [A] per one element flows through IGBTs Q1, Q2 shown in FIG. 1 (that is, I1=I2=200 [A]). Then, total current It is 400 [A]. Referring to FIG. 5, turn-off loss Eoff when the collector current is 200 [A] is approximately 41 mJ/Pulse, and when the collector current is 400 [A], turn-off loss Eoff is approximately 62 mJ/Pulse. Therefore, turn-off loss Eoff when two elements are simultaneously switched to OFF is 82 mJ/Pulse in total, whereas turn-off loss Eoff when an element is switched to OFF one by one is 62 mJ/Pulse because loss is caused in an element subsequently turned off. Thus, switching to OFF of an element one by one results in less turn-off loss Eoff.

It is noted that, regarding turn-off loss Eoff, turn-off loss Eoff is hardly dependent on gate resistance RG as shown in FIG. 6, and it can be seen that characteristics of turn-off loss Eoff are substantially determined by element characteristics of an IGBT. The results above can qualitatively be considered as follows.

Figure 7:
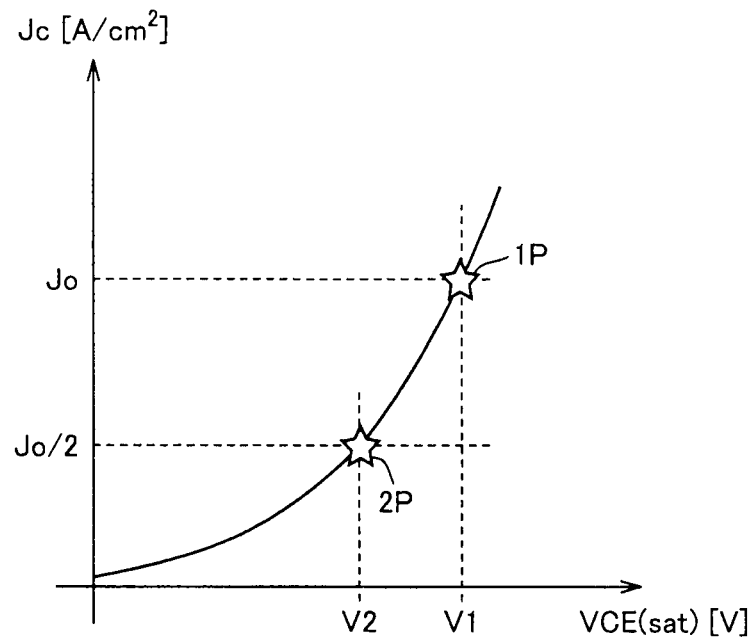
FIG. 7 is a diagram showing relation between collector current density Jc and a saturation voltage VCE(sat).

FIG. 7 is a diagram showing relation between collector current density Jc and a saturation voltage VCE(sat). Referring to FIG. 7, it is assumed that IGBTs Q1, Q2 identical in characteristics and size are connected in parallel. In switching to OFF a chip one by one (1P), a cross-sectional area of a portion through which a main current flows is half that in a case where two chips are simultaneously turned off (2P), and hence collector current density Jc is twice per one chip. Then, as collector current density Jc increases, saturation voltage VCE(sat) increases.

Figure 8:
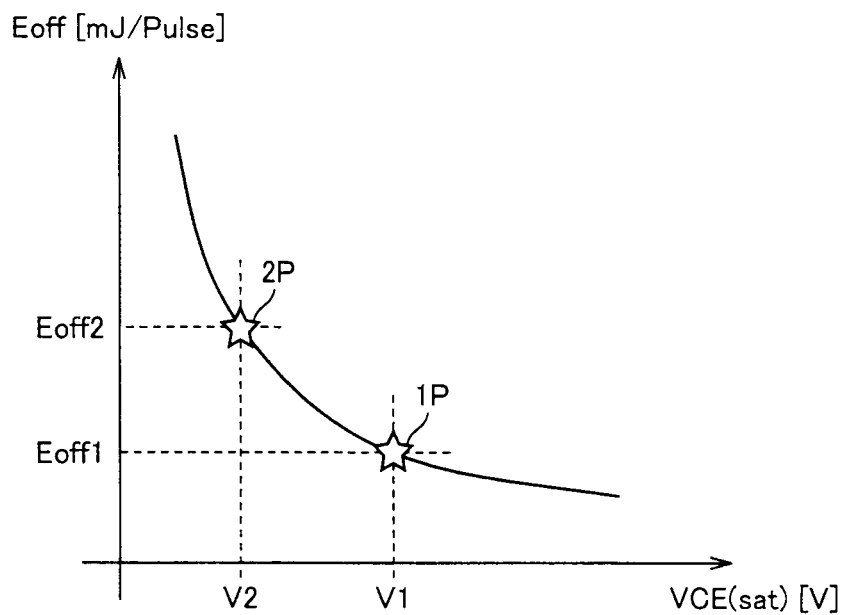
FIG. 8 is a diagram showing relation between turn-off loss Eoff and saturation voltage VCE(sat).

FIG. 8 is a diagram showing relation between turn-off loss Eoff and saturation voltage VCE(sat). Referring to FIG. 8, in a bipolar element, turn-off loss Eoff and saturation voltage VCE(sat) satisfy trade-off relation. Therefore, a case of switching to OFF a chip one by one (1P) is smaller in turn-off loss Eoff than in a case where two chips are simultaneously turned off (2P). Needless to say, steady loss when IGBTs Q1, Q2 are conducting in response to the ON instruction is the same both in successive turn-off (1P) and simultaneous turn-off (2P).

(2. Turn-On Loss Eon)

Referring again to FIG. 5, turn-on loss Eon can substantially be expressed as an exponential function of collector current Ic (in the double logarithmic graph shown in FIG. 5, turn-on loss Eon and collector current Ic do not satisfy direct proportional relation). Therefore, turn-on loss Eon can be expressed by using constants a, b as follows.

$$Eon = a \times \exp(Ic \times b) \quad (6)$$

In Equation (6) above, "exp( . . . )" represents an exponential function.

Denoting a current that flows through each of IGBTs Q1, Q2 in FIG. 1 as Io [a], turn-on loss Eon_1P when an element is turned on one by one is expressed as follows.

$$Eon\_1P = a \times \exp(2 \times Io \times b) \quad (7)$$

Turn-on loss Eon_2P when two elements are simultaneously turned on is expressed as follows.

$$Eon\_2P = 2 \times a \times \exp(Io \times b) \quad (8)$$

A ratio between Equations (7) and (8) above is expressed as follows.

$$Eon\_1P / Eon\_2P = \exp(Io \times b) / 2 \quad (9)$$

Therefore, in a region of relatively low current where relation of Io<b×ln(2) is satisfied (In representing a natural logarithm), relation as follows is satisfied.

$$Eon\_1P < Eon\_2P \quad (10)$$

In a region of relatively high current where relation of Io>b× 1n(2) is satisfied, relation as follows is satisfied.

$$Eon\_1P > Eon\_2P \quad (11)$$

Figure 9:
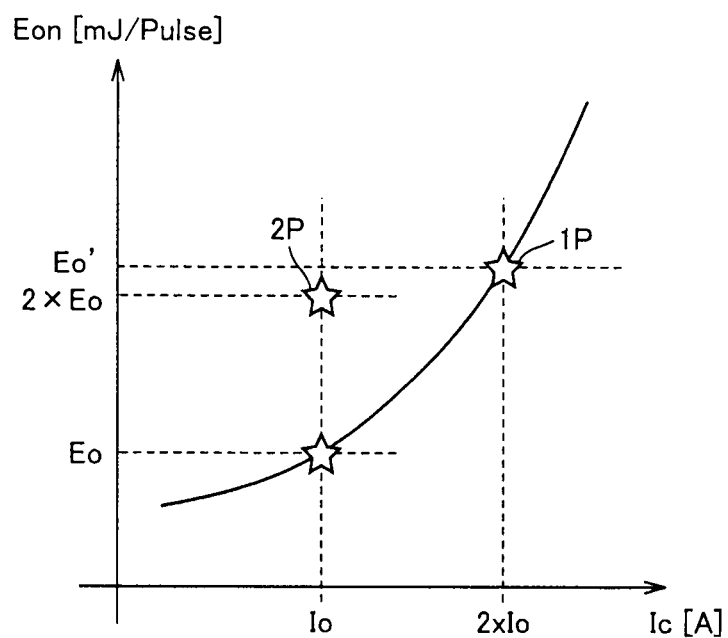
FIG. 9 is a diagram showing relation between a collector current Ic and turn-on loss Eon of the IGBT.

FIG. 9 is a diagram showing relation between collector current Ic and turn-on loss Eon of the IGBT. Referring to FIG. 9, it is assumed that a collector current Io flows through each of IGBTs Q1, Q2 in the ON state connected in parallel and turn-on loss Eon corresponding to collector current Io is denoted as Eo [mJ/Pulse]. Therefore, turn-on loss Eon in simultaneously switching two elements to ON is 2×Eo (a point 2P in FIG. 9). In successively switching elements to ON one by one, a current of 2×Io flows through an element switched to ON first, and hence turn-on loss Eon in this case is Eo' (a point 1P) in FIG. 9.

Since turn-on loss Eon exponentially increases with increase in collector current Ic, loss Eo' is greater than 2×Eo when current Io is relatively high, as shown in FIG. 9. Therefore, simultaneous switching of two elements to ON results in lower loss. In contrast, when current Io is relatively low, loss Eo' is less than 2×Eo. Therefore, successive switching of elements to ON one by one results in lower loss.

It is noted that it is not only collector current Ic that is relevant to turn-on loss Eon. As shown in FIG. 6, turn-on loss Eon exhibits exponential relation with gate resistance RG. Namely, as gate resistance RG increases, turn-on loss Eon exponentially increases. In addition, a capacity of an IGBT (an input capacity, a mirror capacity) and characteristics of a freewheel diode are also relevant to turn-on loss.

[Simulation Results]

FIGS. 10 to 15 and 16A and 16B show results of simulation in connection with IGBTs connected in parallel. In waveform diagrams shown in FIGS. 10 to 15, waveform diagrams of loss [kW], a collector-emitter voltage VCE [V], a collector-emitter current ICE [A], and a gate-emitter voltage VGE [V] for each of IGBTs Q1, Q2 are shown from above. Loss is a product of collector-emitter voltage VCE and collector-emitter current ICE.

Figure 10:
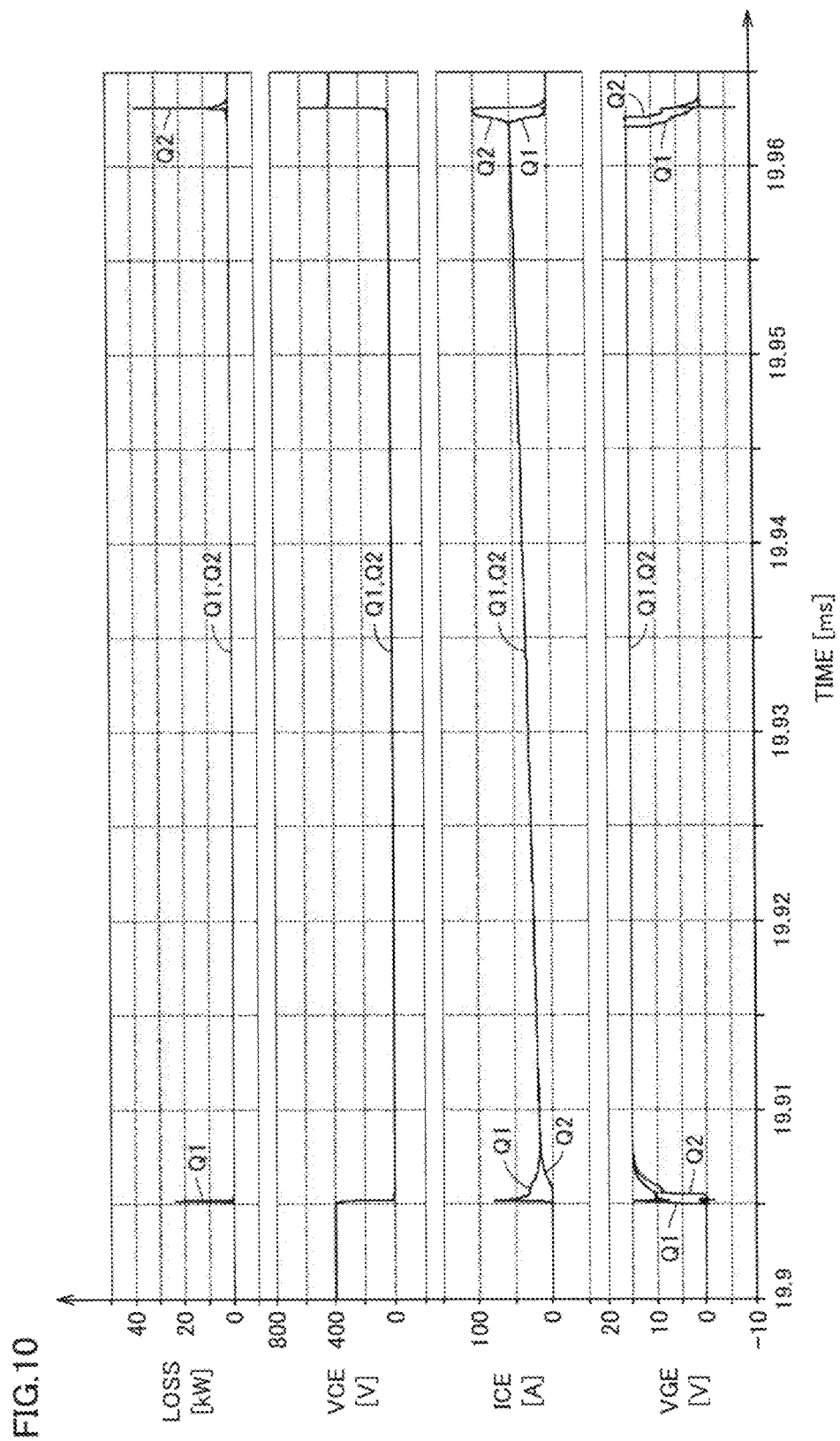
FIG. 10 is a diagram showing a result of simulation when IGBTs connected in parallel are successively switched.
Figure 11:
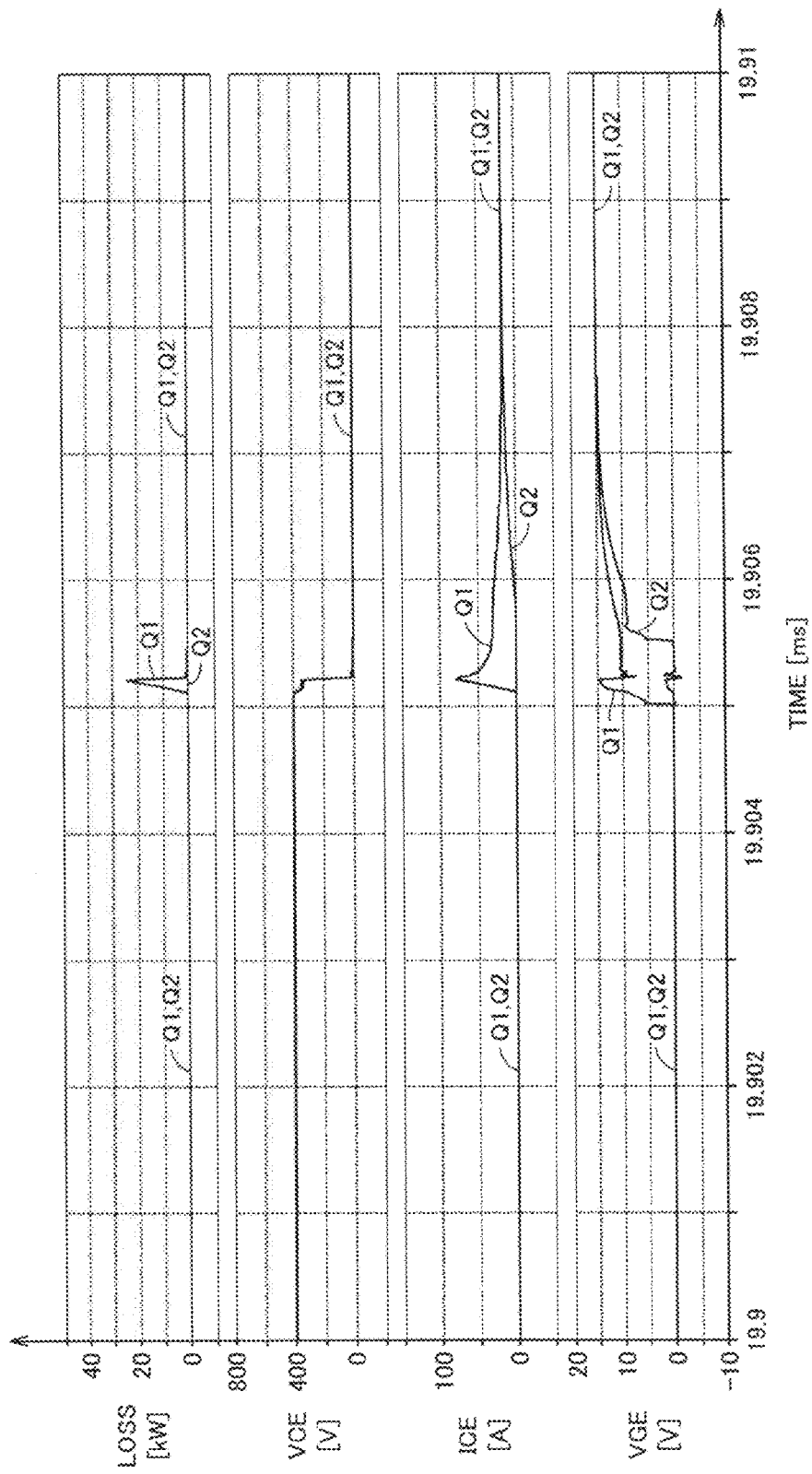
FIG. 11 is an enlarged view at the time of turn-on in FIG. 10.
Figure 12:
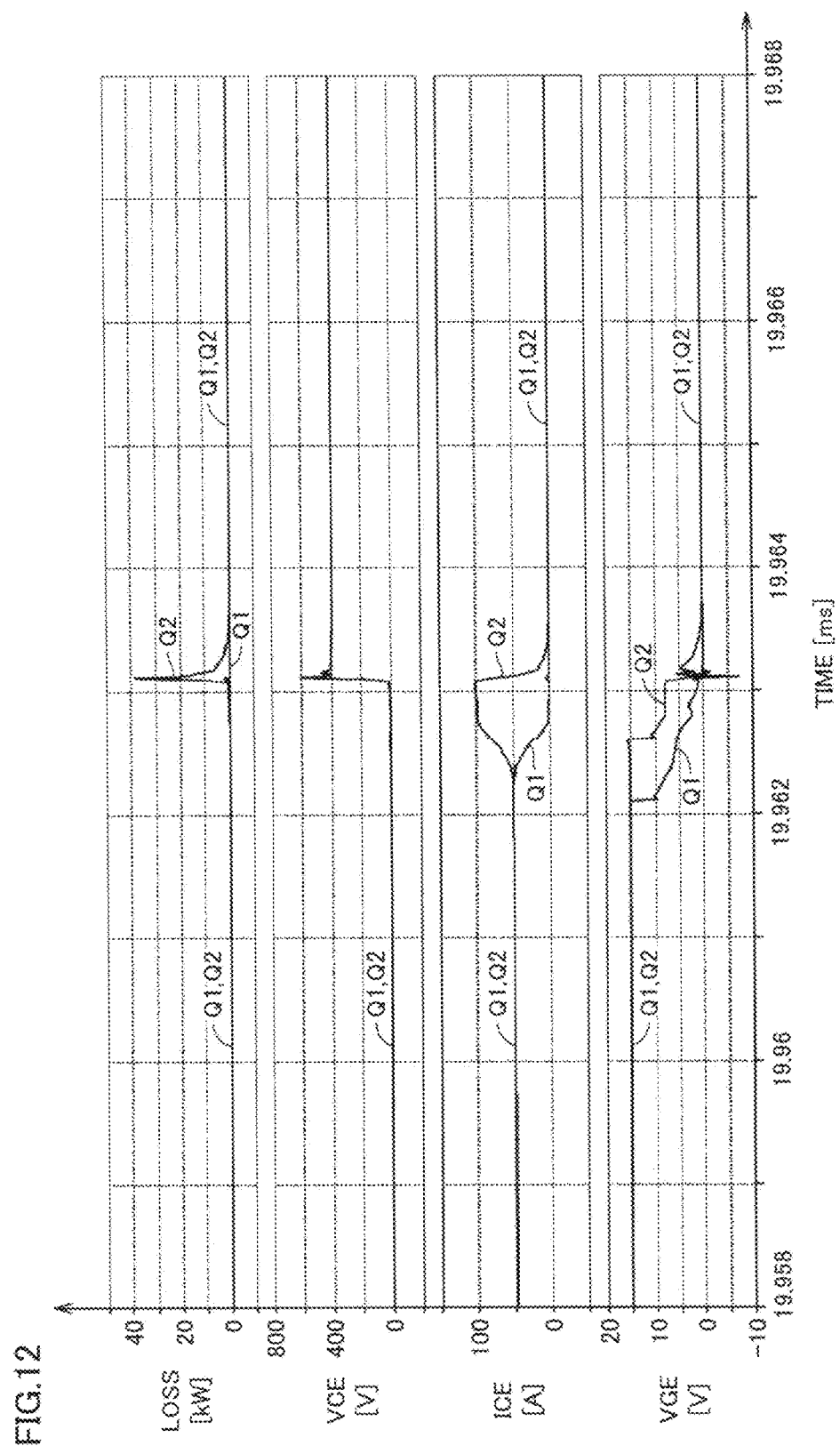
FIG. 12 is an enlarged view at the time of turn-off in FIG. 10.

FIG. 10 is a diagram showing a result of simulation when IGBTs connected in parallel are successively switched. FIG. 11 is an enlarged view at the time of turn-on in FIG. 10 and FIG. 12 is an enlarged view at the time of turn-off in FIG. 10. In simulation shown in FIGS. 10 to 12, at the time of turn-on, IGBT Q1 was switched to ON first and IGBT Q2 was switched to ON 0.5 microsecond after that. At the time of turn-off, IGBT Q1 was switched to OFF first, and IGBT Q2 was switched to OFF 0.5 microsecond after that. It can be seen that turn-on loss Eon is born by IGBT Q1 switched to ON first and turn-off loss Eoff is born by IGBT Q2 switched to OFF later.

Figure 13:
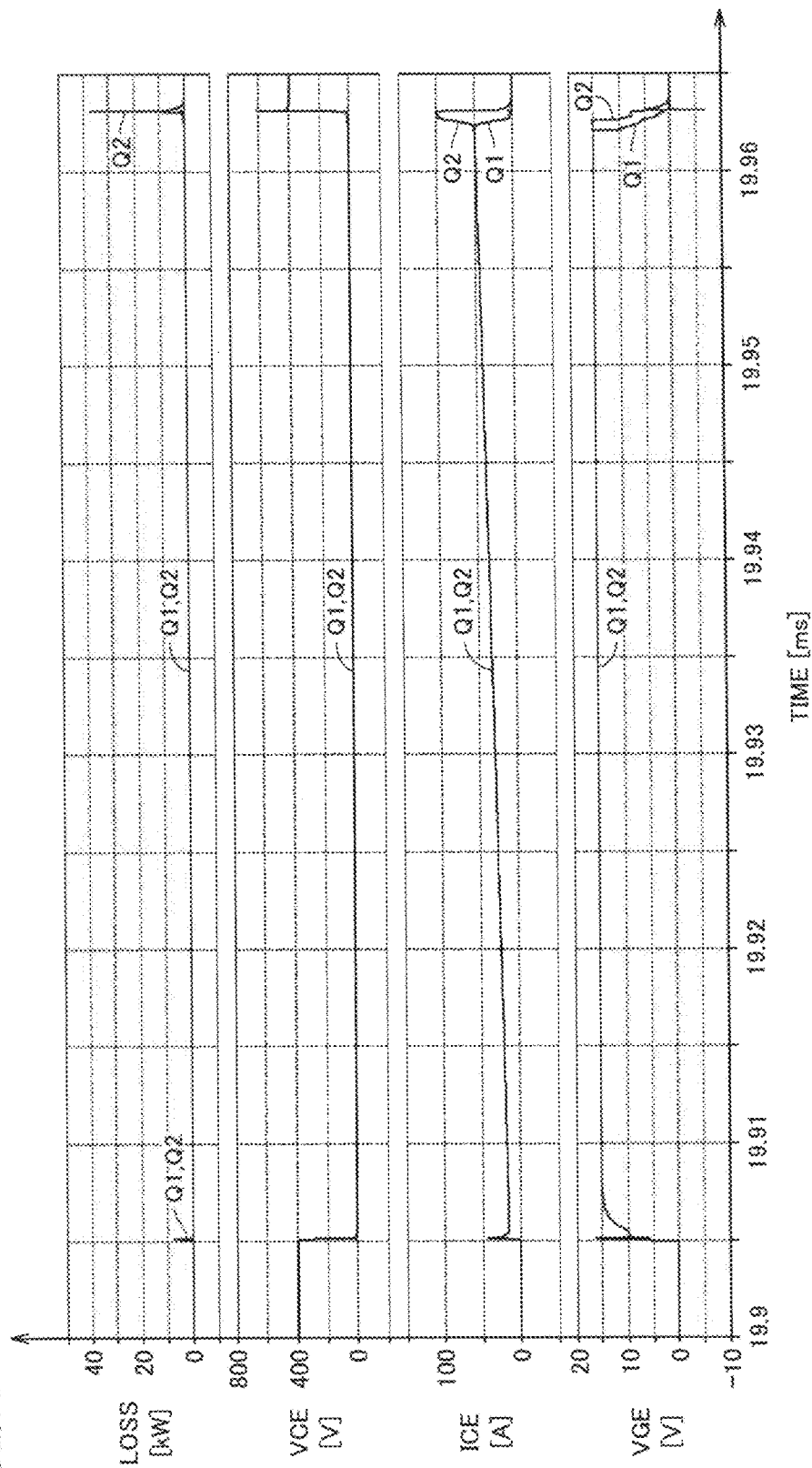
FIG. 13 is a diagram showing a result of simulation when switching to ON of the IGBTs connected in parallel is simultaneously made and switching to OFF is successively made.
Figure 14:
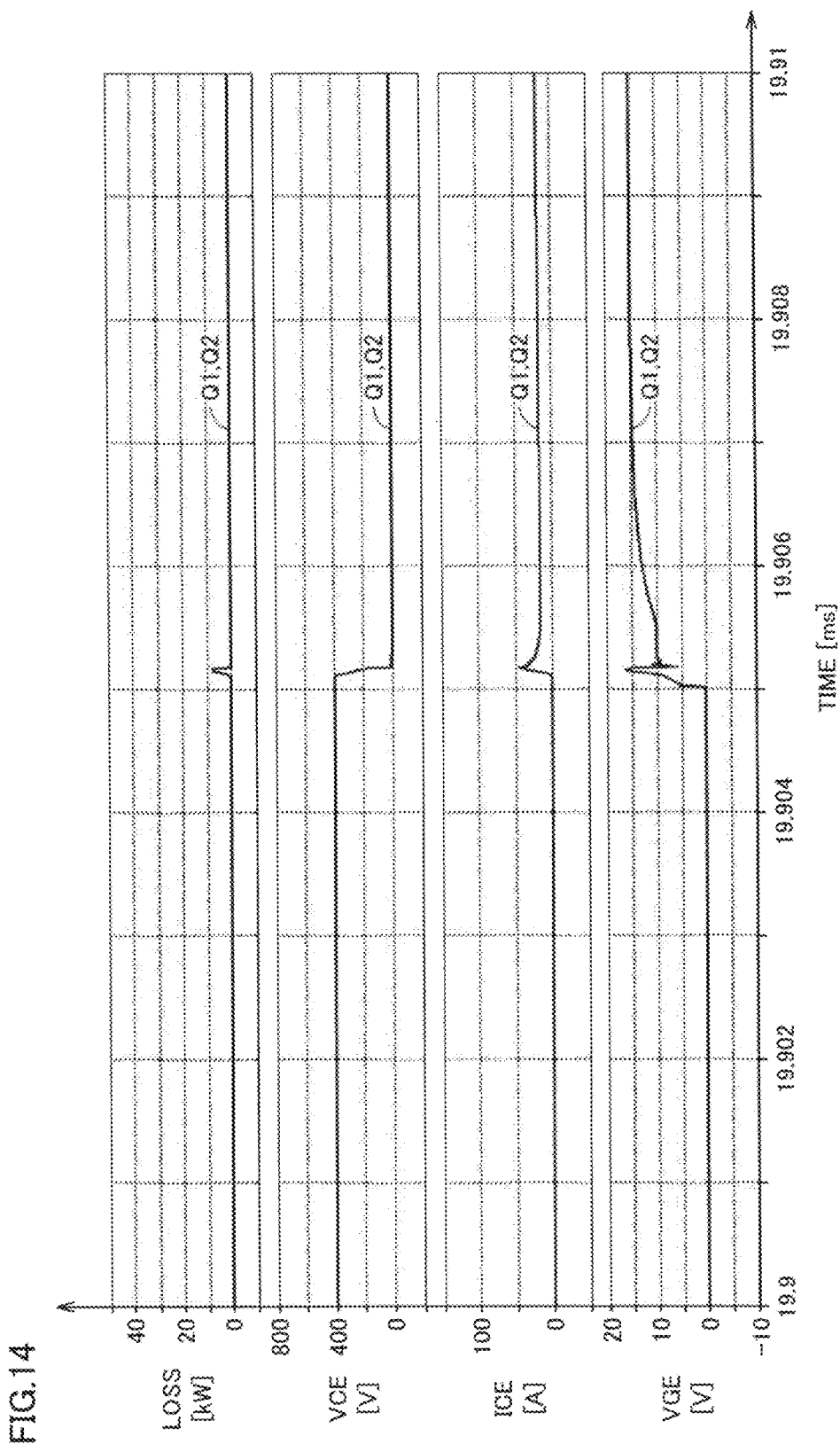
FIG. 14 is an enlarged view at the time of turn-on in FIG. 13.

FIG. 13 is a diagram showing a result of simulation when switching to ON of the IGBTs connected in parallel is simultaneously made and switching to OFF is successively made. FIG. 14 is an enlarged view at the time of turn-on in FIG. 13. FIG. 15 is an enlarged view at the time of turn-off in FIG. 13. In simulation shown in FIGS. 13 to 15, at the time of turn-on, IGBTs Q1, Q2 were simultaneously switched to ON. At the time of turn-off, IGBT Q1 was switched to OFF first and IGBT Q2 was switched to OFF 0.5 microsecond after that. It can be seen that turn-on loss Eon is born by both of IGBTs Q1, Q2 and turn-off loss Eoff is born by IGBT Q2 switched to OFF later.

Figure 16A:
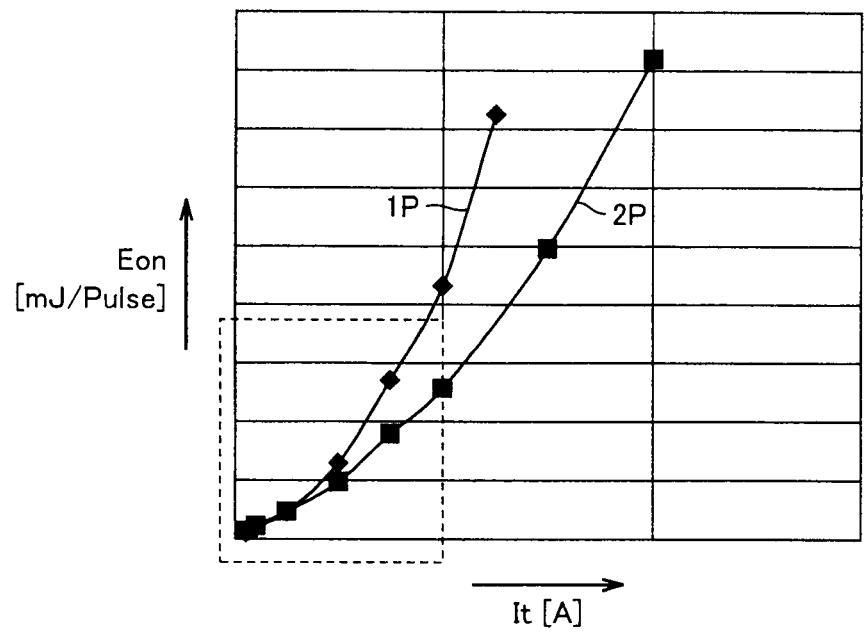
FIG. 16A is a diagram showing relation between total current It that flows through IGBTs Q1, Q2 connected in parallel and turn-on loss Eon.
Figure 16B:
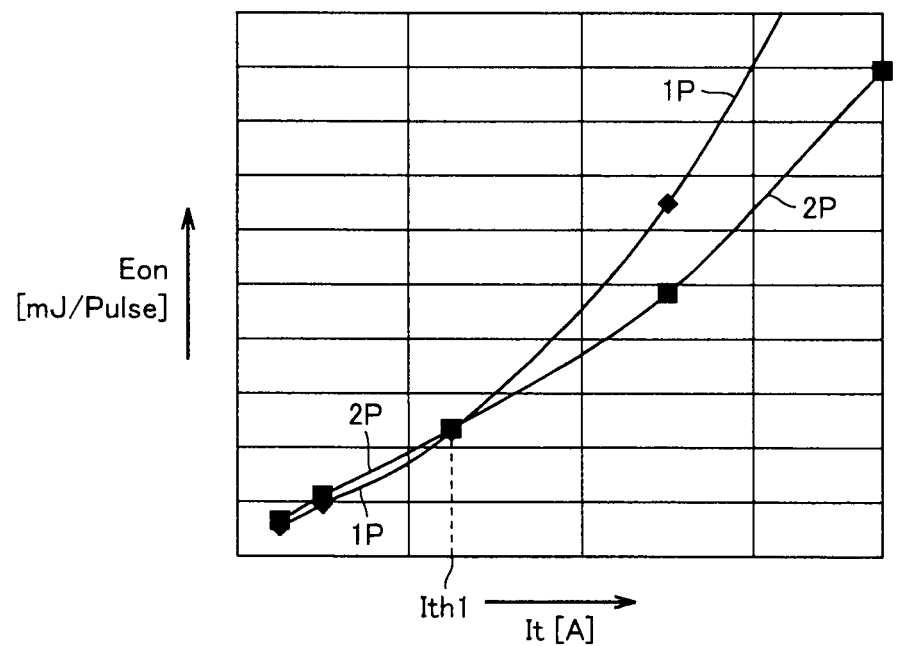
FIG. 16B is an enlarged view of a portion in a frame indicated with a dashed line in FIG. 16A.

FIG. 16A is a diagram showing relation between total current It that flows through IGBTs Q1, Q2 connected in parallel and turn-on loss Eon. FIG. 16B is an enlarged view of a portion in a frame indicated with a dashed line in FIG. 16A. As shown in FIG. 16B, in a region of a current lower than threshold value Ith1, a case where elements are successively switched to ON one by one (1P) is less in turn-on loss Eon than in a case where two elements are simultaneously switched to ON (2P). In a region of a current higher than threshold value Ith1, a case where two elements are simultaneously switched to ON (2P) is less in turn-on loss Eon than in a case where elements are successively switched to ON one by one (1P).

Embodiment 2

Figure 17:
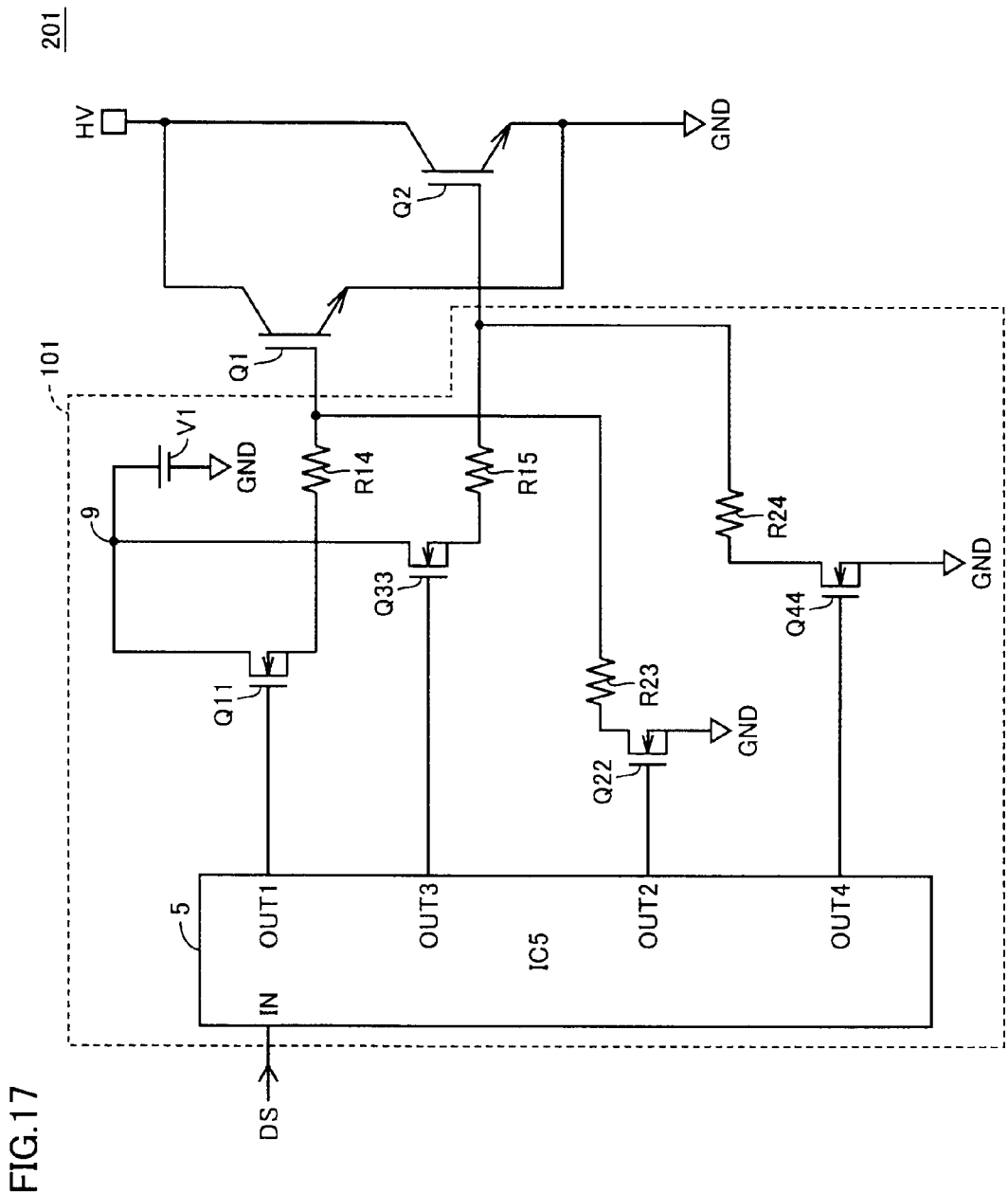
FIG. 17 is a circuit diagram showing a configuration of a power semiconductor device 201 according to Embodiment 2 of the present invention.

FIG. 17 is a circuit diagram showing a configuration of a power semiconductor device 201 according to Embodiment 2 of the present invention. Embodiment 2 shows one example of a specific configuration of drive control unit 100 in FIG. 1. A drive control unit 101 in FIG. 17 includes an integrated circuit (IC) 5 for control, a power supply for drive V1, resistor elements R14, R15, R23, R24, and N-type MOS (Metal Oxide Semiconductor) transistors Q11, Q22, Q33, Q44 for driving IGBTs Q1, Q2.

Integrated circuit 5 includes an input terminal IN receiving drive signal DS and output terminals OUT1, OUT2, OUT3, OUT4 for outputting control signals in accordance with drive signal DS to gates of transistors Q11, Q22, Q33, Q44, respectively. Drains of transistors Q11, Q33 are connected to a power supply node 9 supplied with a drive voltage from power supply for drive V1. Sources of transistors Q22, Q44 are connected to a ground node GND.

One ends of resistor elements R14, R23 are connected to the gate of IGBT Q1, and one ends of resistor elements R15, R24 are connected to the gate of IGBT Q2. The other end of resistor element R14 is connected to a source of transistor Q11 and the other end of resistor element R15 is connected to a source of transistor Q33. The other end of resistor element R23 is connected to a drain of transistor Q22 and the other end of resistor element R24 is connected to a drain of transistor Q44.

Figure 18:
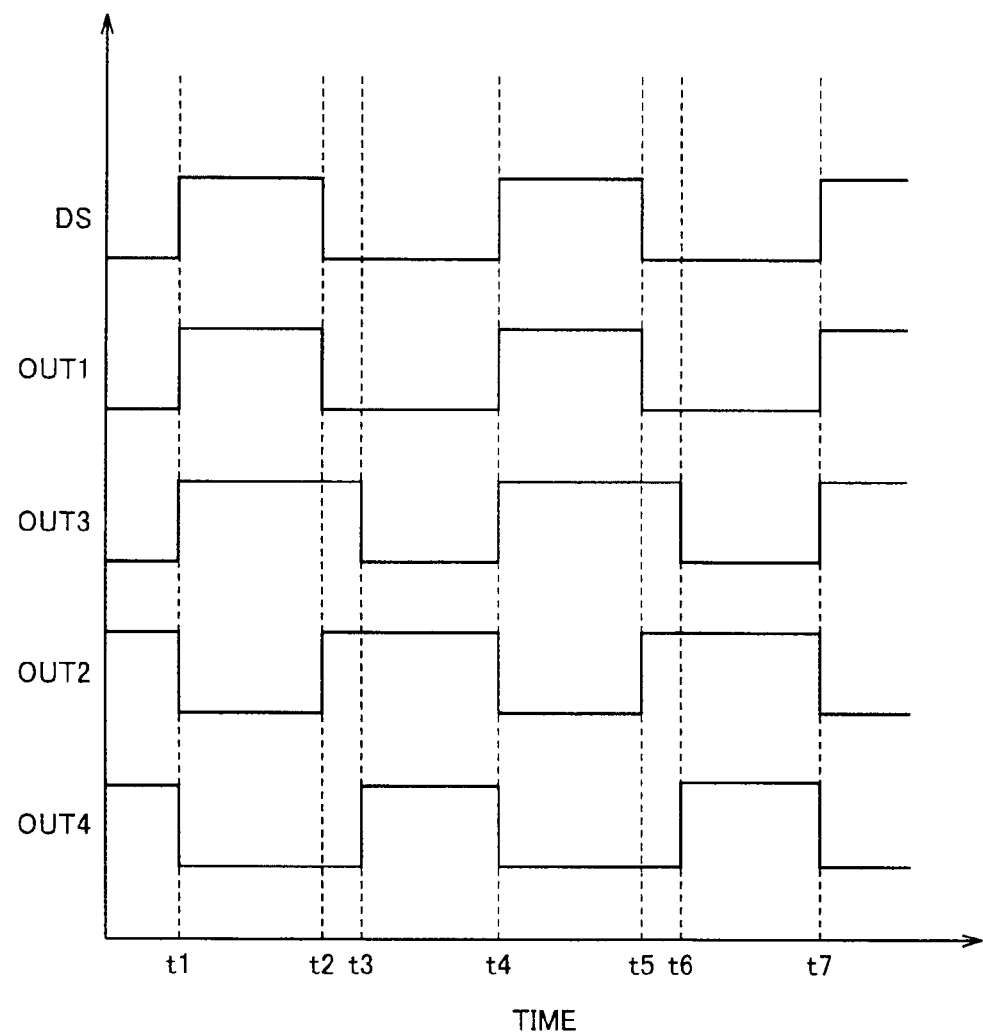
FIG. 18 is a diagram showing one example of a timing chart of a control signal output from an integrated circuit 5 in FIG. 17.

FIG. 18 is a diagram showing one example of a timing chart of a control signal output from integrated circuit 5 in FIG. 17.

Referring to FIGS. 17 and 18, at time t1, in response to switching of drive signal DS to the H level, integrated circuit 5 switches control signals output from output terminals OUT1, OUT3 to the H level and switches control signals output from output terminals OUT2, OUT4 to the L level. Thus, transistors Q11, Q33 are switched to ON and transistors Q22, Q44 are switched to OFF. Consequently, IGBTs Q1, Q2 are simultaneously switched to ON.

At time t2, in response to switching of drive signal DS to the L level, integrated circuit 5 switches the control signal output from output terminal OUT1 to the L level and switches the control signal output from output terminal OUT2 to the H level. Thus, transistor Q11 is switched to OFF and transistor Q22 is switched to ON. Consequently, IGBT Q1 is switched to OFF.

At time t3 later than time t2 by a prescribed time period, integrated circuit 5 switches the control signal output from output terminal OUT3 to the L level and switches the control signal output from output terminal OUT4 to the H level. Thus, transistor Q33 is switched to OFF and transistor Q44 is switched to ON. Consequently, IGBT Q2 is switched to OFF later than IGBT Q1.

Thereafter, a similar operation is repeated. Namely, an operation of integrated circuit 5 at time t4, t7 is the same as the operation at time t1, and operations of integrated circuit 5 at times t5, t6 are the same as the operations at times t2, t3, respectively.

The operation of integrated circuit 5 above can realize a control operation the same as in FIG. 2B described in Embodiment 1.

Integrated circuit 5 can also control transistors Q11, Q22, Q33, Q44 to ON and OFF at timing different from that in FIG. 18. For example, in order to realize a control operation the same as in FIG. 2A described in Embodiment 1, the following switching control should be carried out. Namely, in response to switching of drive signal DS to the H level, integrated circuit 5 switches the control signal output from output terminal OUT1 to the H level and switches the control signals output from output terminals OUT2, OUT4 to the L level. Integrated circuit 5 switches to the H level, the control signal output from output terminal OUT3 later by a prescribed time period than switching of this drive signal DS to the H level. In addition, in response to switching of drive signal DS to the L level, integrated circuit 5 switches the control signal output from output terminal OUT1 to the L level and switches the control signal output from output terminal OUT2 to the H level. Integrated circuit 5 switches to the L level, the control signal output from output terminal OUT3 later by a prescribed time period than switching of this drive signal DS to the L level, and switches the control signal output from output terminal OUT4 to the H level. As a result of control above, IGBTs Q1, Q2 are switched to ON in this order and switched to OFF in this order.

In order to realize a control operation the same as in FIG. 2C described in Embodiment 1, the following switching control should be carried out. Namely, in response to switching of drive signal DS to the H level, integrated circuit 5 switches the control signals output from output terminals OUT1, OUT3 to the H level and switches the control signals output from output terminals OUT2, OUT4 to the L level. In addition, when drive signal DS switches to the L level, integrated circuit 5 switches the control signals output from output terminals OUT1, OUT3 to the L level and switches the control signals output from output terminals OUT2, OUT4 to the H level. As a result of control above, IGBTs Q1, Q2 are simultaneously switched to ON and simultaneously switched to OFF.

Embodiment 3

Figure 19:
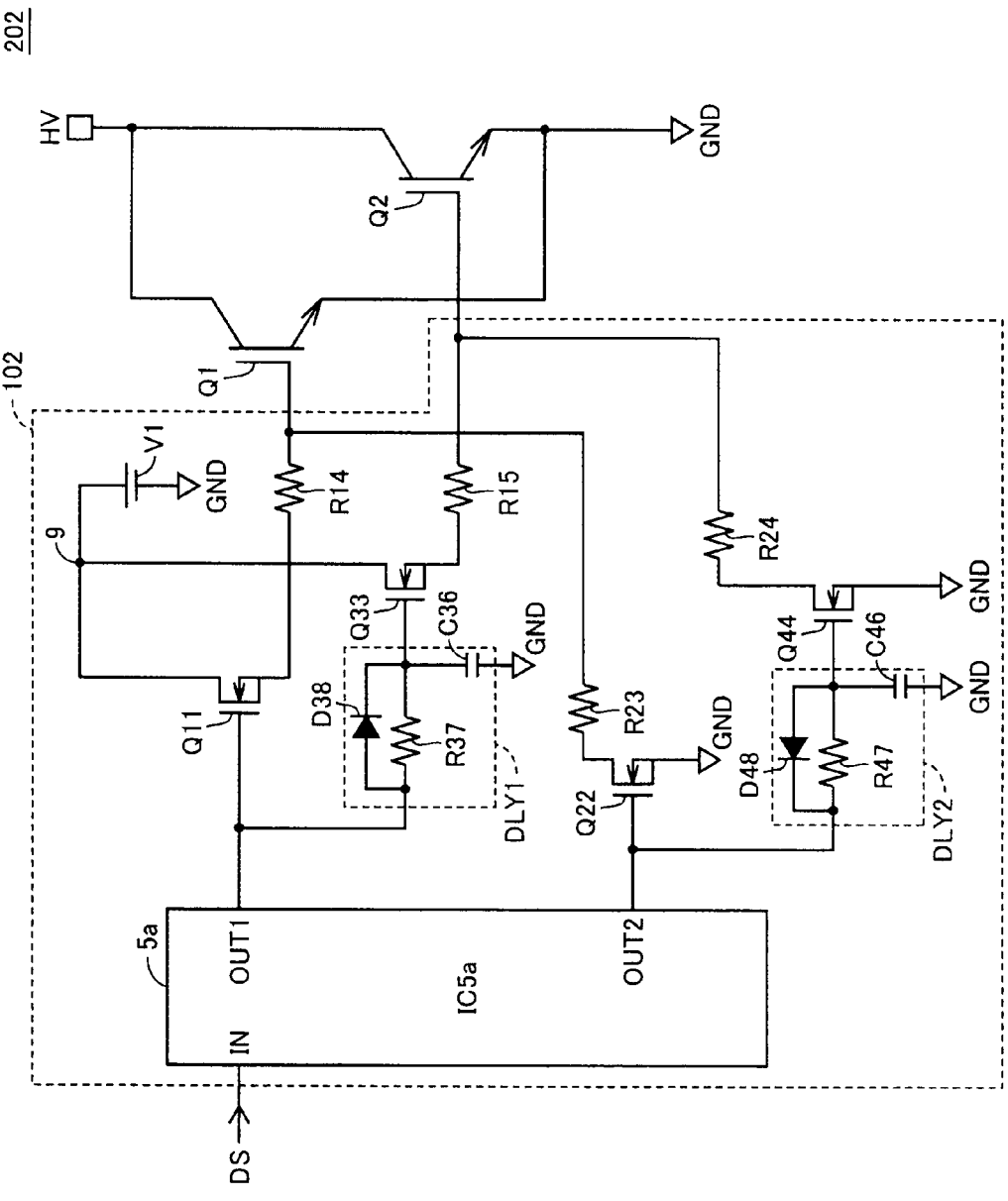
FIG. 19 is a circuit diagram showing a configuration of a power semiconductor device 202 according to Embodiment 3 of the present invention.

FIG. 19 is a circuit diagram showing a configuration of a power semiconductor device 202 according to Embodiment 3 of the present invention. Embodiment 3 shows one example of a specific configuration of drive control unit 100 in FIG. 1. A drive control unit 102 in FIG. 19 includes an integrated circuit (IC) 5a for control, power supply for drive V1, resistor elements R14, R15, R23, R24, N-type MOS transistors Q11, Q22, Q33, Q44 for driving IGBTs Q1, Q2, and delay circuits DLY1, DLY2.

Integrated circuit 5a includes input terminal IN receiving drive signal DS, output terminal OUT1 for outputting a control signal in accordance with drive signal DS to the gate of transistor Q11 and delay circuit DLY1, and output terminal OUT2 for outputting a control signal in accordance with drive signal DS to the gate of transistor Q22 and delay circuit DLY2. The drains of transistors Q11, Q33 are connected to power supply node 9 supplied with a drive voltage from power supply for drive V1. The sources of transistors Q22, Q44 are connected to ground node GND.

One ends of resistor elements R14, R23 are connected to the gate of IGBT Q1, and one ends of resistor elements R15, R24 are connected to the gate of IGBT Q2. The other end of resistor element R14 is connected to the source of transistor Q11 and the other end of resistor element R15 is connected to the source of transistor Q33. The other end of resistor element R23 is connected to the drain of transistor Q22 and the other end of resistor element R24 is connected to the drain of transistor Q44.

Delay circuit DLY1 includes a resistor element R37, a capacitor C36, and a diode D38. Resistor element R37 is connected between output terminal OUT1 of integrated circuit 5a and the gate of transistor Q33. Capacitor C36 is connected between the gate of transistor Q33 and ground node GND. Diode D38 has an anode connected to output terminal OUT1 of integrated circuit 5a and a cathode connected to the gate of transistor Q33. Delay circuit DLY1 delays a falling edge of a control signal output from output terminal OUT1 of integrated circuit 5a, that is, an edge corresponding to switching to OFF of transistor Q33.

Delay circuit DLY2 includes a resistor element R47, a capacitor C46, and a diode D48. Resistor element R47 is connected between output terminal OUT2 of integrated circuit 5a and the gate of transistor Q44. Capacitor C46 is connected between the gate or transistor Q44 and ground node GND. Diode D48 has a cathode connected to output terminal OUT2 of integrated circuit 5a and an anode connected to the gate of transistor Q44. Delay circuit DLY2 delays a rising edge of a control signal output from output terminal OUT2 of integrated circuit 5a, that is, an edge corresponding to switching to ON of transistor Q44.

Figure 20:
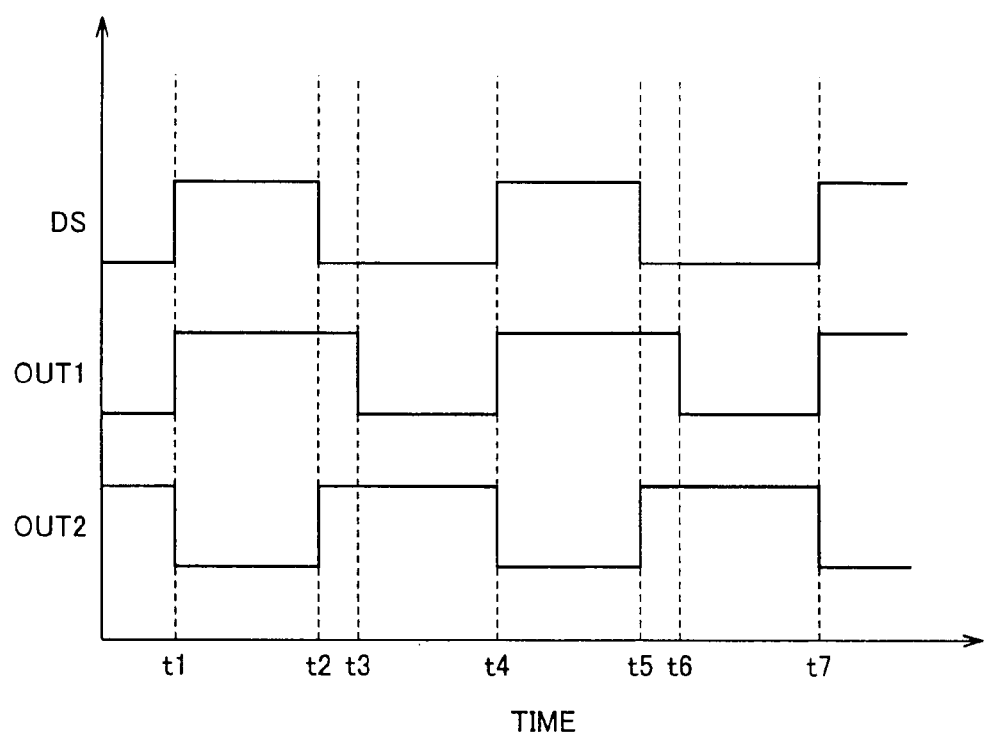
FIG. 20 is a diagram showing one example of a timing chart of a control signal output from an integrated circuit 5a in FIG. 19.

FIG. 20 is a diagram showing one example of a timing chart of a control signal output from integrated circuit 5a in FIG. 19.

Referring to FIGS. 19 and 20, at time t1, in response to switching of drive signal DS to the H level, integrated circuit 5a switches a control signal output from output terminal OUT1 to the H level and switches a control signal output from output terminal OUT2 to the L level. Thus, transistors Q11, Q33 are switched to ON and transistors Q22, Q44 are switched to OFF. Consequently, IGBTs Q1, Q2 are simultaneously switched to ON.

At time t2, in response to switching of drive signal DS to the L level, integrated circuit 5a switches the control signal output from output terminal OUT2 to the H level. Thus, transistor Q22 is switched to ON, and transistor Q44 is switched to ON with a delay by a delay time period determined by delay circuit DLY2.

Here, denoting an output voltage from power supply for drive V1 as v1, resistance values of resistor elements R14, R23 as r14, r23, respectively, and a threshold voltage of IGBT Q1 as Vq1, v1, r14, r23, and Vq1 are normally set to satisfy relation as follows.

$$Vq1 > v1 \times r23/(r14+r23) \tag{12}$$

Namely, the threshold voltage of IGBT Q1 is higher than a voltage obtained by dividing the output voltage from power supply for drive V1 by resistor elements R14, R23. Consequently, at time t2, IGBT Q1 is switched to OFF.

At time t3 later than time t2 by a prescribed time period, integrated circuit 5a switches the control signal output from output terminal OUT1 to the L level. Thus, transistor Q11 is switched to OFF, and transistor Q33 is switched to OFF with a delay by a delay time period determined by delay circuit DLY1. Consequently, IGBT Q2 is switched to OFF.

Thereafter, a similar operation is repeated. Namely, an operation of integrated circuit 5a at time t4, t7 is the same as the operation at time t1, and operations of integrated circuit 5a at times t5, t6 are the same as the operations at times t2, t3, respectively.

The operation of integrated circuit 5a above can realize a control operation the same as in FIG. 2B described in Embodiment 1.

Embodiment 4

Figure 21:
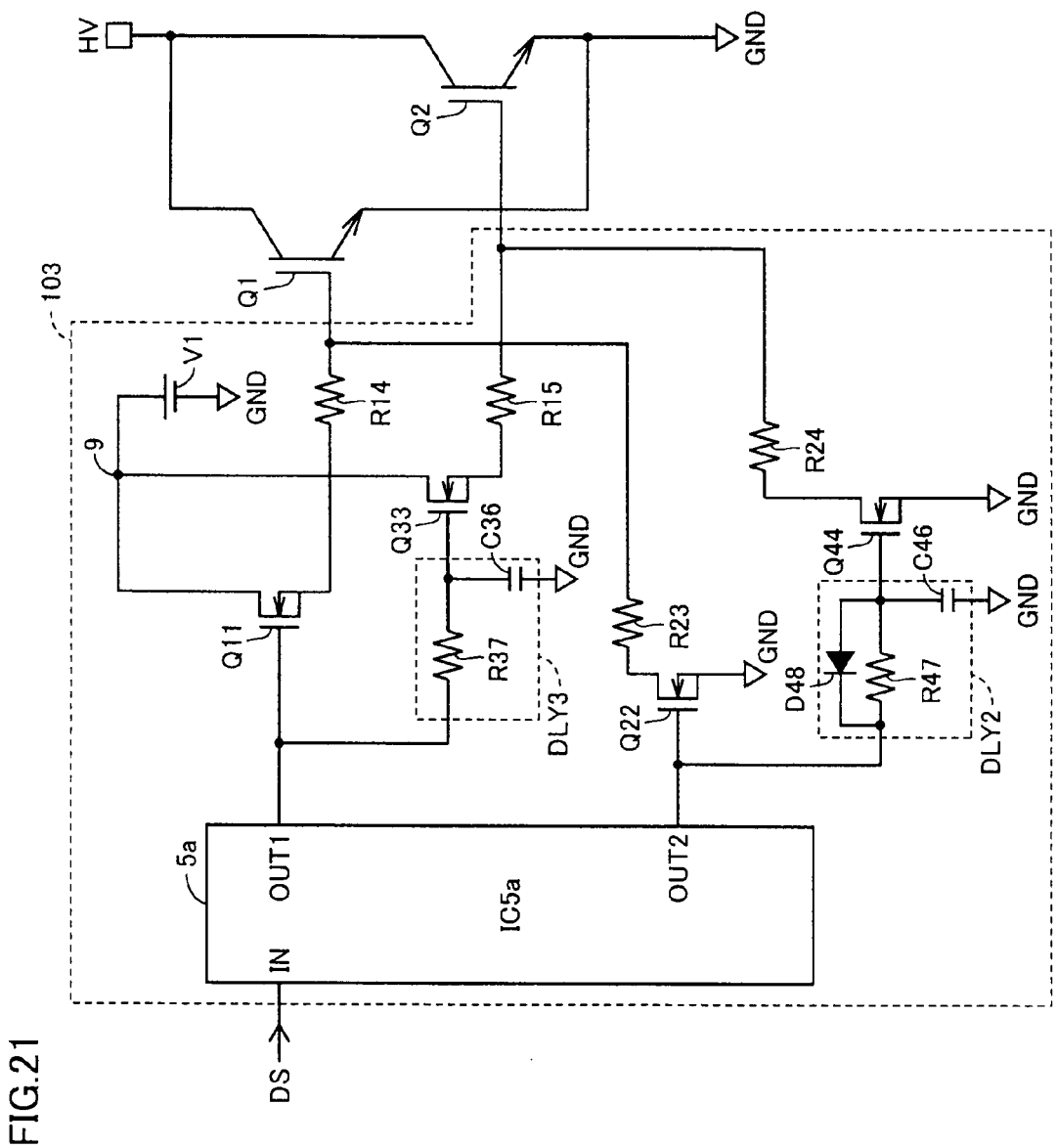
FIG. 21 is a circuit diagram showing a configuration of a power semiconductor device 203 according to Embodiment 4 of the present invention.

FIG. 21 is a circuit diagram showing a configuration of a power semiconductor device 203 according to Embodiment 4 of the present invention. A delay circuit DLY3 provided in a drive control unit 103 in FIG. 21 is different from delay circuit DLY1 in FIG. 19 in not including diode D38. Therefore, delay circuit DLY3 in FIG. 21 supplies a signal obtained by delaying both of a rising edge and a falling edge of a control signal output from output terminal OUT1 of integrated circuit 5a to the gate of transistor Q33. Since FIG. 21 is otherwise the same as FIG. 19, the same or corresponding elements have the same reference characters allotted and description will not be repeated. The timing of control signals output from output terminals OUT1, OUT2 of integrated circuit 5a is also the same as in FIG. 20.

According to drive control unit 103 shown in FIG. 21, when the control signal output from output terminal OUT1 of integrated circuit 5a is switched to the H level (time t1, t4, t7 in FIG. 20), transistor Q33 is switched to ON with a delay by a delay time period determined by delay circuit DLY3. Consequently, when drive signal DS switches to the H level, IGBT Q2 is switched to ON later than switching of IGBT Q1 to ON. Switching of IGBT Q2 to OFF later than switching of IGBT Q1 to OFF at time t2, t5 is the same as in Embodiment 3. Therefore, power semiconductor device 203 in FIG. 21 can realize a control operation the same as in FIG. 2A described in Embodiment 1.

Embodiment 5

Figure 22:
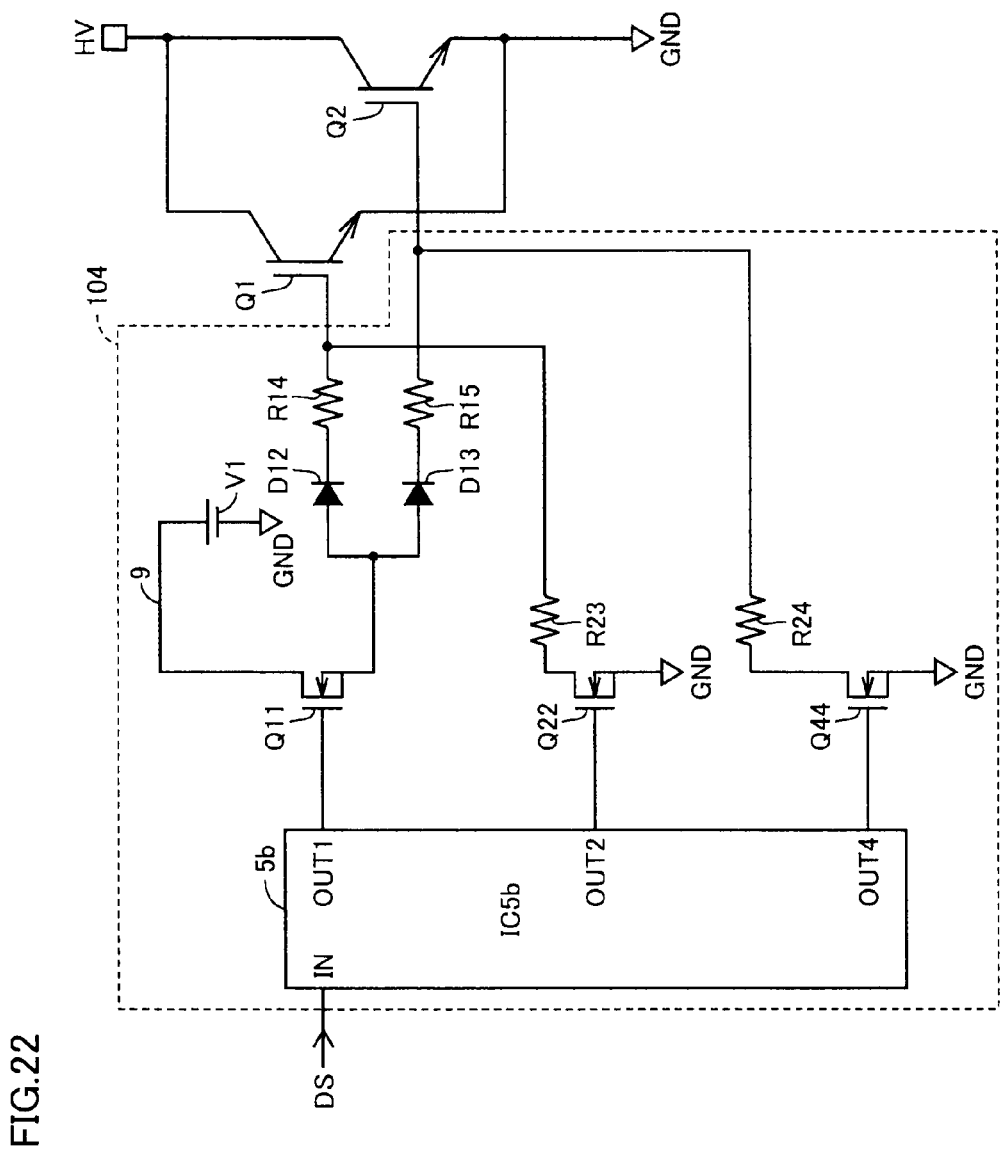
FIG. 22 is a circuit diagram showing a configuration of a power semiconductor device 204 according to Embodiment 5 of the present invention.

FIG. 22 is a circuit diagram showing a configuration of a power semiconductor device 204 according to Embodiment 5 of the present invention. Embodiment 5 shows one example of a specific configuration of drive control unit 100 in FIG. 1. A drive control unit 104 in FIG. 22 includes an integrated circuit (IC) 5b for control, power supply for drive V1, resistor elements R14, R15, R23, R24, N-type MOS transistors Q11, Q22, Q44 for driving IGBTs Q1, Q2, and diodes D12, D13.

Integrated circuit 5b includes input terminal IN receiving drive signal DS and output terminals OUT1, OUT2, OUT4 for outputting control signals in accordance with drive signal DS to gates of transistors Q11, Q22, Q44, respectively. The drain of transistor Q11 is connected to power supply node 9 supplied with a drive voltage from power supply for drive V1. The sources of transistors Q22, Q44 are connected to ground node GND.

One ends of resistor elements R14, R23 are connected to the gate of IGBT Q1 and one ends of resistor elements R15, R24 are connected to the gate of IGBT Q2. The other end of resistor element R14 is connected to a cathode of diode D12 and the other end of resistor element R15 is connected to a cathode of diode D13. The other end of resistor element R23 is connected to the drain of transistor Q22 and the other end of resistor element R24 is connected to the drain of transistor Q44. Diodes D12, D13 each have an anode connected to the source of transistor Q11. Diodes D12, D13 are rendered conductive when transistor Q11 is turned on.

Figure 23:
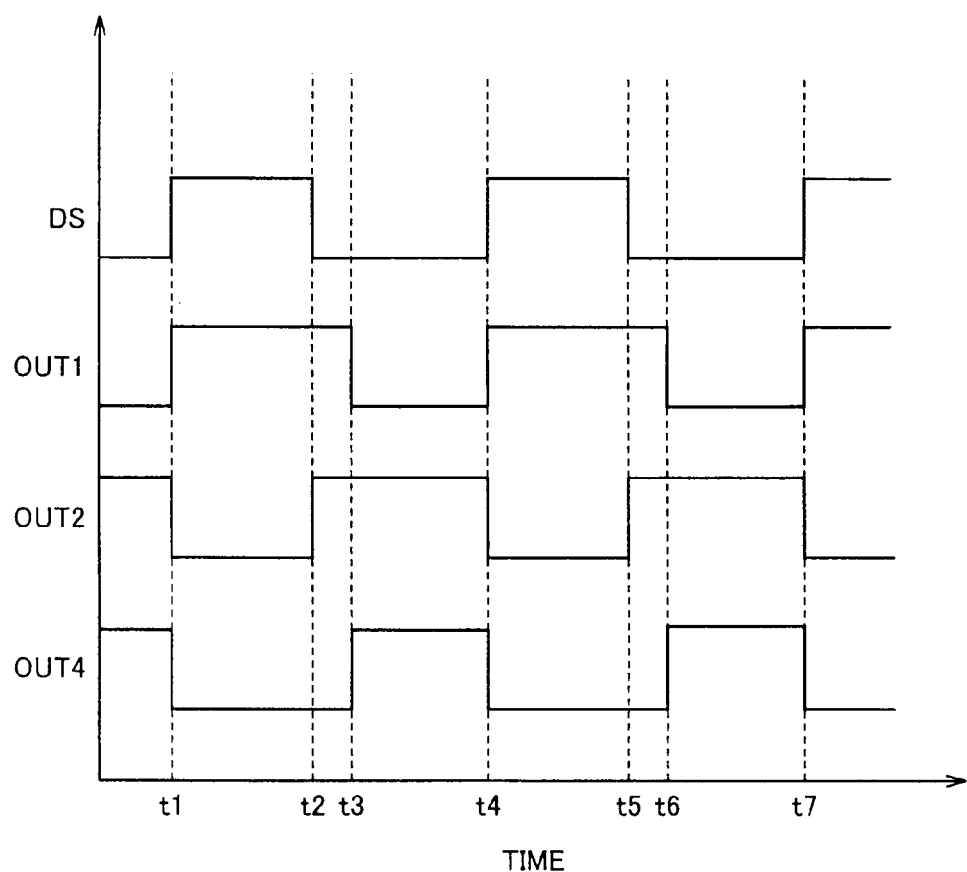
FIG. 23 is a diagram showing one example of a timing chart of a control signal output from an integrated circuit 5b in FIG. 22.

FIG. 23 is a diagram showing one example of a timing chart of a control signal output from integrated circuit 5b in FIG. 22.

Referring to FIGS. 22 and 23, at time t1, in response to switching of drive signal DS to the H level, integrated circuit 5b switches a control signal output from output terminal OUT1 to the H level and switches control signals output from output terminals OUT2, OUT4 to the L level. Thus, transistor Q11 is switched to ON and transistors Q22, Q44 are switched to OFF. Consequently, IGBTs Q1, Q2 are simultaneously switched to ON.

At time t2, in response to switching of drive signal DS to the L level, integrated circuit 5b switches the control signal output from output terminal OUT2 to the H level. Thus, transistor Q22 is switched to ON. Here, denoting an output voltage from power supply for drive V1 as v1, resistance values of resistor elements R14, R23 as r14, r23, respectively, and a threshold voltage of IGBT Q1 as Vq1, v1, r14, r23, and Vq1 are set to satisfy the relation in previously described Equation (12). Namely, the threshold voltage of IGBT Q1 is higher than a voltage obtained by dividing the output voltage from power supply for drive V1 by resistor elements R14, R23. Consequently, at time t2, IGBT Q1 is switched to OFF.

At time t3 later than time t2 by a prescribed time period, integrated circuit 5b switches the control signal output from output terminal OUT1 to the L level and switches the control signal output from output terminal OUT4 to the H level, Thus, transistor Q11 is switched to OFF and transistor Q44 is switched to ON. Consequently, IGBT Q2 is switched to OFF.

Thereafter, a similar operation is repeated. Namely, an operation of integrated circuit 5b at time t4, t7 is the same as the operation at time t1 and operations of integrated circuit 5b at times t5, t6 are the same as the operations at times t2, t3, respectively.

The operation of integrated circuit 5b above can realize a control operation the same as in FIG. 2B described in Embodiment 1. Unlike the above, if the control signal output from output terminal OUT1 of integrated circuit 5b is switched to the L level and the control signals output from output terminals OUT2, OUT4 are switched to the H level at time t2, t5, IGBTs Q1, Q2 can simultaneously be switched to OFF. Namely, a control operation shown in FIG. 2C in connection with Embodiment 1 can be realized.

Embodiment 6

Figure 24:
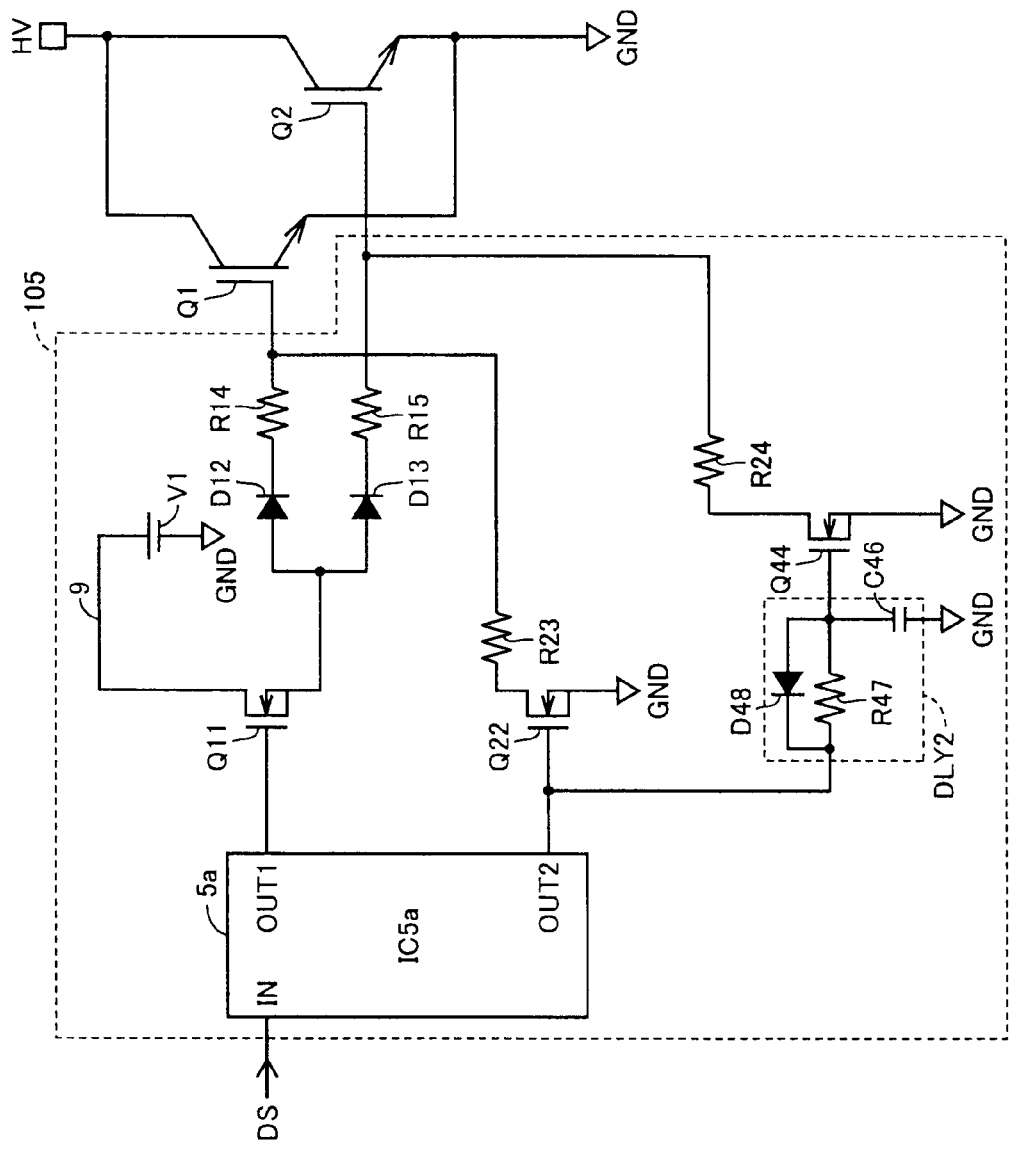
FIG. 24 is a circuit diagram showing a configuration of a power semiconductor device 205 according to Embodiment 6 of the present invention.

FIG. 24 is a circuit diagram showing a configuration of a power semiconductor device 205 according to Embodiment 6 of the present invention. Embodiment 6 shows one example of a specific configuration of drive control unit 100 in FIG. 1. A drive control unit 105 in FIG. 24 includes integrated circuit (IC) 5a for control, power supply for drive V1, resistor elements R14, R15, R23, R24, N-type MOS transistors Q11, Q22, Q44 for driving IGBTs Q1, Q2, diodes D12, D13, and delay circuit DLY2.

Integrated circuit 5a includes input terminal IN receiving drive signal DS, output terminal OUT1 for outputting a control signal in accordance with drive signal DS to the gate of transistor Q11, and output terminal OUT2 for outputting a control signal in accordance with drive signal DS to the gate of transistor Q22 and delay circuit DLY2. The drain of transistor Q11 is connected to power supply node 9 supplied with a drive voltage from power supply for drive V1. The sources of transistors Q22, Q44 are connected to ground node GND.

One ends of resistor elements R14, R23 are connected to the gate of IGBT Q1 and one ends of resistor elements R15, R24 are connected to the gate of IGBT Q2. The other end of resistor element R14 is connected to the cathode of diode D12 and the other end of resistor element R15 is connected to the cathode of diode D13. The other end of resistor element R23 is connected to the drain of transistor Q22 and the other end of resistor element R24 is connected to the drain of transistor Q44. Diodes D12, D13 each have the anode connected to the source of transistor Q11. Diodes D12, D13 are rendered conductive when transistor Q11 is turned on.

Delay circuit DLY2 includes resistor element R47, capacitor C46, and diode D48. Resistor element R47 is connected between output terminal OUT2 of integrated circuit 5a and the gate of transistor Q44. Capacitor C46 is connected between the gate of transistor Q44 and ground node GND. Diode D48 has the cathode connected to output terminal OUT2 of integrated circuit 5a and the anode connected to the gate of transistor Q44. Delay circuit DLY2 delays a rising edge of a control signal output from output terminal OUT2 of integrated circuit 5a, that is, an edge corresponding to switching to ON of transistor Q44.

An operation of integrated circuit 5a is the same as described with reference to FIG. 20 in connection with Embodiment 3. An operation of power semiconductor device 205 will be described hereinafter with reference to FIGS. 20 and 24.

At time t1 in FIG. 20, in response to switching of drive signal DS to the H level, integrated circuit 5a switches the control signal output from output terminal OUT1 to the H level and switches the control signal output from output terminal OUT2 to the L level. Thus, transistor Q11 is switched to ON and transistors Q22, Q44 are switched to OFF. Consequently, IGBTs Q1, Q2 are simultaneously switched to ON.

At time t2, in response to switching of drive signal DS to the L level, integrated circuit 5a switches the control signal output from output terminal OUT2 to the H level. Thus, transistor Q22 is switched to ON, and transistor Q44 is switched to ON with a delay by a delay time period determined by delay circuit DLY2. Here, denoting an output voltage from power supply for drive V1 as v1, resistance values of resistor elements R14, R23 as r14, r23, respectively, and a threshold voltage of IGBT Q1 as Vq1, v1, r14, r23, and Vq1 are normally set to satisfy the relation in previously described Equation (12). Namely, the threshold voltage of IGBT Q1 is higher than a voltage obtained by dividing the output voltage from power supply for drive V1 by resistor elements R14, R23. Consequently, at time t2, IGBT Q1 is switched to OFF.

At time t3 later than time t2 by a prescribed time period, integrated circuit 5a switches the control signal output from output terminal OUT1 to the L level. Thus, transistor Q11 is switched to OFF, and transistor Q44 is switched to OFF with a delay by a delay time period determined by delay circuit DLY2. Consequently, IGBT Q2 is switched to OFF.

Thereafter, a similar operation is repeated. Namely, an operation of integrated circuit 5a at time t4, t7 is the same as the operation at time t1 and operations of integrated circuit 5a at times t5, t6 are the same as the operations at times t2, t3, respectively.

The operation of integrated circuit 5a above can realize a control operation the same as in FIG. 2B described in Embodiment 1.

Embodiment 7

Figure 25:
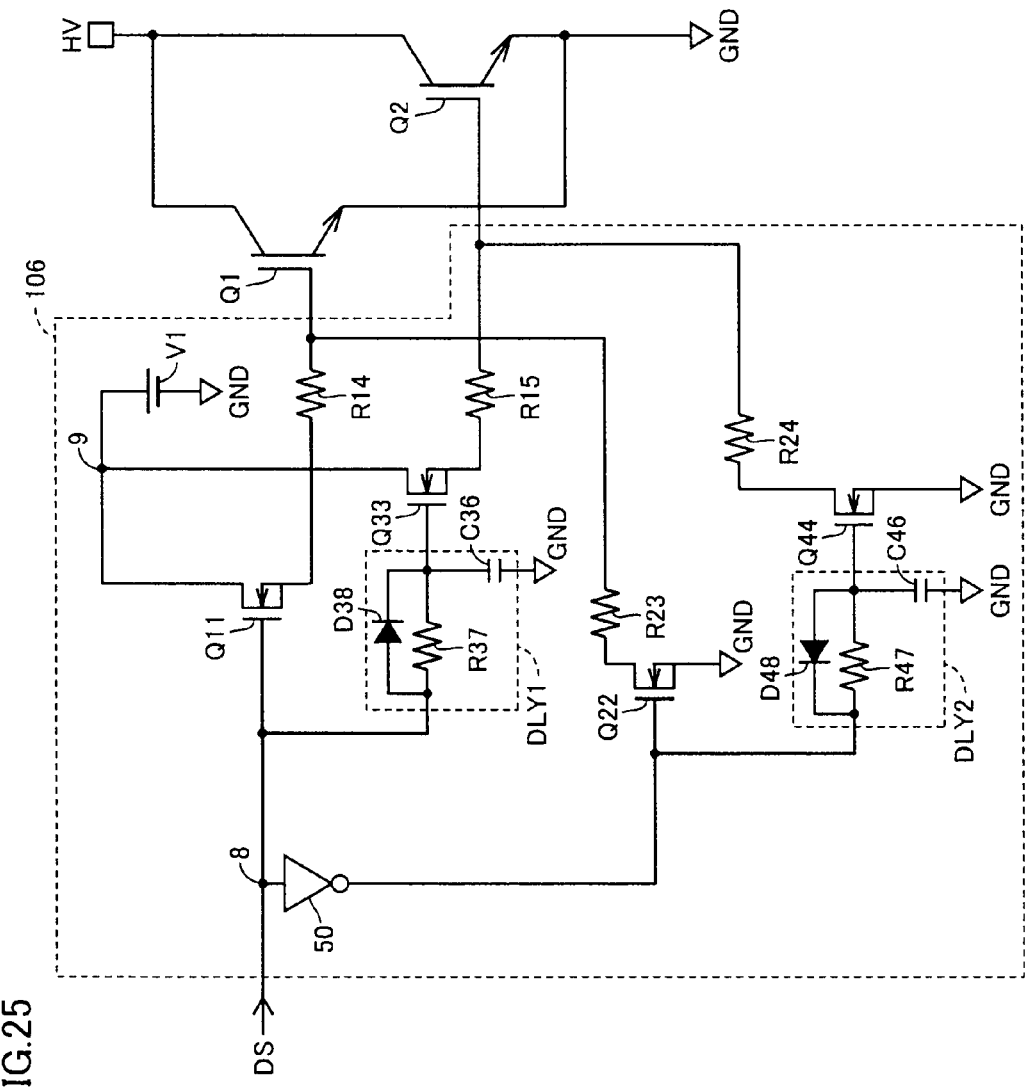
FIG. 25 is a circuit diagram showing a configuration of a power semiconductor device 206 according to Embodiment 7 of the present invention.

FIG. 25 is a circuit diagram showing a configuration of a power semiconductor device 206 according to Embodiment 7 of the present invention. Embodiment 7 shows one example of a specific configuration of drive control unit 100 in FIG. 1. A drive control unit 106 in FIG. 25 includes an input node 8 to which drive signal DS is input, an inverter 50, power supply for drive V1, resistor elements R14, R15, R23, R24, N-type MOS transistors Q11, Q22, Q33, Q44 for driving IGBTs Q1, Q2, and delay circuits DLY1, DLY2.

The drains of transistors Q11, Q33 are connected to power supply node 9 supplied with a drive voltage from power supply for drive V1. The gate of transistor Q11 is connected to input node 8 and the gate of transistor Q22 is connected to an output node of inverter 50. The sources of transistors Q22, Q44 are connected to ground node GND.

One ends of resistor elements R14, R23 are connected to the gate of IGBT Q1 and one ends of resistor elements R15, R24 are connected to the gate of IGBT Q2. The other end of resistor element R14 is connected to the source of transistor Q11 and the other end of resistor element R15 is connected to the source of transistor Q33. The other end of resistor element R23 is connected to the drain of transistor Q22 and the other end or resistor element R24 is connected to the drain of transistor Q44.

Delay circuit DLY1 includes resistor element R37, capacitor C36, and diode D38. Resistor element R37 is connected between input node 8 and the gate of transistor Q33. Capacitor C36 is connected between the gate of transistor Q33 and ground node GND. Diode D38 has the anode connected to input node 8 and the cathode connected to the gate of transistor Q33. Delay circuit DLY1 delays a falling edge of drive signal DS, that is, an edge corresponding to switching to OFF of transistor Q33.

Delay circuit DLY2 includes resistor element R47, capacitor C46, and diode D48. Resistor element R47 is connected between the output node of inverter 50 and the gate of transistor Q44. Capacitor C46 is connected between the gate of transistor Q44 and ground node GND. Diode D48 has the cathode connected to the output node of inverter 50 and the anode connected to the gate of transistor Q44. Delay circuit DLY2 delays a rising edge of a signal output from inverter 50, that is, an edge corresponding to switching to ON of transistor Q44.

An operation of power semiconductor device 206 in FIG. 25 will now be described. As drive signal DS switches to the H level, transistors Q11, Q33 are switched to ON. Here, since an output from inverter 50 is switched to the L level, transistors Q22, Q44 are switched to OFF. Consequently, IGBTs Q1, Q2 are simultaneously switched to ON.

As drive signal DS switches to the L level, transistor Q11 is switched to OFF, and transistor Q33 is switched to OFF with a delay by a delay time period determined by delay circuit DLY1. Here, since the output from inverter 50 is switched to the H level, transistor Q22 is switched to ON, and transistor Q44 is switched to ON with a delay by a delay time period determined by delay circuit DLY2. Consequently, IGBT Q1 is switched to OFF first and IGBT Q2 is switched to OFF later.

As described above, a control operation the same as in FIG. 2B described in Embodiment 1 can be realized.

Embodiment 8

Figure 26:
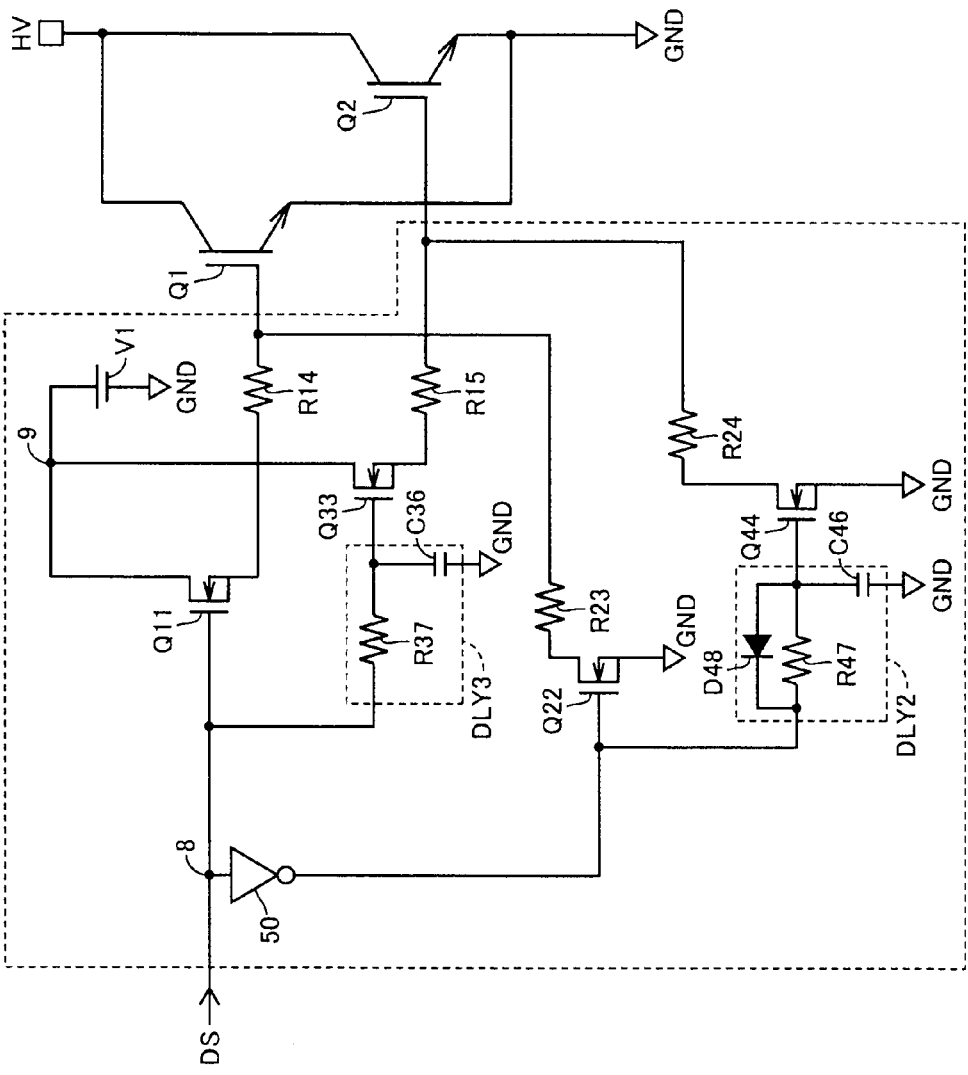
FIG. 26 is a circuit diagram showing a configuration of a power semiconductor device 207 according to Embodiment 8 of the present invention.

FIG. 26 is a circuit diagram showing a configuration of a power semiconductor device 207 according to Embodiment 8 of the present invention. Delay circuit DLY3 provided in a drive control unit 107 in FIG. 26 is different from delay circuit DLY1 in FIG. 25 in not including diode D38. Therefore, delay circuit DLY3 in FIG. 26 supplies a signal obtained by delaying both of the rising edge and the falling edge of drive signal DS to the gate of transistor Q33. Since FIG. 26 is otherwise the same as FIG. 25, the same or corresponding elements have the same reference characters allotted and description will not be repeated.

According to drive control unit 107 shown in FIG. 26, when drive signal DS is switched to the H level, transistor Q33 is switched to ON with a delay by a delay time period determined by delay circuit DLY3. Consequently, when drive signal DS switches to the H level, IGBT Q2 is switched to ON later than switching of IGBT Q1 to ON. Switching of IGBT Q2 to OFF later than switching of IGBT Q1 to OFF is the same as in Embodiment 7. Therefore, power semiconductor device 207 in FIG. 26 can realize a control operation the same as in FIG. 2A described in Embodiment 1.

Embodiment 9

Figure 27:
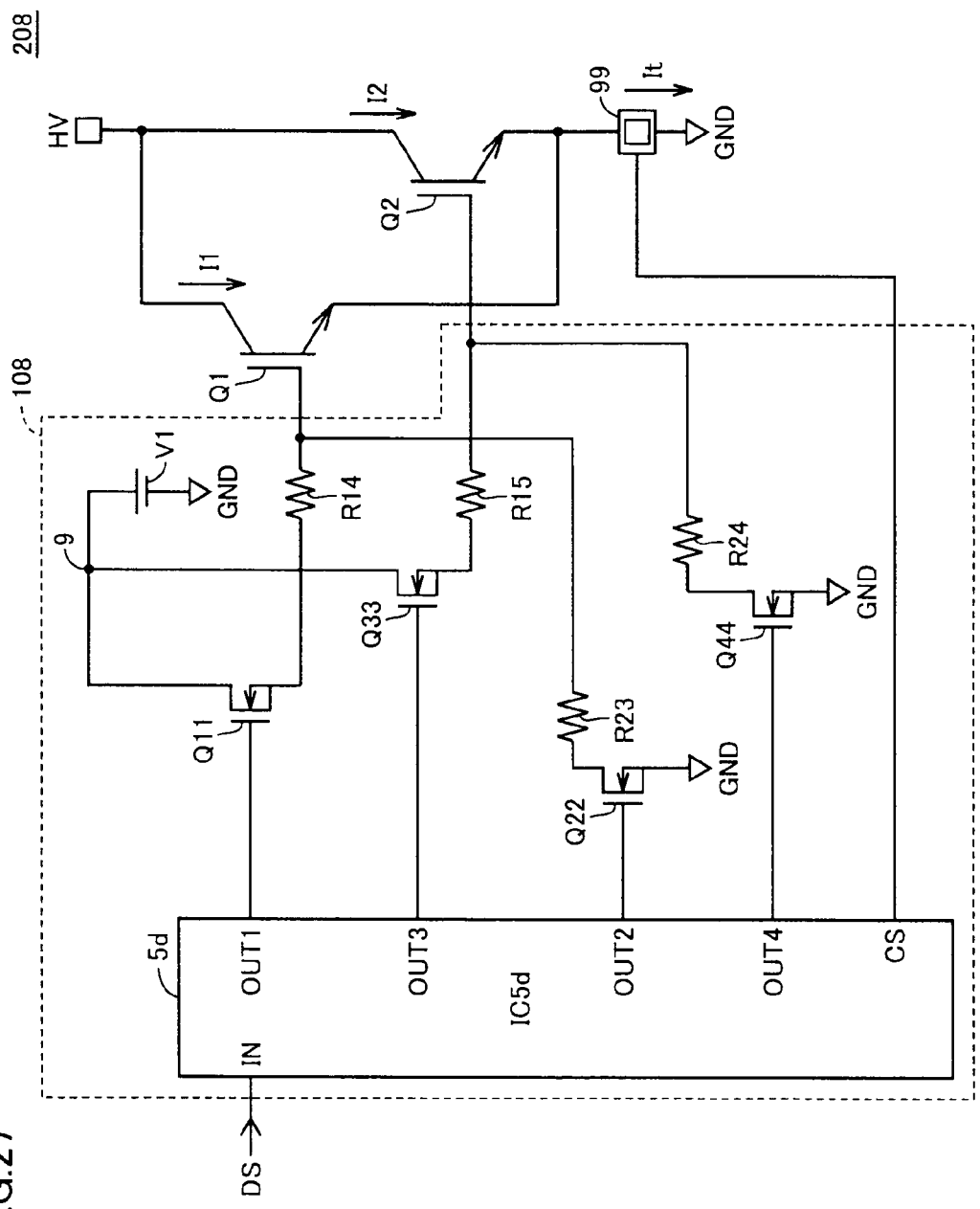
FIG. 27 is a circuit diagram showing a configuration of a power semiconductor device 208 according to Embodiment 9 of the present invention.

FIG. 27 is a circuit diagram showing a configuration of a power semiconductor device 208 according to Embodiment 9 of the present invention. Power semiconductor device 208 in FIG. 27 is different from power semiconductor device 201 in FIG. 17 in further including a current detection sensor 99 for detecting total current It that flows through IGBTs Q1, Q2. For example, a current transformer is employed as current detection sensor 99.

An integrated circuit 5d provided in power semiconductor device 208 in FIG. 27 is different from integrated circuit 5 provided in power semiconductor device 201 in FIG. 17 in further including a terminal CS for receiving a detection signal from current detection sensor 99. Since the configuration in FIG. 27 is otherwise the same as that of power semiconductor device 201 in FIG. 17, the same or corresponding elements have the same reference characters allotted and description will not be repeated.

Integrated circuit 5d determines based on a detection value from current detection sensor 99, in which region of regions sectioned by threshold values Ith1, Ith2 described with reference to FIGS. 3A and 4 total current It is located. Integrated circuit 5d then selects optimal switching timing based on a result of determination, during a period until determination based on a detection value from current detection sensor 99 is made next. For example, when total current It is lower than threshold value Ith1 in FIG. 3A, integrated circuit 5d controls transistors Q11, Q22, Q33, Q44 to ON and OFF at timing as in FIG. 28 below.

Figure 28:
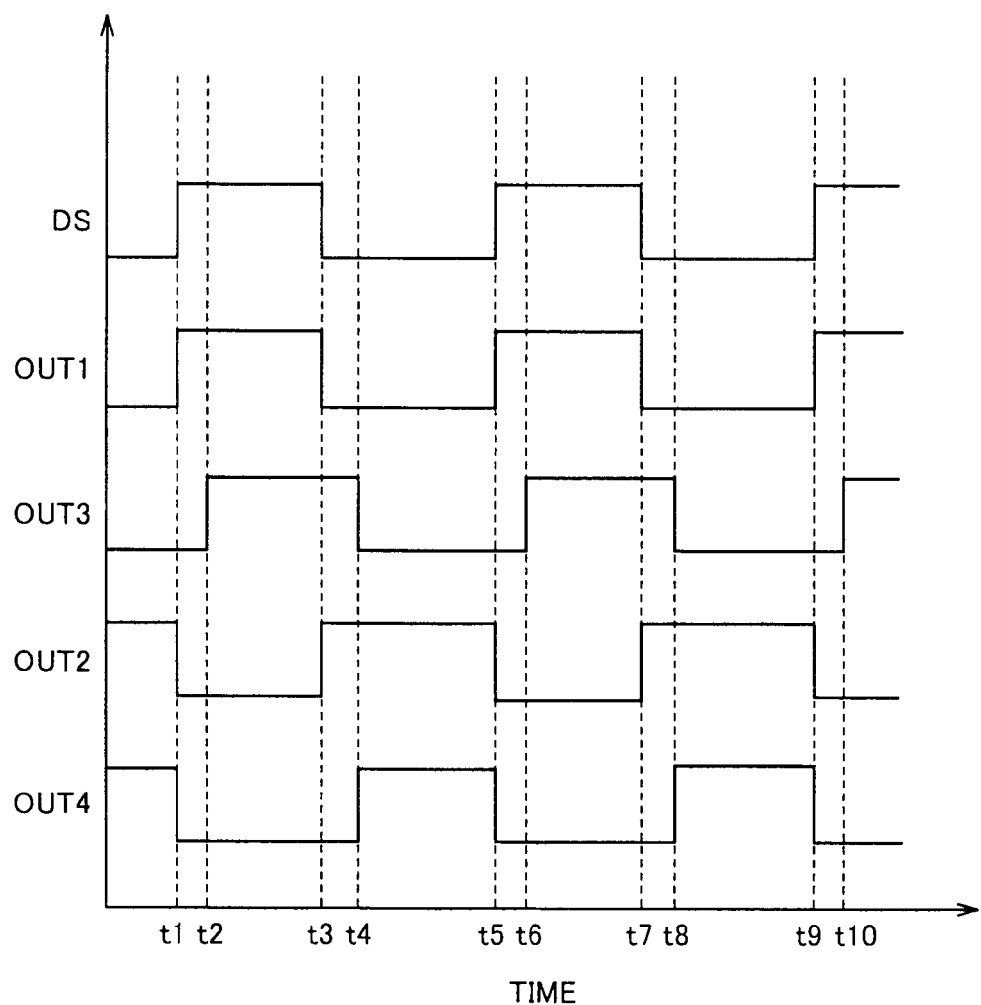
FIG. 28 is a diagram showing one example of a timing chart of a control signal output from an integrated circuit 5d in FIG. 27.

FIG. 28 is a diagram showing one example of a timing chart of a control signal output from integrated circuit 5d in FIG. 27.

Referring to FIGS. 27 and 28, at time t1, in response to switching of drive signal DS to the H level, integrated circuit 5d switches a control signal output from output terminal OUT1 to the H level and switches control signals output from output terminals OUT2, OUT4 to the L level. Thus, transistor Q11 is switched to ON and transistors Q22, Q44 are switched to OFF. Consequently, IGBT Q1 is switched to ON.

At time t2 later than time t1 by a prescribed time period, integrated circuit 5d switches a control signal output from output terminal OUT3 to the H level. Thus, transistor Q33 is switched to ON, and consequently IGBT Q2 is switched to ON later than IGBT Q1.

At time t3, in response to switching of drive signal DS to the L level, integrated circuit 5d switches the control signal output from output terminal OUT1 to the L level and switches the control signal output from output terminal OUT2 to the H level. Thus, transistor Q11 is switched to OFF and transistor Q22 is switched to ON. Consequently, IGBT Q1 is switched to OFF.

At time t4 later than time t3 by a prescribed time period, integrated circuit 5d switches the control signal output from output terminal OUT3 to the L level and switches the control signal output from output terminal OUT4 to the H level. Thus, transistor Q33 is switched to OFF and transistor Q44 is switched to ON. Consequently, IGBT Q2 is switched to OFF later than IGBT Q1.

Thereafter, a similar operation is repeated. Namely, an operation of integrated circuit 5d at time t5 to t8 is the same as the operation at time t1 to t4 and an operation of integrated circuit 5d at time t9, t10 is the same as the operation at time t1, t2.

The operation of integrated circuit 5d above can realize a control operation the same as in FIG. 2A described in Embodiment 1.

When total current It is equal to or higher than threshold value Ith1 in FIG. 3A and lower than threshold value Ith2 in FIG. 4, transistors Q11, Q22, Q33, Q44 are controlled to ON and OFF at timing the same as in the timing chart in FIG. 18 described in Embodiment 2. Thus, as in the case of FIG. 18, a control operation the same as in FIG. 2B can be realized.

In a case where total current It is equal to or higher than threshold value Ith2 in FIG. 4, when drive signal DS switches to the H level, integrated circuit 5d switches control signals output from output terminals OUT1, OUT3 to the H level and switches control signals output from output terminals OUT2, OUT4 to the L level. Thus, IGBTs Q1, Q2 are simultaneously switched to ON. In addition, when drive signal DS switches to the L level, integrated circuit 5d switches the control signals output from output terminals OUT1, OUT3 to the L level and switches the control signals output from output terminals OUT2, OUT4 to the H level. Thus, IGBTs Q1, Q2 are simultaneously switched to OFF. As described above, a control operation the same as in FIG. 2C described in Embodiment 1 can be realized.

Embodiment 10

Figure 29:
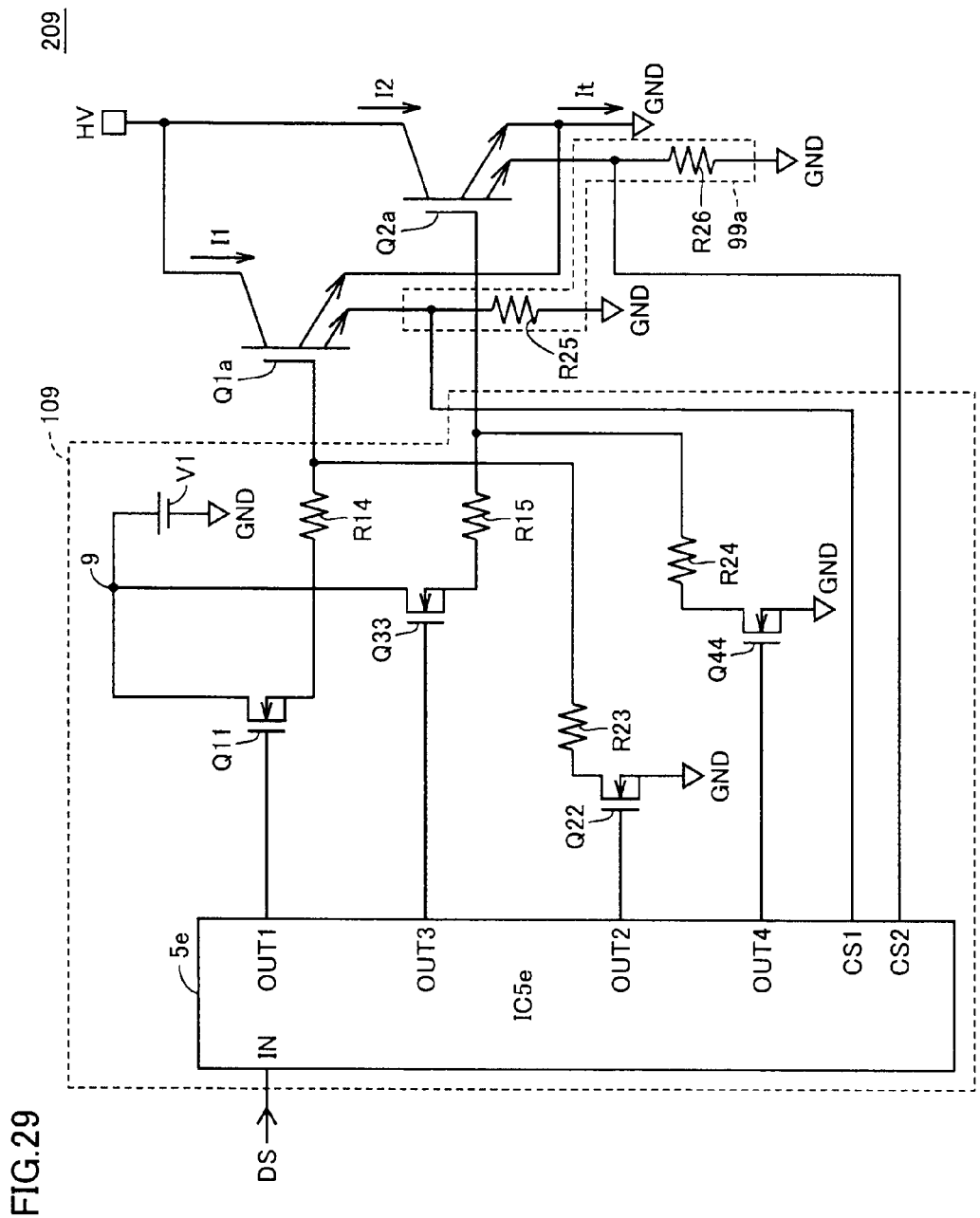
FIG. 29 is a circuit diagram showing a configuration of a power semiconductor device 209 according to Embodiment 10 of the present invention.

FIG. 29 is a circuit diagram showing a configuration of a power semiconductor device 209 according to Embodiment 10 of the present invention.

Power semiconductor device 209 in FIG. 29 is a variation of power semiconductor device 208 in FIG. 27. Namely, power semiconductor device 209 is different from power semiconductor device 208 in including IGBTs Q1a, Q2a with a sensing terminal instead of IGBTs Q1, Q2 in FIG. 27. A part of a main current that flows through an emitter terminal of an IGBT flows through a sensing terminal as diverted. In addition, power semiconductor device 209 is different from power semiconductor device 208 in including shunt resistors R25, R26 instead of current detection sensor 99 in FIG. 27. Shunt resistor R25 is connected between a sensing terminal of IGBT Q1a and ground node GND and shunt resistor R26 is connected between a sensing terminal of IGBT Q2a and ground node GND. Likewise current detection sensor 99 in FIG. 27, shunt resistors R25, R26 function as a current detection sensor 99a for monitoring main currents I1, I2 that flow through IGBTs Q1a, Q2a, respectively.

An integrated circuit 5e provided in a drive control unit 109 in FIG. 29 is different from integrated circuit 5d in FIG. 27 in including detection terminals CS1, CS2 for detecting voltages applied to shunt resistors R25, R26 respectively, instead of detection terminal CS in FIG. 27. Integrated circuit 5e controls transistors Q11, Q22, Q33, Q44 to ON and OFF at optimal timing based on magnitude of currents I1, I2 monitored by shunt resistors R25, R26.

Since FIG. 29 is otherwise the same as FIG. 27 showing power semiconductor device 208, the same or corresponding elements have the same reference characters allotted and description will not be repeated. It is noted that the configuration may be such that only any one of two IGBTs connected in parallel is replaced with an IGBT with a sensing terminal to thereby monitor a current that flows through a sensing IGBT with a shunt resistor. In this case, the integrated circuit controls transistors Q11, Q22, Q33, Q44 to ON and OFF based on magnitude of a current that flows through any one IGBT.

Embodiment 11

Figure 30:
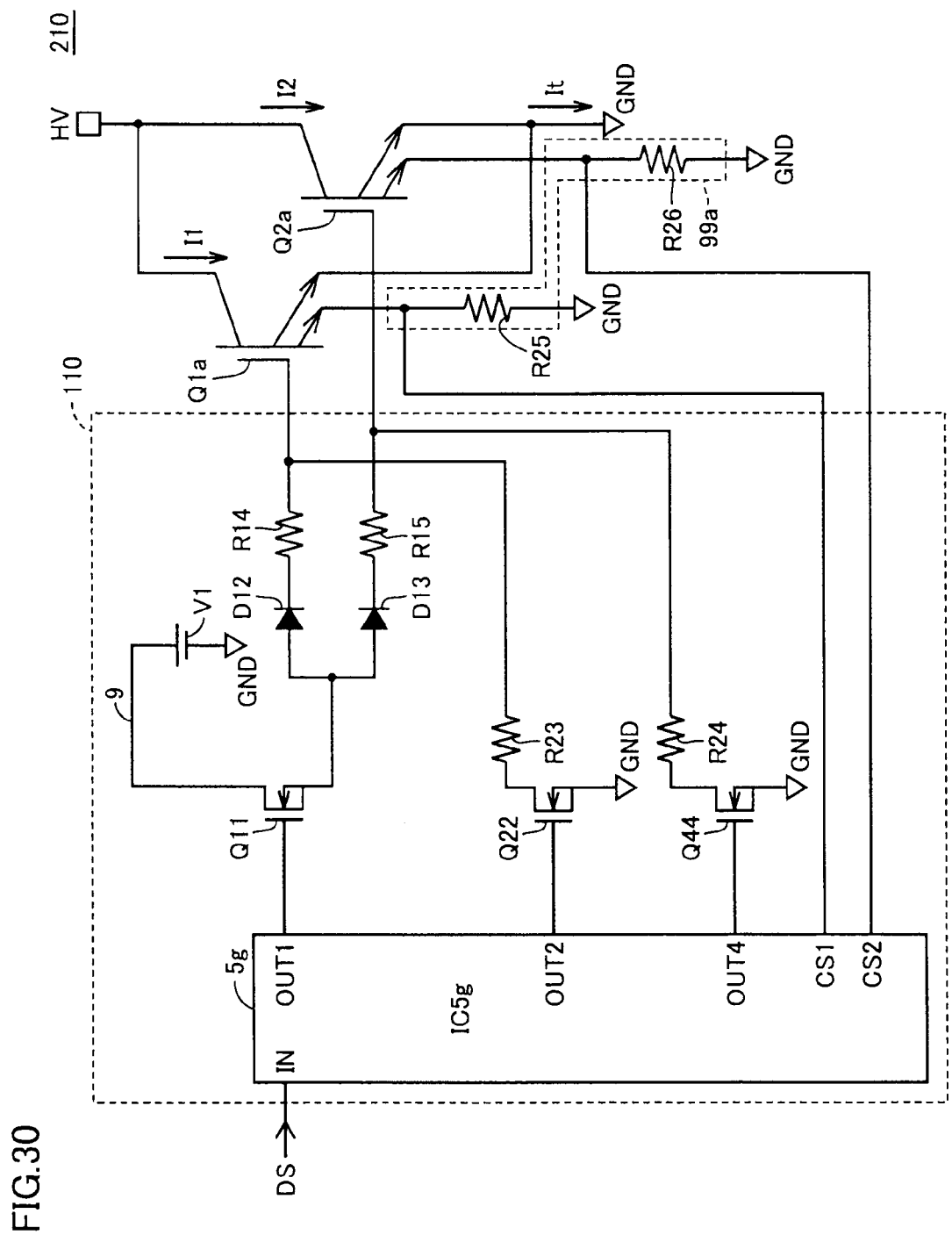
FIG. 30 is a circuit diagram showing a configuration of a power semiconductor device 210 according to Embodiment 11 of the present invention.

FIG. 30 is a circuit diagram showing a configuration of a power semiconductor device 210 according to Embodiment 11 of the present invention.

Power semiconductor device 210 in FIG. 30 is a variation of power semiconductor device 204 in FIG. 22. Namely, power semiconductor device 210 is different from power semiconductor device 204 in including IGBTs Q1a, Q2a with a sensing terminal instead of IGBTs Q1, Q2 in FIG. 22. A part of a main current that flows through an emitter terminal of an IGBT flows through a sensing terminal as diverted. In addition, power semiconductor device 210 is different from power semiconductor device 204 in including shunt resistors R25, R26. Shunt resistor R25 is connected between the sensing terminal of IGBT Q1a and ground node GND and shunt resistor R26 is connected between the sensing terminal of IGBT Q2a and ground node GND. Shunt resistors R25, R26 function as current detection sensor 99a for monitoring main currents I1, I2 that flow through IGBTs Q1a, Q2a, respectively.

An integrated circuit 5g provided in a drive control unit 110 in FIG. 30 is different from integrated circuit 5b in FIG. 22 in including detection terminals CS1, CS2 for detecting voltages applied to shunt resistors R25, R26, respectively. Integrated circuit 5g controls transistors Q11, Q22, Q44 to ON and OFF at optimal timing based on magnitude of currents I1, I2 monitored by shunt resistors R25, R26.

For example, in a case where total current It obtained by adding currents I1, I2 monitored by shunt resistors R25, R26 is equal to or smaller than threshold value Ith2 in FIG. 4, when drive signal DS switches to the H level, integrated circuit 5g switches a control signal output from output terminal OUT1 to the H level and switches control signals output from output terminals OUT2, OUT4 to the L level. In addition, when drive signal DS switches to the L level, integrated circuit 5g switches the control signal output from output terminal OUT2 to the H level. Then, integrated circuit 5g switches the control signal output from output terminal OUT1 to the L level later than switching of drive signal DS to the L level by a prescribed time period and switches the control signal output from output terminal OUT4 to the H level.

As a result of control above, IGBTs Q1a, Q2a can simultaneously be switched to ON and IGBT Q2a can be turned off after IGBT Q1a is turned off. Namely, a control operation the same as in FIG. 2B described in Embodiment 1 can be realized. When drive signal DS switches to the L level, by switching the control signals output from output terminals OUT2, OUT4 to the H level and switching the control signal output from output terminal OUT1 to the L level, IGBTs Q1a, Q2a can simultaneously be switched to OFF. Namely, a control operation the same as in FIG. 2C described in Embodiment 1 can be realized.

Since FIG. 30 is otherwise the same as FIG. 22 showing power semiconductor device 204, the same or corresponding elements have the same reference characters allotted and description will not be repeated. It is noted that the configuration may be such that only any one of two IGBTs connected in parallel is replaced with an IGBT with a sensing terminal to thereby monitor a current that flows through a sensing IGBT with a shunt resistor. In this case, the integrated circuit controls transistors Q11, Q22, Q44 to ON and OFF based on magnitude of a main current that flows through any one IGBT.

Embodiment 12

Figure 31:
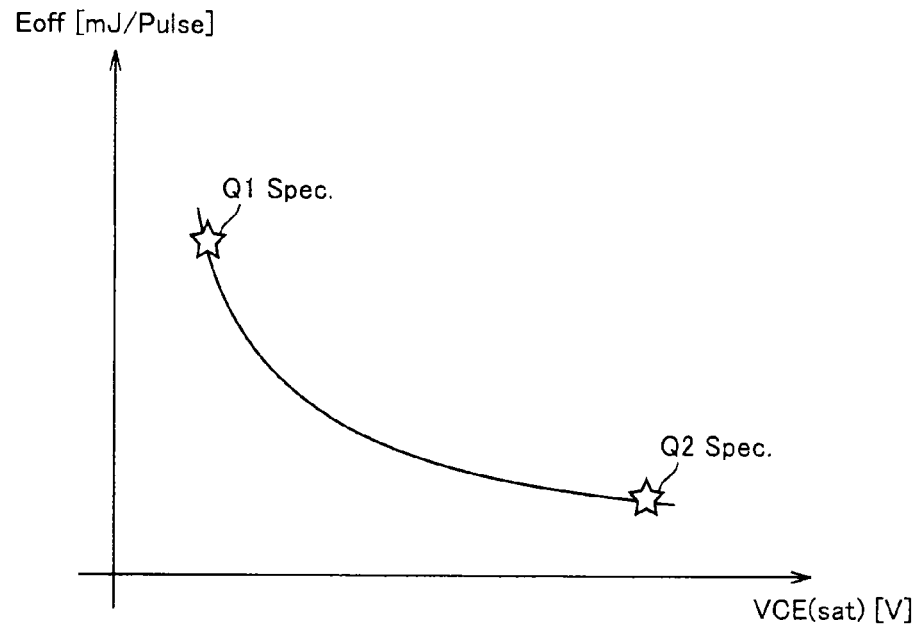
FIG. 31 is a diagram for illustrating specifications of IGBTs Q1, Q2 included in a power semiconductor device according to Embodiment 12 of the present invention.

FIG. 31 is a diagram for illustrating specifications of IGBTs Q1, Q2 included in a power semiconductor device according to Embodiment 12 of the present invention. FIG. 31 shows relation (trade-off) between turn-off loss Eoff and saturation voltage VCE(sat) already described with reference to FIG. 8.

Referring to FIG. 31, in power semiconductor devices 200 to 210 in Embodiments 1 to 11, specifications of IGBT Q2 (Q2 Spec.) are set to be higher in saturation voltage VCE(sat) and lower in turn-off loss Eoff than specifications of IGBT Q1 (Q1 Spec.). Then, turn-off loss Eoff of IGBT Q2 switching to OFF after IGBT Q1 can be suppressed to low and therefore switching loss of the power semiconductor device can further be reduced. It is noted that, as the saturation voltage (steady loss) is higher, a switching speed becomes faster (a switching time period becomes shorter).

Such change in specifications can be made by controlling a doping profile of a collector layer (impurity concentration or a depth of implantation of an impurity) or controlling a lifetime of carriers in a drift layer. In a case where impurity concentration in the collector layer is increased, an element having such specifications as low saturation voltage VCE(sat) characteristics (that is, steady loss) and increase in turn-off loss Eoff can be fabricated. If a lifetime of carriers in the drift layer is shortened by electron beam injection or the like, an element having such specifications as high saturation voltage VCE(sat) characteristics (that is, steady loss) and decrease in turn-off loss Eoff can be fabricated.

Embodiment 13

In the power semiconductor devices according to Embodiments 1 to 12 above, IGBTs Q1, Q2 may be selected such that a threshold voltage of IGBT Q2 is lower than a threshold voltage of IGBT Q1. By selecting IGBTs Q1, Q2 having such specifications, at the time of turn-off, IGBT Q1 can further reliably be switched to OFF earlier than IGBT Q2. In addition, by adjusting a threshold voltage of an IGBT, the following variation is also possible.

Figure 32:
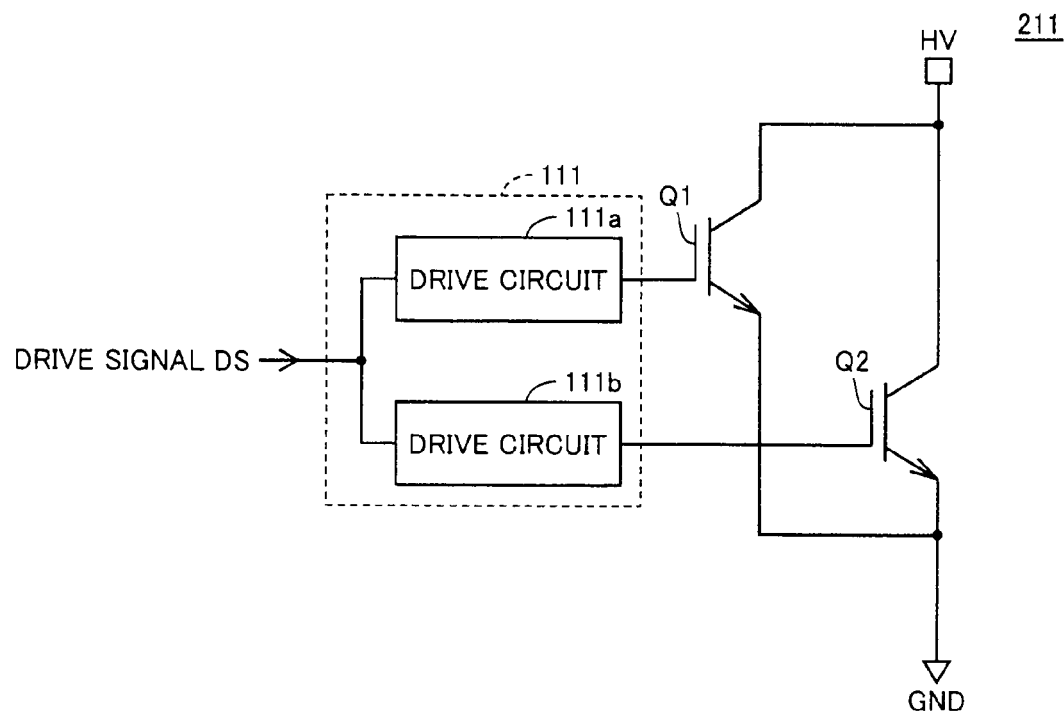
FIG. 32 is a diagram of a configuration of a power semiconductor device 211 according to a variation of Embodiment 13 of the present invention.

FIG. 32 is a diagram of a configuration of a power semiconductor device 211 according to a variation of Embodiment 13 of the present invention. Power semiconductor device 211 in FIG. 32 includes IGBTs Q1, Q2 connected in parallel between high-voltage node HV and ground node GND and a drive control unit 111 constituted of drive circuits 111a, 111b. Drive circuits 111a, 111b amplify drive signal DS, that is, supply signals at the same logic level as drive signals DS to the gates of IGBTs Q1, Q2, respectively.

In the variation shown in FIG. 32 as well, IGBTs Q1, Q2 are selected such that a threshold voltage of IGBT Q2 is lower than a threshold voltage of IGBT Q1. Thus, at the time of turn-on, IGBT Q2 is switched to ON first, and at the time of turn-off, IGBT Q2 is switched to OFF later. By setting specifications of IGBT Q2 to be higher in saturation voltage VCE (sat) and lower in turn-off loss Eoff than specifications of IGBT Q1, switching loss of power semiconductor device 211 can be suppressed to low.

Embodiment 14

Figure 33:
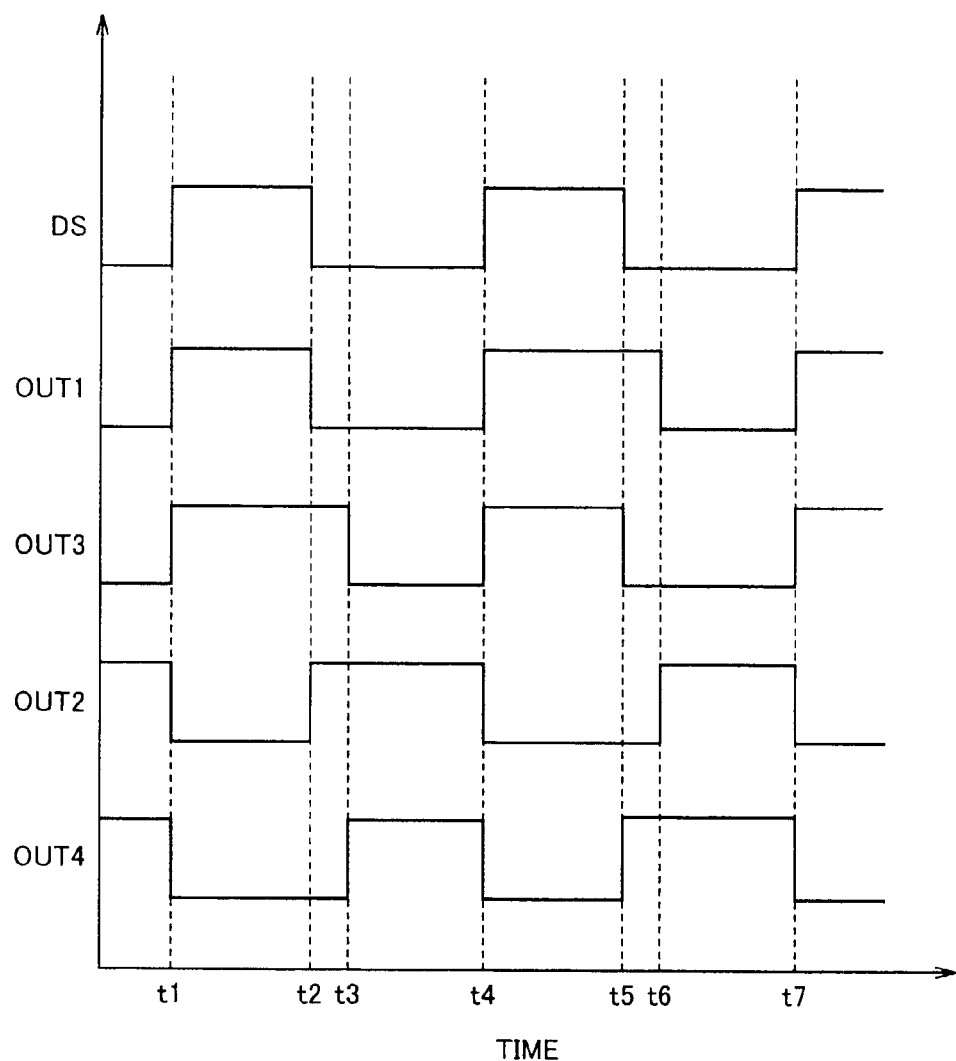
FIG. 33 is a diagram for illustrating a variation of a method of controlling switching of IGBTs Q1, Q2 by drive control units 101, 108, 109 in power semiconductor devices 201, 208, 209 according to Embodiments 2, 9, 10.

FIG. 33 is a diagram for illustrating a variation of a method of controlling switching IGBTs Q1, Q2 by drive control units 101, 108, 109 in power semiconductor devices 201, 208, 209 according to Embodiments 2, 9, 10. FIG. 33 shows a timing chart of control signals output from integrated circuits 5, 5d, 5e provided in drive control units 101, 108, 109, respectively. Though integrated circuit 5 shown in FIG. 17 will be described hereinafter as a representative, the description is also applicable to integrated circuits 5d, 5e.

Referring to FIGS. 17 and 33, at time t1, in response to switching of drive signal DS to the H level, integrated circuit 5 switches control signals output from output terminals OUT1, OUT3 to the H level and switches control signals output from output terminals OUT2, OUT4 to the L level. Thus, transistors Q11, Q33 are switched to ON and transistors Q22, Q44 are switched to OFF. Consequently, IGBTs Q1, Q2 are simultaneously switched to ON.

At time t2, in response to switching of drive signal DS to the L level, integrated circuit 5 switches the control signal output from output terminal OUT1 to the L level and switches the control signal output from output terminal OUT2 to the H level. Thus, transistor Q11 is switched to OFF and transistor Q22 is switched to ON. Consequently, IGBT Q1 is switched to OFF.

At time t3 later than time t2 by a prescribed time period, integrated circuit 5 switches the control signal output from output terminal OUT3 to the L level and switches the control signal output from output terminal OUT4 to the H level. Thus, transistor Q33 is switched to OFF and transistor Q44 is switched to ON. Consequently, IGBT Q2 is switched to OFF later than IGBT Q1.

At time t4, in response to switching again of drive signal DS to the H level, integrated circuit 5 switches the control signals output from output terminals OUT1, OUT3 to the H level and switches the control signals output from output terminals OUT2, OUT4 to the L level. Thus, transistors Q11, Q33 are switched to ON and transistors Q22, Q44 are switched to OFF. Consequently, IGBTs Q1, Q2 are simultaneously switched to ON.

At time t5, in response to switching of drive signal DS to the L level, integrated circuit 5 switches the control signal output from output terminal OUT3 to the L level and switches the control signal output from output terminal OUT4 to the H level. Thus, transistor Q33 is switched to OFF and transistor Q44 is switched to ON. Consequently, IGBT Q2 is switched to OFF.

At time t6 later than time t5 by a prescribed time period, integrated circuit 5 switches the control signal output from output terminal OUT1 to the L level and switches the control signal output from output terminal OUT2 to the H level. Thus, transistor Q11 is switched to OFF and transistor Q22 is switched to ON. Consequently, IGBT Q1 is switched to OFF later than IGBT Q2. At time t7 and later, timing control above is repeated.

According to the method of controlling switching of IGBTs Q1, Q2 by drive control units 101, 108, 109 above, IGBTs Q1, Q2 are alternately switched to OFF, one later than another. When IGBT Q1 is switched to OFF later than IGBT Q2, most of turn-off loss Eoff is born by IGBT Q1. In contrast, when IGBT Q2 is switched to OFF later than IGBT Q1, most of turn-off loss Eoff is born by IGBT Q2. Since turn-off loss Eoff can thus be born by both of IGBTs Q1, Q2, longer life of IGBTs Q1, Q2 can be expected. It is particularly effective in the case of IGBTs Q1, Q2 identical in specifications (such as saturation voltage VCE(sat)).

Embodiment 15

Figure 34:
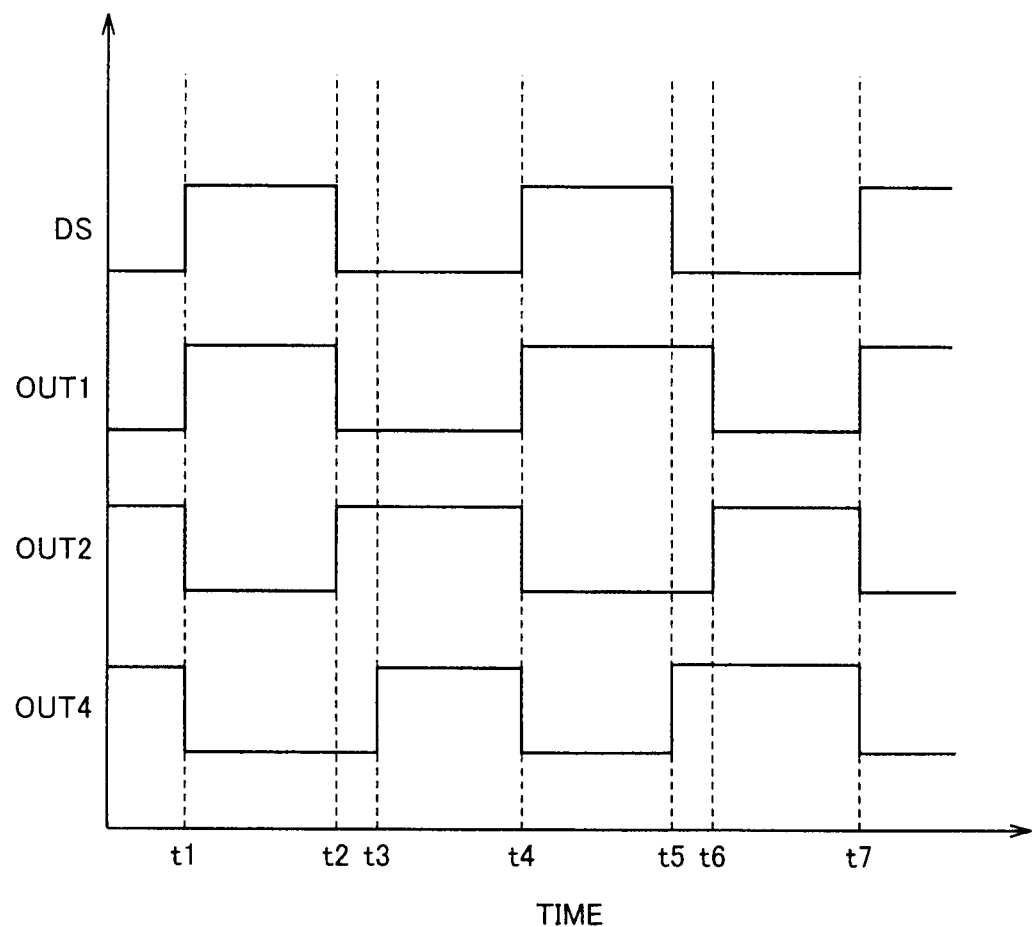
FIG. 34 is a diagram for illustrating a variation of a method of controlling switching of IGBTs Q1, Q2 by drive control units 104, 110 in power semiconductor devices 204, 210 according to Embodiments 5, 11.

FIG. 34 is a diagram for illustrating a variation of a method of controlling switching of IGBTs Q1, Q2 by drive control units 104, 110 in power semiconductor devices 204, 210 according to Embodiments 5, 11. FIG. 34 shows a timing chart of control signals output from integrated circuits 5b, 5g provided in drive control units 104, 110, respectively. Though integrated circuit 5b shown in FIG. 22 will be described hereinafter as a representative, the description is also applicable to integrated circuit 5g.

Referring to FIGS. 22 and 34, at time t1, in response to switching of drive signal DS to the H level, integrated circuit 5b switches a control signal output from output terminal OUT1 to the H level and switches control signals output from output terminals OUT2, OUT4 to the L level, Thus, transistor Q11 is switched to ON and transistors Q22, Q44 are switched to OFF. Consequently, IGBTs Q1, Q2 are simultaneously switched to ON.

At time t2, in response to switching of drive signal DS to the L level, integrated circuit 5b switches the control signal output from output terminal OUT1 to the L level and switches the control signal output from output terminal OUT2 to the H level. Thus, transistor Q11 is switched to OFF and transistor Q22 is switched to ON. Consequently, IGBT Q1 is switched to OFF.

At time t3 later than time t2 by a prescribed time period, integrated circuit 5b switches the control signal output from output terminal OUT4 to the H level. Thus, transistor Q44 is switched to ON. Consequently, IGBT Q2 is switched to OFF later than IGBT Q1.

At time t4, in response to switching again of drive signal DS to the H level, integrated circuit 5b switches the control signal output from output terminal OUT1 to the H level and switches the control signals output from output terminals OUT2, OUT4 to the L level. Thus, transistor Q11 is switched to ON and transistors Q22, Q44 are switched to OFF. Consequently, IGBTs Q1, Q2 are simultaneously switched to ON.

At time t5, in response to switching of drive signal DS to the L level, integrated circuit 5b switches the control signal output from output terminal OUT4 to the H level. Thus, transistor Q44 is switched to ON and hence IGBT Q2 is switched to OFF.

At time t6 later than time t5 by a prescribed time period, integrated circuit 5b switches the control signal output from output terminal OUT1 to the L level and switches the control signal output from output terminal OUT2 to the H level. Thus, transistor Q11 is switched to OFF and transistor Q22 is switched to ON. Consequently, IGBT Q1 is switched to OFF later than IGBT Q2. At time t7 and later, timing control above is repeated.

According to the method of controlling switching of IGBTs Q1, Q2 by drive control units 104, 110 above, IGBTs Q1, Q2 are alternately switched to OFF, one later than another. When IGBT Q1 is switched to OFF later than IGBT Q2, most of turn-off loss Eoff is born by IGBT Q1. In contrast, when IGBT Q2 is switched to OFF later than IGBT Q1, most of turn-off loss Eoff is born by IGBT Q2. Since turn-off loss Eoff can thus be born by both of IGBTs Q1, Q2, longer life of IGBTs Q1, Q2 can be expected. It is particularly effective in the case of IGBTs Q1, Q2 identical in specifications (such as saturation voltage VCE(sat)).

Embodiment 16

Figure 35:
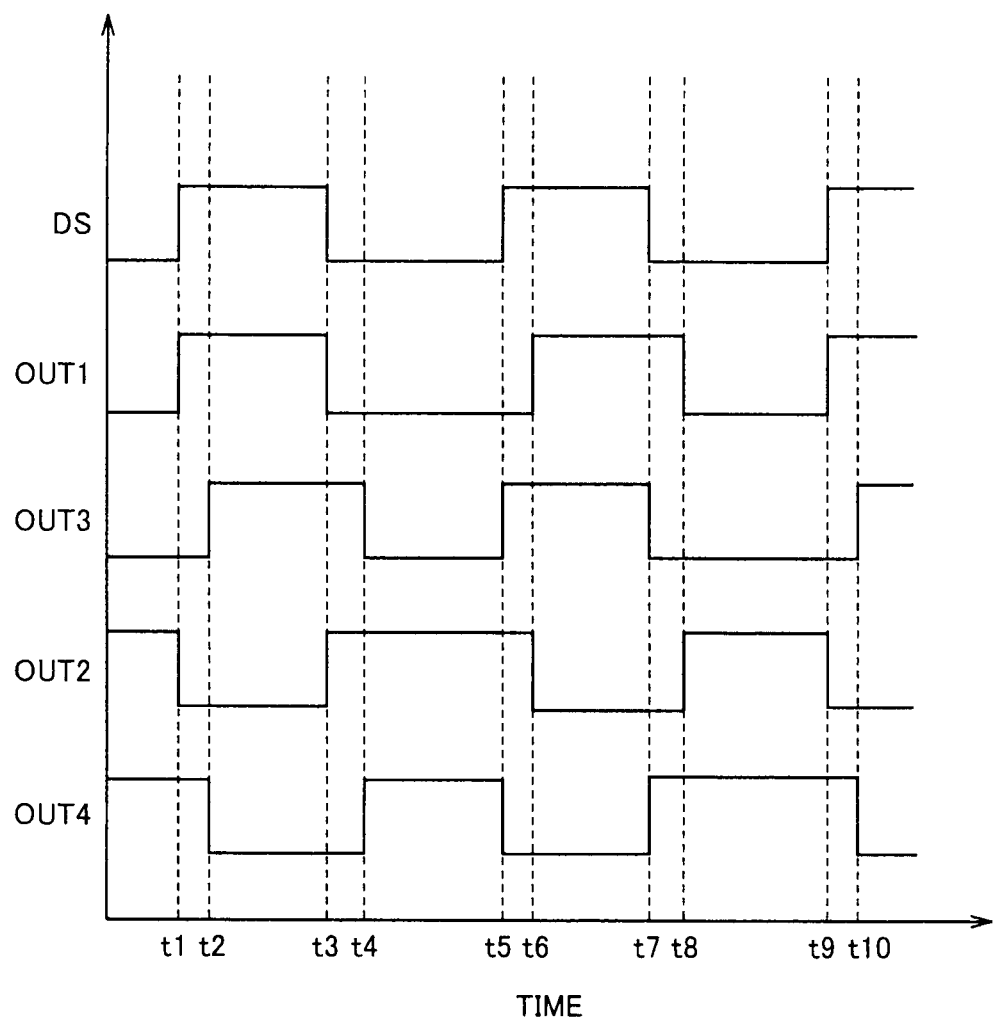
FIG. 35 is a diagram for illustrating another variation of the method of controlling switching of IGBTs Q1, Q2 by drive control units 101, 108, 109 in power semiconductor devices 201, 208, 209 according to Embodiments 2, 9, 10.

FIG. 35 is a diagram for illustrating another variation of a method of controlling switching of IGBTs Q1, Q2 by drive control units 101, 108, 109 in power semiconductor devices 201, 208, 209 according to Embodiments 2, 9, 10. FIG. 35 shows a timing chart of control signals output from integrated circuits 5, 5d, 5e provided in drive control units 101, 108, 109, respectively. Though integrated circuit 5 shown in FIG. 17 will be described hereinafter as a representative, the description is also applicable to integrated circuits 5*d*, 5*e*.

Referring to FIGS. 17 and 35, at time t1, in response to switching of drive signal DS to the H level, integrated circuit 5 switches a control signal output from output terminal OUT1 to the H level and switches a control signal output from output terminal OUT2 to the L level. Thus, transistor Q11 is switched to ON and transistor Q22 is switched to OFF. Consequently, IGBT Q1 is switched to ON.

At time t2 later than time t1 by a prescribed time period, integrated circuit 5 switches a control signal output from output terminal OUT3 to the H level and switches a control signal output from output terminal OUT4 to the L level. Thus, transistor Q33 is switched to ON and transistor Q44 is switched to OFF. Consequently, IGBT Q2 is switched to ON later than IGBT Q1.

At time t3, in response to switching of drive signal DS to the L level, integrated circuit 5 switches the control signal output from output terminal OUT1 to the L level and switches the control signal output from output terminal OUT2 to the H level. Thus, transistor Q11 is switched to OFF and transistor Q22 is switched to ON. Consequently, IGBT Q1 is switched to OFF.

At time t4 later than time t3 by a prescribed time period, integrated circuit 5 switches the control signal output from output terminal OUT3 to the L level and switches the control signal output from output terminal OUT4 to the H level. Thus, transistor Q33 is switched to OFF and transistor Q44 is switched to ON. Consequently, IGBT Q2 is switched to OFF later than IGBT Q1.

At time t5, in response to switching again of drive signal DS to the H level, integrated circuit 5 switches the control signal output from output terminal OUT3 to the H level and switches the control signal output from output terminal OUT4 to the L level. Thus, transistor Q33 is switched to ON and transistor Q44 is switched to OFF. Consequently, IGBT Q2 is switched to ON.

At time t6 later than time t5 by a prescribed time period, integrated circuit 5 switches the control signal output from output terminal OUT1 to the H level and switches the control signal output from output terminal OUT2 to the L level. Thus, transistor Q11 is switched to ON and transistor Q22 is switched to OFF. Consequently, IGBT Q1 is switched to ON later than IGBT Q2.

At time t7, in response to switching of drive signal DS to the L level, integrated circuit 5 switches the control signal output from output terminal OUT3 to the L level and switches the control signal output from output terminal OUT4 to the H level. Thus, transistor Q33 is switched to OFF and transistor Q44 is switched to ON. Consequently, IGBT Q2 is switched to OFF.

At time t8 later than time t7 by a prescribed time period, integrated circuit 5 switches the control signal output from output terminal OUT1 to the L level and switches the control signal output from output terminal OUT2 to the H level. Thus, transistor Q11 is switched to OFF and transistor Q22 is switched to ON. Consequently, IGBT Q1 is switched to OFF later than IGBT Q2. At time t9 and later, timing control above is repeated.

According to the method of controlling switching of IGBTs Q1, Q2 by drive control units 101, 108, 109 above, IGBTs Q1, Q2 are alternately switched to ON, one later than another, and alternately switched to OFF, one later than another. Therefore, IGBT Q1 first bears turn-on loss and IGBT Q2 then bears turn-off loss Eoff, and then IGBT Q2 bears turn-on loss Eon and IGBT Q1 then bears turn-off loss Eoff. Since turn-on loss Eon and turn-off loss Eoff can thus alternately be born by both of IGBTs Q1, Q2, longer life of IGBTs Q1, Q2 can be expected. It is particularly effective in the case of IGBTs Q1, Q2 identical in specifications (such as saturation voltage VCE(sat)).

Embodiment 17

Examples where two power semiconductor elements Q1, Q2 connected in parallel are provided between high-voltage node HV and ground node GND in the power semiconductor devices in Embodiments 1 to 16 above have been shown. A configuration where two or more power semiconductor elements connected in parallel between high-voltage node HV and ground node GND are provided and at least one power semiconductor element operates in a delayed manner can obtain an effect as in the above.

Embodiment 18

In the power semiconductor devices according to Embodiments 1 to 17 above, such a bipolar element as an IGBT or a common bipolar transistor may be provided as IGBT Q1 and such a unipolar element as a power MOS transistor formed, for example, of SiC may be provided instead of IGBT Q2. Since turn-off loss Eoff can be suppressed to low by providing a semiconductor element greater in switching speed, such as a unipolar element, as IGBT Q2 switched to OFF following IGBT Q1, switching loss of the power semiconductor device can further be reduced.

Embodiment 19

Figure 36:
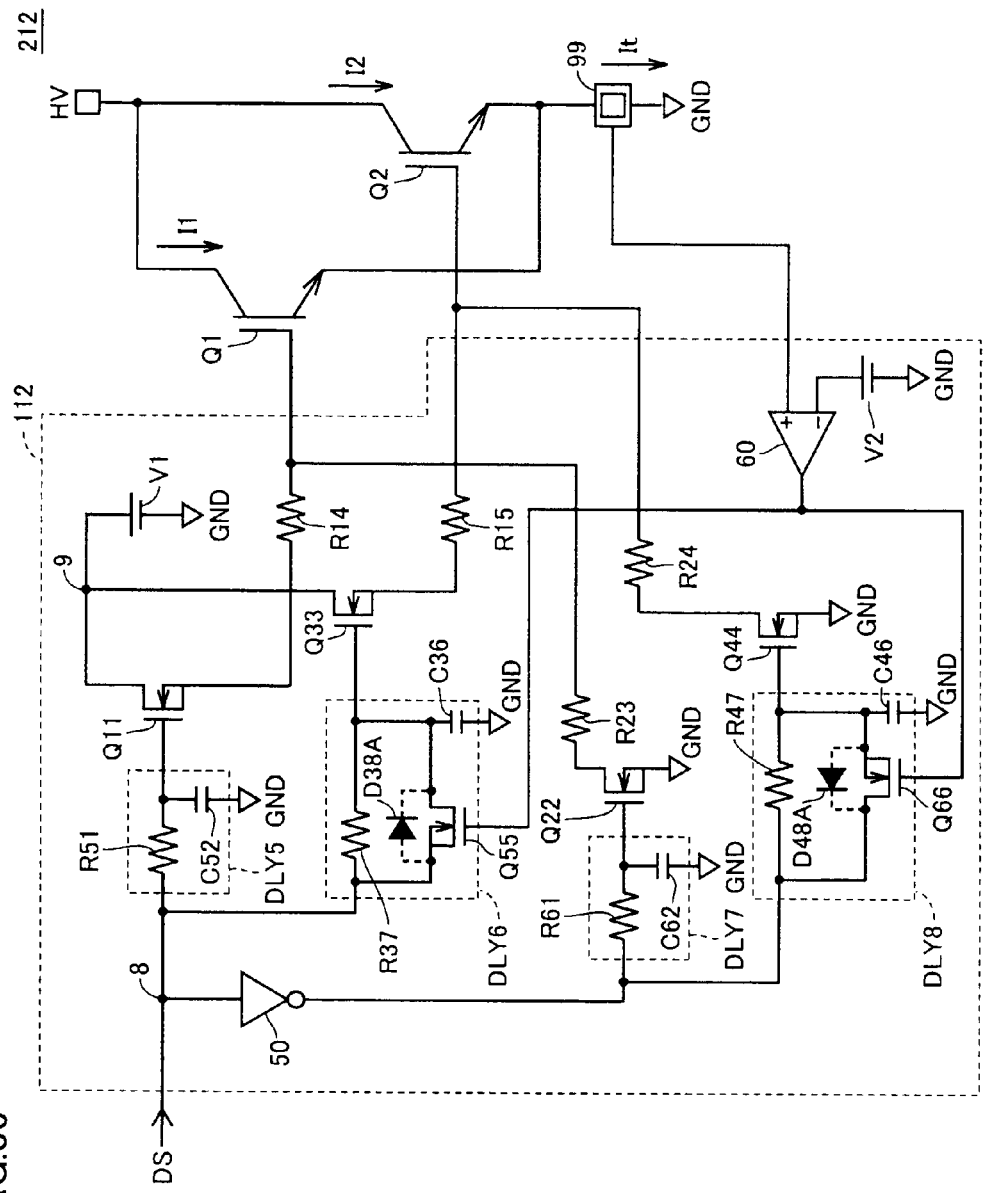
FIG. 36 is a circuit diagram showing a configuration of a power semiconductor device 212 according to Embodiment 19 of the present invention.

FIG. 36 is a circuit diagram showing a configuration of a power semiconductor device 212 according to Embodiment 19 of the present invention. Power semiconductor device 212 in FIG. 36 includes IGBTs Q1, Q2, current detection sensor 99 for detecting total current It that flows through IGBTs Q1, Q2 described with reference to FIG. 27, and a drive control unit 112. Drive control unit 112 is a variation of drive control unit 106 described with reference to FIG. 25 such that timing of switching of IGBTs Q1, Q2 is varied in response to an output from current detection sensor 99, which will specifically be described below.

Referring to FIG. 36, drive control unit 112 includes input node 8 to which drive signal DS is input, inverter 50, power supply for drive V1, resistor elements R14, R15, R23, R24, N-type MOS transistors Q11, Q22, Q33, Q44 for driving IGBTs Q1, Q2, delay circuits DLY5 to DLY8, and a comparator 60.

Inverter 50 inverts a logic level of drive signal DS input to input node 8.

The drains of transistors Q11, Q33 are connected to power supply node 9 supplied with a drive voltage from power supply for drive V1. The sources of transistors Q22, Q44 are connected to ground node GND.

One ends of resistor elements R14, R23 are connected to the gate of IGBT Q1 and one ends of resistor elements R15, R24 are connected to the gate of IGBT Q2. The other end of resistor element R14 is connected to the source of transistor Q11 and the other end of resistor element R15 is connected to the source of transistor Q33. The other end of resistor element R23 is connected to the drain of transistor Q22 and the other end of resistor element R24 is connected to the drain of transistor Q44.

Comparator 60 determines whether or not an output from current detection sensor 99 exceeds a reference voltage V2 corresponding to threshold value Ith2 described with reference to FIG. 4. Comparator 60 outputs a signal at the level when an output from current detection sensor 99 exceeds reference voltage V2 and outputs a signal at the L level when it is equal to or lower than reference voltage V2.

Delay circuit DLY5 includes a resistor element R51 and a capacitor C52. Resistor element R51 is connected between input node 8 and the gate of transistor Q11. Capacitor C52 is connected between the gate of transistor Q11 and ground node GND.

Delay circuit DLY6 includes resistor element R37, capacitor C36, and an NMOS transistor Q55. Here, NMOS transistor Q55 has what is called a vertical structure, in which a parasitic diode D38A having a direction from a source to a drain as a forward direction is present. Resistor element R37 is connected between input node 8 and the gate of transistor Q33. Capacitor C36 is connected between the gate of transistor Q33 and ground node GND. Transistor Q55 has the source connected to input node 8 and the drain connected to the gate of transistor Q33 such that it is connected in parallel to resistor element R37. As transistor Q55 receives an output from comparator 60 at its gate electrode, it is turned off when the output from current detection sensor 99 is equal to or lower than reference voltage V2 and turned on when it exceeds reference voltage V2.

Delay circuit DLY7 includes a resistor element R61 and a capacitor C62. Resistor element R61 is connected between the output node of inverter 50 and the gate of transistor Q22. Capacitor C62 is connected between the gate of transistor Q22 and ground node GND.

Delay circuit DLY8 includes resistor element R47, capacitor C46, and an NMOS transistor Q66. Here, NMOS transistor Q66 has what is called a vertical structure, in which a parasitic diode D48A having a direction from a source to a drain as a forward direction is present. Resistor element R47 is connected between the output node of inverter 50 and the gate of transistor Q44. Capacitor C46 is connected between the gate of transistor Q44 and ground node GND. Transistor Q66 has the drain connected to the output node of inverter 50 and the source connected to the gate of transistor Q44 such that it is connected in parallel to resistor element R47. As transistor Q66 receives an output from comparator 60 at its gate electrode, it is turned off when the output from current detection sensor 99 is equal to or lower than reference voltage V2 and turned on when it exceeds reference voltage V2.

In order for a time of start of turn-on of IGBTs Q1, Q2 to be the same, a capacitance value of capacitor C36 is set to be equal to a capacitance value of capacitor C52. In addition, a resistance value of resistor element R51 is set to be equal to an ON resistance of transistor Q55. A resistance value of resistor element R37 is set to a value greater than a resistance value of resistor element R51. In order for a time of start of turn-off of the IGBTs to be the same, a capacitance value of capacitor C46 is set to be equal to a capacitance value of capacitor C62. In addition, a resistance value of resistor element R61 is set to be equal to an ON resistance of transistor Q66. A resistance value of resistor element R47 is set to a value greater than a resistance value of resistor element R61.

Figure 37A:
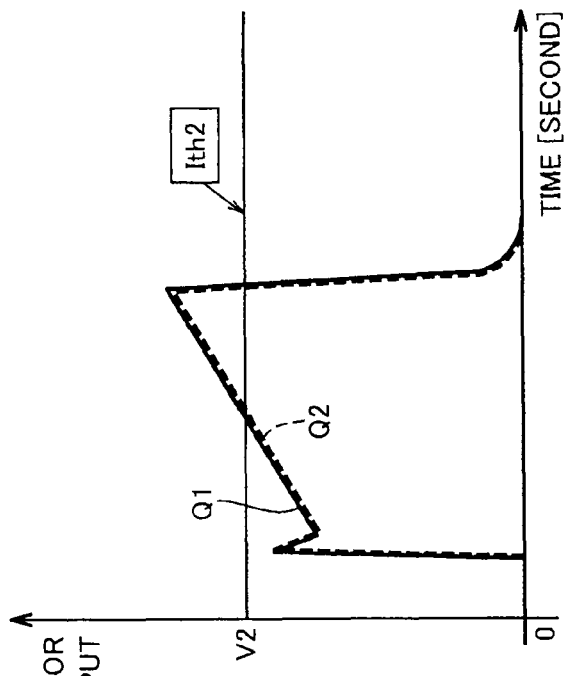
FIG. 37A is a diagram showing one example of a waveform output from a current detection sensor 99 in FIG. 36 (when an output from current detection sensor 99 does not exceed a reference voltage V2 corresponding to a threshold value Ith2).
Figure 37B:
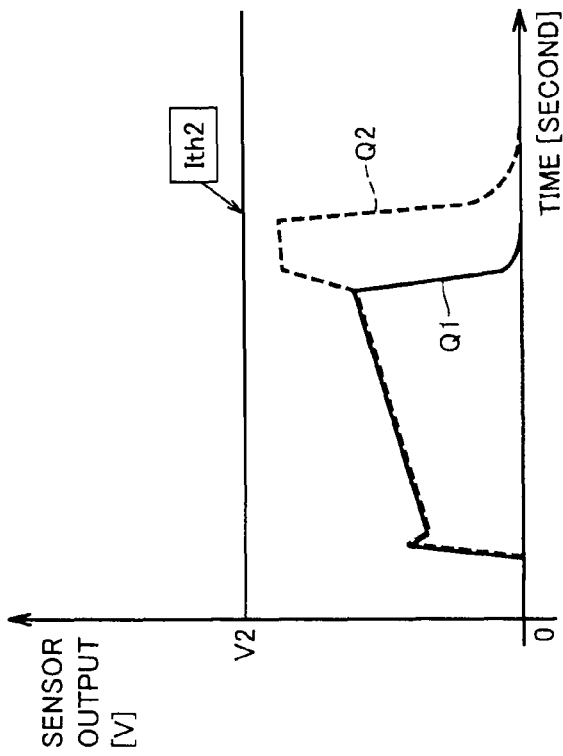
FIG. 37B is a diagram showing one example of a waveform output from current detection sensor 99 in FIG. 36 (when an output from current detection sensor 99 exceeds reference voltage V2 corresponding to threshold value Ith2).

FIGS. 37A and 37B are each a diagram showing one example of a waveform output from current detection sensor 99 in FIG. 36. FIGS. 37A and 37B show a waveform from switching of IGBTs Q1, Q2 from OFF to ON in response to switching of drive signal DS from the L level to the H level until return of IGBTs Q1, Q2 to the OFF state in response to subsequent return of drive signal DS to the L level. FIG. 37A shows a case where an output from current detection sensor 99 does not exceed reference voltage V2 corresponding to threshold value Ith2, and FIG. 37B shows a case where an output from current detection sensor 99 exceeds reference voltage V2 corresponding to threshold value Ith2.

The case of FIG. 37A will initially be described. In this case, transistors Q55, Q66 are normally OFF. When drive signal DS switches from the L level to the H level, transistor Q11 switches from OFF to ON with a delay time period (hereinafter referred to as a delay time period DT1) determined by a resistance value of resistor element R51 and a capacitance value of capacitor C52. When it is assumed that ON resistance of parasitic diode D38A is equivalent to ON resistance of transistor Q55, transistor Q33 also switches from OFF to ON with delay time period DT1. In addition, transistor Q22 switches from ON to OFF with a delay time period (hereinafter referred to as a delay time period DT2) determined by a resistance value of resistor element R62 and a capacitance value of capacitor C62. When it is assumed that ON resistance of parasitic diode D48A is equivalent to ON resistance of transistor Q66, transistor Q44 also switches from ON to OFF with delay time period DT2. As a result of switching of transistors Q11, Q22, Q33, Q44 above, IGBTs Q1, Q2 are simultaneously turned on.

When drive signal DS switches from the H level to the L level in FIG. 37A, transistor Q11 switches from ON to OFF with delay time period DT1. Transistor Q33 switches from ON to OFF with a delay time period (hereinafter referred to as a delay time period DT3; where DT3>DT1) in accordance with a resistance value of resistor element R37 and a capacitance value of capacitor C36. In addition, transistor Q22 switches from OFF to ON with delay time period DT2. Transistor Q44 switches from OFF to ON with a delay time period (hereinafter referred to as a delay time period DT4; where DT4>DT2) in accordance with a resistance value of resistor element R47 and a capacitance value of capacitor C46. As a result of switching of transistors Q11, Q22, Q33, Q44 above, IGBT Q1 is turned off first and thereafter IGBT Q2 is turned off.

Then, the case of FIG. 37B will be described. In this case, when drive signal DS switches from the L level to the H level, transistors Q55, Q66 are OFF. Therefore, transistors Q11 and Q33 are switched from OFF to ON with delay time period DT1. In addition, transistors Q22 and Q44 are switched from ON to OFF with delay time period DT2. As a result of switching of transistors Q11, Q22, Q33, Q44 above, IGBTs Q1, Q2 are simultaneously turned on.

In FIG. 37B, while drive signal DS is at the H level, an output voltage of current detection sensor 99 exceeds reference voltage V2 and transistors Q55, Q66 are turned on. When drive signal DS switches from the H level to the L level in this state, transistor Q11 switches from ON to OFF with delay time period DT1. Transistor Q33 switches from ON to OFF with a delay time period determined by ON resistance of transistor Q55 and a capacitance value of capacitor C36, that is, with delay time period DT1. In addition, transistor Q22 switches from OFF to ON with delay time period DT2. Transistor Q44 switches from OFF to ON with a delay time period in accordance with ON resistance of transistor Q66 and a capacitance value of capacitor C46, that is, with delay time period DT2. As a result of switching of transistors Q11, Q22, Q33, Q44 above, IGBTs Q1, Q2 are simultaneously turned off.

As described above, with drive control unit 112 according to Embodiment 19, a control operation the same as in FIG. 2B described in Embodiment 1 can be realized when total current It that flows through IGBTs Q1, Q2 is equal to or smaller than threshold value Ith2 and a control operation the same as in FIG. 2C can be realized when total current It exceeds threshold value Ith2.

Embodiment 20

Figure 38:
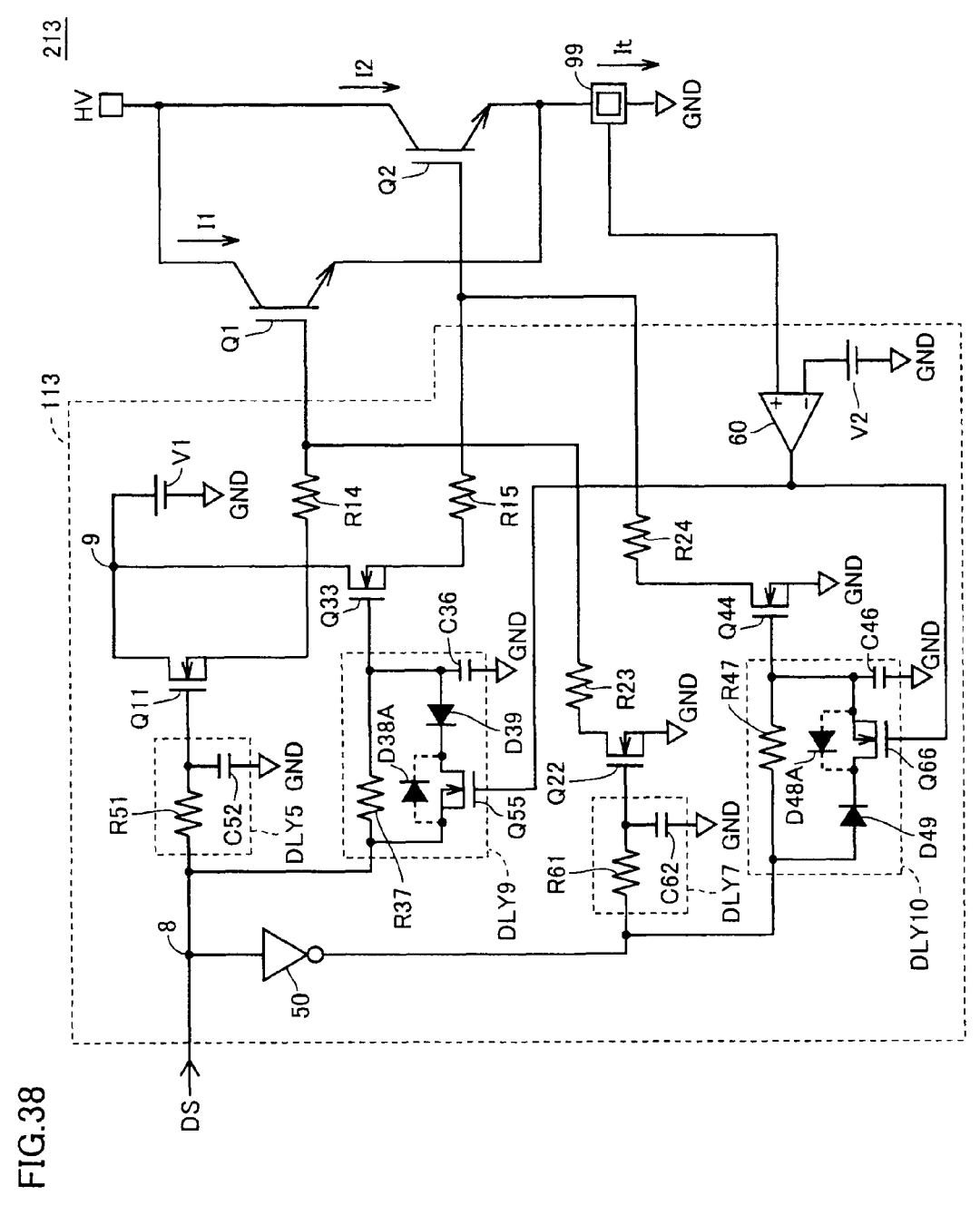

FIG. 38 is a circuit diagram showing a configuration of a power semiconductor device 213 according to Embodiment 20 of the present invention. A delay circuit DLY9 provided in a drive control unit 113 in FIG. 38 is different from delay circuit DLY6 in FIG. 36 in further including a diode D39. Diode D39 has a cathode connected to the drain of transistor Q55 and an anode connected the gate of transistor Q33. A delay circuit DLY10 provided in drive control unit 113 is different from delay circuit DLY8 in FIG. 36 in further including a diode D49. Diode D49 has a cathode connected to the drain of transistor Q66 and an anode connected to the output node of inverter 50. Since FIG. 38 is otherwise the same as FIG. 36, the same or corresponding elements have the same reference characters allotted and description will not be repeated.

According to drive control unit 113 in FIG. 38, in a case where drive signal DS switches from the L level to the H level (at this time point, an output voltage from current detection sensor 99 is equal to or lower than reference voltage V2), transistor Q11 switches from OFF to ON with delay time period DT1, whereas transistor Q33 switches from OFF to ON with delay time period DT3 (DT3>DT1). Further, in this case, transistor Q22 switches from ON to OFF with delay time period DT2, whereas transistor Q44 switches from ON to OFF with delay time period DT4 (DT4>DT2), As a result of switching of transistors Q11, Q22, Q33, Q44 above, IGBT Q1 is turned on first and thereafter IGBT Q2 is turned on.

In a case where drive signal DS switches from the H level to the L level, timing of switching of transistors Q11, Q22, Q33, Q44 is the same as in FIG. 36. Namely, in a case where an output voltage from current detection sensor 99 is equal to or lower than reference voltage V2, IGBT Q1 is turned off first and thereafter IGBT Q2 is turned off. When an output voltage from current detection sensor 99 exceeds reference voltage V2, IGBTs Q1, Q2 are simultaneously turned off.

Embodiment 21

Figure 39:
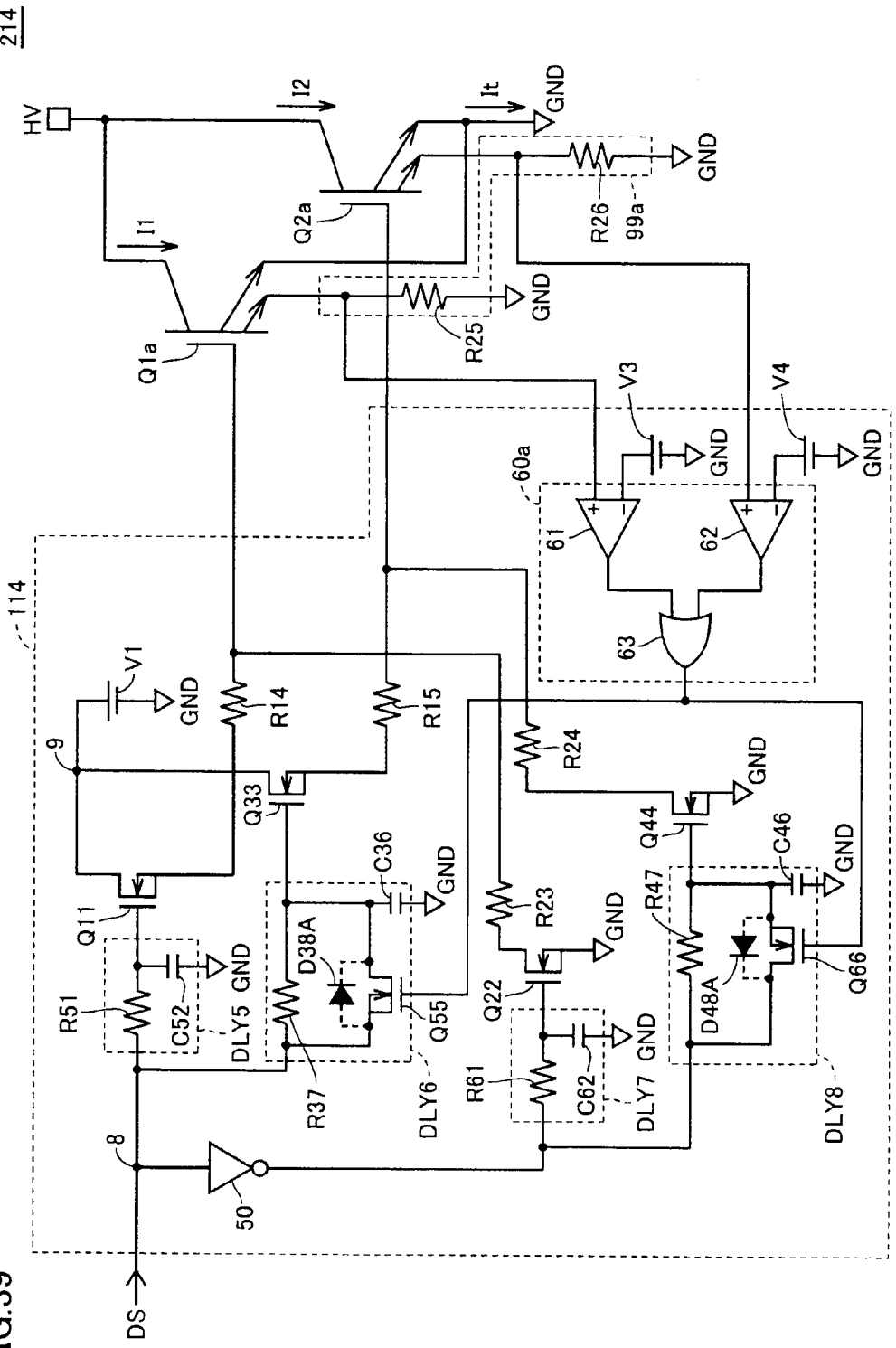
FIG. 39 is a circuit diagram showing a configuration of a power semiconductor device 214 according to Embodiment 21 of the present invention.

FIG. 39 is a circuit diagram showing a configuration of a power semiconductor device 214 according to Embodiment 21 of the present invention.

Power semiconductor device 214 in FIG. 39 is a variation of power semiconductor device 212 in FIG. 36. Namely, power semiconductor device 214 is different From power semiconductor device 212 in including IGBTs Q1a, Q2a with a sensing terminal instead of IGBTs Q1, Q2 in FIG. 36. A part of a main current that flows through an emitter terminal of an IGBT flows through a sensing terminal as diverted. In addition, power semiconductor device 214 is different from power semiconductor device 212 in including shunt resistors R25, R26 instead of current detection sensor 90 in FIG. 36. Shunt resistor R25 is connected between the sensing terminal of IGBT Q1a and ground node GND and shunt resistor R26 is connected between the sensing terminal of IGBT Q2a and ground node GND. Likewise current detection sensor 99 in FIG. 36, shunt resistors R25, R26 function as current detection sensor 99a for monitoring main currents I1, I2 that flow through IGBTs Q1a, Q2a, respectively.

In addition, a drive control unit 114 in FIG. 39 is different from drive control unit 112 in FIG. 36 in including a logic circuit 60a instead of comparator 60. Logic circuit 60a includes comparators 61, 62 and an OR circuit 63.

Comparator 61 determines whether or not a voltage across shunt resistor R25 exceeds a reference voltage V3 corresponding to threshold value Ith2 described with reference to FIG. 4. Comparator 61 outputs a signal at the H level when a voltage across shunt resistor R25 exceeds reference voltage V3 and outputs a signal at the L level when it is equal to or lower than reference voltage V3. Similarly, comparator 62 determines whether or not a voltage across shunt resistor R26 exceeds a reference voltage V4 corresponding to threshold value Ith2 described with reference to FIG. 4, Comparator 62 outputs a signal at the H level when a voltage across shunt resistor R26 exceeds reference voltage V4 and outputs a signal at the L level when it is equal to or lower than reference voltage V4.

OR circuit 63 outputs a result of a logical OR operation of outputs from comparators 61, 62 to gate electrodes of transistors Q55, Q66. Therefore, when at least one of a voltage across shunt resistor R25 and a voltage across shunt resistor R26 exceeds a corresponding reference voltage, transistors Q55, Q66 are turned on. Since FIG. 39 is otherwise the same as FIG. 36, the same or corresponding elements have the same reference characters allotted and description will not be repeated.

An operation of drive control unit 114 in FIG. 39 is similar to the operation of drive control unit 112 in FIG. 36. Initially, a time when drive signal DS switches from the L level to the H level will be described. At this time point, a voltage across shunt resistor R25 is lower than reference voltage V3 and a voltage of shunt resistor R26 is lower than reference voltage V4. Therefore, transistors Q11 and Q33 are switched from OFF to ON with delay time period DT1. In addition, transistors Q22 and Q44 are switched from ON to OFF with delay time period DT2. As a result of switching of transistors Q11, Q22, Q33, Q44 above, IGBTs Q1a, Q2a are simultaneously turned on.

Then, a time when drive signal DS switches from the H level to the L level will be described. Here, timing of turn-off of IGBTs Q1a, Q2a is different depending on magnitude of currents I1, I2 that flow through IGBTs Q1a, Q2a. Namely, in a first case where a voltage across shunt resistor R25 is lower than reference voltage V3 and a voltage of shunt resistor R26 is lower than reference voltage V4, transistor Q11 is switched from ON to OFF with delay time period DT1 and transistor Q33 is switched from ON to OFF with delay time period DT3 (DT3>DT1). In addition, transistor Q22 is switched from OFF to ON with delay time period DT2 and transistor Q44 is switched from OFF to ON with delay time period DT4 (DT4>DT2). As a result of switching of transistors Q11, Q22, Q33, Q44 above, IGBT Q1a is turned off first and thereafter IGBT Q2a is turned off.

Meanwhile, in a second case where at least one of a voltage across shunt resistor R25 and a voltage across shunt resistor R26 exceeds a corresponding reference voltage, transistors Q11 and Q33 are switched from ON to OFF with delay time period DT1. In addition, transistors Q22 and Q44 are switched from OFF to ON with delay time period DT2. As a result of switching of transistors Q11, Q22, Q33, Q44 above, IGBTs Q1a, Q2a are simultaneously turned off.

It is noted that the configuration may be such that only any one of two IGBTs connected in parallel is changed to an IGBT with a sensing terminal to thereby monitor a current that flows through a sensing IGBT with a shunt resistor. In a case where only shunt resistor R25 is provided, logic circuit 60a is implemented only by comparator 61. When a voltage across shunt resistor R25 exceeds reference voltage V3 corresponding to threshold value Ith2, comparator 61 outputs a voltage at the H level to the gates of transistors Q55, Q66, to thereby turn on these transistors Q55, Q66. In contrast, in a case where only shunt resistor R26 is provided, logic circuit 60a is implemented only by comparator 62. When a voltage across shunt resistor R26 exceeds reference voltage V4 corresponding to threshold value Ith2, comparator 62 outputs a voltage at the H level to the gates of transistors Q55, Q66, to thereby turn on these transistors Q55, Q66.

Embodiment 22

Figure 40:
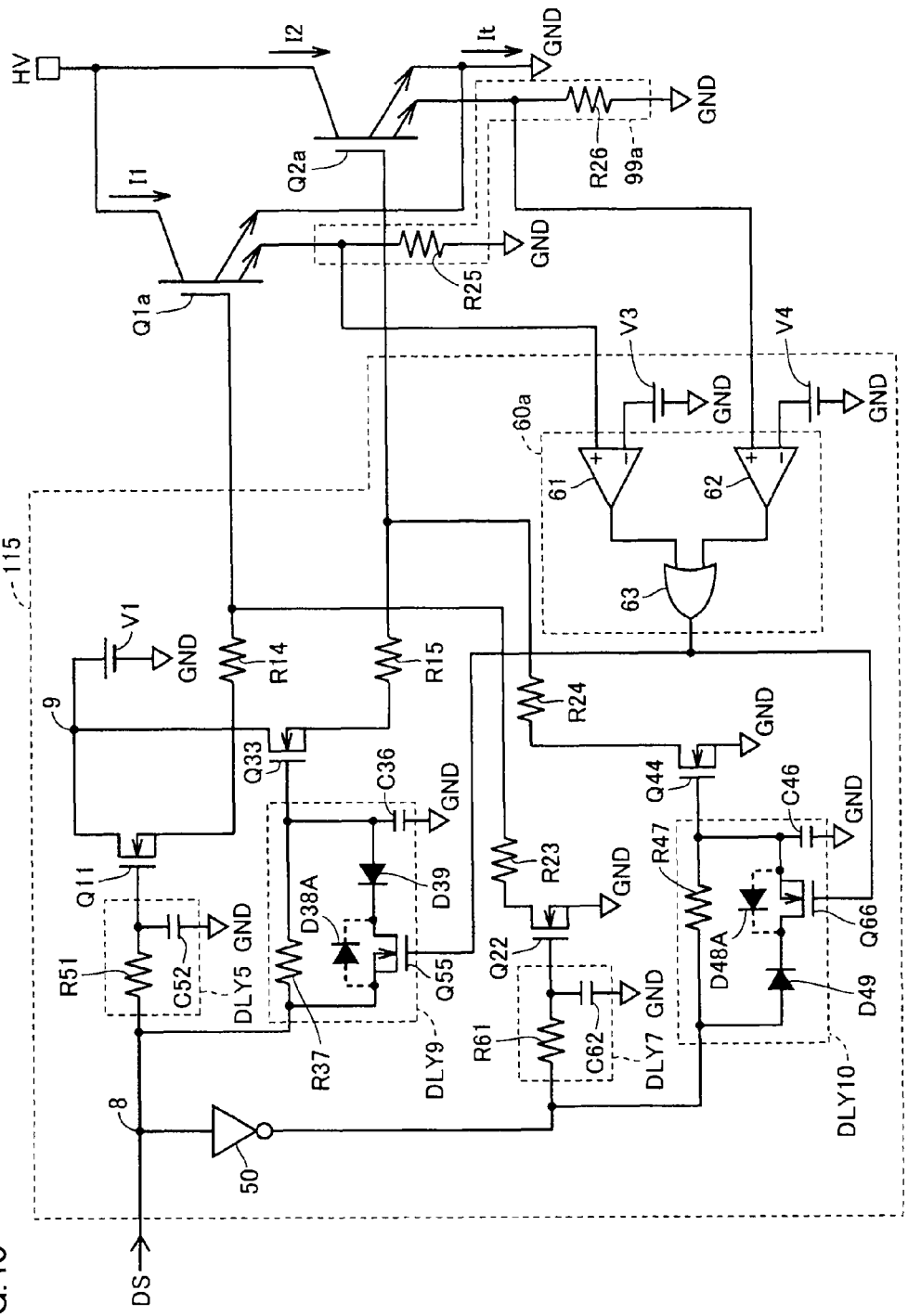
FIG. 40 is a circuit diagram showing a configuration of a power semiconductor device 215 according to Embodiment 22 of the present invention.

FIG. 40 is a circuit diagram showing a configuration of a power semiconductor device 215 according to Embodiment 22 of the present invention. Delay circuit DLY9 provided in a drive control unit 115 in FIG. 40 is different from delay circuit DLY6 in FIG. 39 in further including diode D39. Diode D39 has the cathode connected to the drain of transistor Q55 and the anode connected the gate of transistor Q33. Delay circuit DLY10 provided in drive control unit 115 is different from delay circuit DLY8 in FIG. 39 in further including diode D49. Diode D49 has the cathode connected to the drain of transistor Q66 and the anode connected to the output node of inverter 50. Since FIG. 40 is otherwise the same as FIG. 39, the same or corresponding elements have the same reference characters allotted and description will not be repeated.

An operation of drive control unit 115 in FIG. 40 is similar to the operation of drive control unit 113 in FIG. 38. Initially, a time when drive signal DS switches from the L level to the H level will be described. At this time point, a voltage across shunt resistor R25 is lower than reference voltage V3 and a voltage across shunt resistor R26 is lower than reference voltage V4. Therefore, transistor Q11 is switched from OFF to ON with delay time period DT1, whereas transistor Q33 is switched from OFF to ON with delay time period DT3 (DT3>DT1). In addition, transistor Q22 is switched from ON to OFF with delay time period DT2, whereas transistor Q44 is switched from ON to OFF with delay time period DT4 (DT4>DT2). As a result of switching of transistors Q11, Q22, Q33, Q44 above, IGBT Q1a is turned on first and thereafter IGBT Q2a is turned on.

Then, when drive signal DS switches from the H level to the L level, timing of switching of transistors Q11, Q22, Q33, Q44 and resultant timing of switching of IGBTs Q1a, Q2a are the same as in FIG. 39. Namely, in a first case where a voltage across shunt resistor R25 is lower than reference voltage V3 and a voltage of shunt resistor R26 is lower than reference voltage V4, IGBT Q1a is turned off first and thereafter IGBT Q2a is turned off. In a second case where at least one of a voltage across shunt resistor R25 and a voltage across shunt resistor R26 exceeds a corresponding reference voltage, IGBTs Q1a, Q2a are simultaneously turned off.

It is noted that, in FIG. 40 as well, as in the case of FIG. 39, the configuration may be such that only any one of two IGBTs connected in parallel is changed to an IGBT with a sensing terminal to thereby monitor a current that flows through a sensing IGBT with a shunt resistor. In a case where only shunt resistor R25 is provided, logic circuit 60a is implemented only by comparator 61. In contrast, in a case where only shunt resistor R26 is provided, logic circuit 60a is implemented only by comparator 62.

Although the present invention has been described and illustrated in detail, it is clearly understood that the same is by way of illustration and example only and is not to be taken by way of limitation, the scope of the present invention being interpreted by the terms of the appended claims.

What is claimed is:
1. A power semiconductor device, comprising:
first and second power semiconductor elements connected in parallel to each other; and
a drive control unit for turning on or off each of said first and second power semiconductor elements in response to an ON instruction and an OFF instruction repeatedly received from outside,
said drive control unit being capable of switching between a case where said first and second power semiconductor elements are simultaneously turned on and a case where one of said first and second power semiconductor elements is turned on first and thereafter the other thereof is turned on, in response to said ON instruction, and
said drive control unit being capable of switching between a case where said first and second power semiconductor elements are simultaneously turned off and a case where one of said first and second power semiconductor elements is turned off first and thereafter the other thereof is turned off, in response to said OFF instruction,
the power semiconductor device further comprising a current detection portion for detecting a current that flows through at least one of, or a sum of currents that flow through both of, said first and second power semiconductor elements, wherein
said drive control unit performs a determination operation for comparing a current detection value obtained by said current detection portion when said first and second power semiconductor elements are turned on in response to said ON instruction with a first threshold value and a second threshold value greater than said first threshold value,
said drive control unit turns on one of said first and second power semiconductor elements first and thereafter turns on the other thereof in response to said ON instruction received during a period until next said determination operation and turns off one of said first and second power semiconductor elements first and thereafter turns off the other thereof in response to said OFF instruction received during a period until next said determination operation, when said current detection value is equal to or smaller than said first threshold value,
said drive control unit simultaneously turns on said first and second power semiconductor elements in response to said ON instruction received during a period until next said determination operation and turns off one of said first and second power semiconductor elements first and thereafter turns off the other thereof in response to said OFF instruction received during a period until next said determination operation, when said current detection value is greater than said first threshold value and is equal to or smaller than said second threshold value, and
said drive control unit simultaneously turns on said first and second power semiconductor elements in response to said ON instruction received during a period until next said determination operation and simultaneously turns off said first and second power semiconductor elements in response to said OFF instruction received during a period until next said determination operation when said current detection value exceeds said second threshold value.

2. The power semiconductor device according to claim 1, wherein each of said first and second power semiconductor elements has a sensing electrode through which a part of a main current flows as diverted, and said current detection portion includes
- a first detection resistor element connected to said sensing electrode of said first power semiconductor element, and
- a second detection resistor element connected to said sensing electrode of said second power semiconductor element.

3. The power semiconductor device according to claim 1, wherein said first power semiconductor element in an ON state is lower in saturation voltage than said second power semiconductor element, and when said drive control unit turns off one of said first and second power semiconductor elements first and thereafter turns off the other thereof in response to said OFF instruction, said drive control unit turns off said first power semiconductor element earlier than said second power semiconductor element.

4. The power semiconductor device according to claim 1, wherein each of said first and second power semiconductor elements has a control electrode and it is switched from ON to OFF when a voltage applied to the control electrode is equal to or smaller than a threshold voltage, said first power semiconductor element is higher in threshold voltage than said second power semiconductor element, and when said drive control unit turns off one of said first and second power semiconductor elements first and thereafter turns off the other thereof in response to said OFF instruction, said drive control unit turns off said first power semiconductor element earlier than said second power semiconductor element.

5. The power semiconductor device according to claim 1, wherein said first power semiconductor element is a bipolar transistor, said second power semiconductor element is a unipolar transistor, and when said drive control unit turns off one of said first and second power semiconductor elements first and thereafter turns off the other thereof in response to said OFF instruction, said drive control unit turns off said first power semiconductor element earlier than said second power semiconductor element.

6. A power semiconductor device, comprising:

first and second power semiconductor elements connected in parallel to each other; and a drive control unit for turning on or off each of said first and second power semiconductor elements in response to an ON instruction and an OFF instruction repeatedly received from outside, said drive control unit being capable of switching between a case where said first and second power semiconductor elements are simultaneously turned on and a case where one of said first and second power semiconductor elements is turned on first and thereafter the other thereof is turned on, in response to said ON instruction, and said drive control unit being capable of switching between a case where said first and second power semiconductor elements are simultaneously turned off and a case where one of said first and second power semiconductor elements is turned off first and thereafter the other thereof is turned off, in response to said OFF instruction, wherein:

when said drive control unit turns on one of said first and second power semiconductor elements first and thereafter turns on the other thereof in response to said ON instruction, said drive control unit switches between a power semiconductor element to be turned on first and a power semiconductor element to be turned on later, each time it receives said ON instruction.

7. A power semiconductor device, comprising:

first and second power semiconductor elements connected in parallel to each other; and a drive control unit for turning on or off each of said first and second power semiconductor elements in response to an ON instruction and an OFF instruction repeatedly received from outside, said drive control unit being capable of switching between a case where said first and second power semiconductor elements are simultaneously turned on and a case where one of said first and second power semiconductor elements is turned on first and thereafter the other thereof is turned on, in response to said ON instruction, and said drive control unit being capable of switching between a case where said first and second power semiconductor elements are simultaneously turned off and a case where one of said first and second power semiconductor elements is turned off first and thereafter the other thereof is turned off, in response to said OFF instruction, wherein:

when said drive control unit turns off one of said first and second power semiconductor elements first and thereafter turns off the other thereof in response to said OFF instruction, said drive control unit switches between a power semiconductor element to be turned off first and a power semiconductor element to be turned off later, each time it receives said OFF instruction.

8. A power semiconductor device, comprising:

first and second power semiconductor elements connected in parallel to each other; and a drive control unit for turning on or off each of said first and second power semiconductor elements in response to an ON instruction and an OFF instruction repeatedly received from outside, said drive control unit being capable of switching between a case where said first and second power semiconductor elements are simultaneously turned on and a case where one of said first and second power semiconductor elements is turned on first and thereafter the other thereof is turned on, in response to said ON instruction, and said drive control unit being capable of switching between a case where said first and second power semiconductor elements are simultaneously turned off and a case where one of said first and second power semiconductor elements is turned off first and thereafter the other thereof is turned off, in response to said OFF instruction, wherein:

each of said first and second power semiconductor elements has a control electrode and it is switched to ON or OFF in accordance with a voltage applied to the control electrode, and said drive control unit includes
- a power supply for drive connected between first and second nodes,
- a control circuit receiving a drive signal of which logic level is varied in response to said ON instruction and said OFF instruction and outputting first to fourth control signals varying in response to said drive signal, a first resistor element having one end connected to the control electrode of said first power semiconductor element, a first drive transistor connected between the other end of said first resistor element and said first node and receiving said first control signal at a control electrode, a second resistor element having one end connected to the control electrode of said first power semiconductor element, a second drive transistor connected between the other end of said second resistor element and said second node and receiving said second control signal at a control electrode, a third resistor element having one end connected to the control electrode of said second power semiconductor element, a third drive transistor connected between the other end of said third resistor element and said first node and receiving said third control signal at a control electrode, a fourth resistor element having one end connected to the control electrode of said second power semiconductor element, and a fourth drive transistor connected between the other end of said fourth resistor element and said second node and receiving said fourth control signal at a control electrode.

9. A power semiconductor device, comprising:

first and second power semiconductor elements connected in parallel to each other; and a drive control unit for turning on or off each of said first and second power semiconductor elements in response to an ON instruction and an OFF instruction repeatedly received from outside, said drive control unit being capable of switching between a case where said first and second power semiconductor elements are simultaneously turned on and a case where one of said first and second power semiconductor elements is turned on first and thereafter the other thereof is turned on, in response to said ON instruction, and said drive control unit turning off one of said first and second power semiconductor elements first and thereafter turning off the other thereof, in response to said OFF instruction, the power semiconductor device further comprising a current detection portion for detecting a current that flows through at least one of, or a sum of currents that flow through both of, said first and second power semiconductor elements, wherein said drive control unit performs a determination operation for determining whether a current detection value obtained by said current detection portion is equal to or smaller than a first threshold value when said first and second power semiconductor elements are turned on in response to said ON instruction, said drive control unit turns on one of said first and second power semiconductor elements first and thereafter turns on the other thereof in response to said ON instruction received during a period until next said determination operation, when said current detection value is equal to or smaller than said first threshold value, and said drive control unit simultaneously turns on said first and second power semiconductor elements in response to said ON instruction received during a period until next said determination operation when said current detection value exceeds said first threshold value.

10. A power semiconductor device, comprising:

first and second power semiconductor elements connected in parallel to each other; and a drive control unit for turning on or off each of said first and second power semiconductor elements in response to an ON instruction and an OFF instruction repeatedly received from outside, said drive control unit simultaneously turning on said first and second power semiconductor elements in response to said ON instruction, and said drive control unit being capable of switching between a case where said first and second power semiconductor elements are simultaneously turned off and a case where one of said first and second power semiconductor elements is turned off first and thereafter the other thereof is turned off, in response to said OFF instruction, the power semiconductor device further comprising a current detection portion for detecting a current that flows through at least one of, or a sum of currents that flow through both of, said first and second power semiconductor elements, wherein said drive control unit performs a determination operation for determining whether a current detection value obtained by said current detection portion is equal to or smaller than a second threshold value when said first and second power semiconductor elements are turned on in response to said ON instruction, said drive control unit turns off one of said first and second power semiconductor elements first and thereafter turns off the other thereof in response to said OFF instruction received during a period until next said determination operation, when said current detection value is equal to or smaller than said second threshold value, and said drive control unit simultaneously turns off said first and second power semiconductor elements in response to said OFF instruction received during a period until next said determination operation when said current detection value exceeds said second threshold value.

11. The power semiconductor device according to claim 10, wherein each of said first and second power semiconductor elements has a control electrode and it is switched from OFF to ON when it receives a drive voltage at said control electrode, said drive control unit includes a power supply for drive connected between first and second nodes and outputting said drive voltage, an input node receiving a drive signal of which logic level is varied in response to said ON instruction and said OFF instruction, an inverter for inverting the logic level of said drive signal received at said input node, a logic circuit for determining whether a current detection value obtained by said current detection portion is equal to or smaller than said second threshold value, a first delay circuit receiving said drive signal and delaying both of a rising edge and a falling edge of said drive signal by a first delay time period, a second delay circuit receiving an output from said inverter and delaying both of a rising edge and a falling edge of the output from said inverter by a second delay time period, a first resistor element having one end connected to the control electrode of said first power semiconductor element, a first drive transistor connected between the other end of said first resistor element and said first node and receiving an output from said first delay circuit at a control electrode, a second resistor element having one end connected to the control electrode of said first power semiconductor element, a second drive transistor connected between the other end of said second resistor element and said second node and receiving an output from said second delay circuit at a control electrode, a third delay circuit receiving said drive signal and delaying both of the rising edge and the falling edge of said drive signal, a fourth delay circuit receiving the output from said inverter and delaying both of the rising edge and the falling edge of the output from said inverter, a third resistor element having one end connected to the control electrode of said second power semiconductor element, a third drive transistor connected between the other end of said third resistor element and said first node and receiving an output from said third delay circuit at a control electrode, a fourth resistor element having one end connected to the control electrode of said second power semiconductor element, and a fourth drive transistor connected between the other end of said fourth resistor element and said second node and receiving an output from said fourth delay circuit at a control electrode, said third delay circuit further receives a result of determination by said logic circuit, delays an edge corresponding to switching to ON of said third drive transistor by said first delay time period, and delays an edge corresponding to switching to OFF of said third drive transistor by a third delay time period greater than said first delay time period when said current detection value is equal to or smaller than said second threshold value or by said first delay time period when said current detection value exceeds said second threshold value, and said fourth delay circuit further receives the result of determination by said logic circuit, delays an edge corresponding to switching to ON of said fourth drive transistor, and delays an edge corresponding to switching to OFF of said fourth drive transistor by a fourth delay time period greater than said second delay time period when said current detection value is equal to or smaller than said second threshold value or by said second delay time period when said current detection value exceeds said second threshold value.

13. The power semiconductor device according to claim 11, wherein each of said first and second power semiconductor elements has a sensing electrode through which a part of a main current flows as diverted, said current detection portion includes a first detection resistor element connected to said sensing electrode of said first power semiconductor element, and a second detection resistor element connected to said sensing electrode of said second power semiconductor element, and said logic circuit includes a first comparator for determining whether a voltage applied to said first detection resistor element has exceeded a voltage corresponding to said second threshold value, a second comparator for determining whether a voltage applied to said second detection resistor element has exceeded the voltage corresponding to said second threshold value, and an OR circuit for outputting a logical OR of said first and second comparators as the result of determination by said logic circuit.

13. The power semiconductor device according to claim 10, wherein each of said first and second power semiconductor elements has a control electrode and it is switched to ON or OFF in accordance with a voltage applied to the control electrode, and said drive control unit includes a power supply for drive connected between first and second nodes, a control circuit receiving a drive signal of which logic level is varied in response to said ON instruction and said OFF instruction and outputting first to third control signals varying in response to said drive signal, a first drive transistor having a first main electrode connected to said first node and receiving said first control signal at a control electrode, a first resistor element having one end connected to the control electrode of said first power semiconductor element, a first diode connected between the other end of said first resistor element and a second main electrode of said first drive transistor and having a polarity with which it is rendered conductive when said first drive transistor is turned on, a second resistor element having one end connected to the control electrode of said first power semiconductor element, a second drive transistor connected between the other end of said second resistor element and said second node and receiving said second control signal at a control electrode, a third resistor element having one end connected to the control electrode of said second power semiconductor element, a second diode connected between the other end of said third resistor element and said second main electrode of said first drive transistor and having a polarity with which it is rendered conductive when said first drive transistor is turned on, a fourth resistor element having one end connected to the control electrode of said second power semiconductor element, and a third drive transistor connected between the other end of said fourth resistor element and said second node and receiving said third control signal at a control electrode.

14. The power semiconductor device according to claim 13, wherein a voltage obtained by division of an output voltage from said power supply for drive by said first and second resistor elements is lower than a threshold voltage at which said first power semiconductor element is switched to ON.

15. A power semiconductor device, comprising:
first and second power semiconductor elements connected in parallel to each other; and
a drive control unit for turning on or off each of said first and second power semiconductor elements in response to an ON instruction and an OFF instruction repeatedly received from outside,
said drive control unit turning on one of said first and second power semiconductor elements first and thereafter turning on the other thereof, in response to said ON instruction, and
said drive control unit being capable of switching between a case where said first and second power semiconductor elements are simultaneously turned off and a case where one of said first and second power semiconductor elements is turned off first and thereafter the other thereof is turned off, in response to said OFF instruction,
the power semiconductor device further comprising a current detection portion for detecting a current that flows through at least one of, or a sum of currents that flow through both of, said first and second power semiconductor elements, wherein
said drive control unit performs a determination operation for determining whether a current detection value obtained by said current detection portion is equal to or smaller than a second threshold value when said first and second power semiconductor elements are turned on in response to said ON instruction,
said drive control unit turns off one of said first and second power semiconductor elements first and thereafter turns off the other thereof in response to said OFF instruction received during a period until next said determination operation, when said current detection value is equal to or smaller than said second threshold value, and
said drive control unit simultaneously turns off said first and second power semiconductor elements in response to said OFF instruction received during a period until next said determination operation when said current detection value exceeds said second threshold value.

16. The power semiconductor device according to claim 15, wherein
each of said first and second power semiconductor elements has a control electrode and it is switched from OFF to ON when it receives a drive voltage at said control electrode,
said drive control unit includes
a power supply for drive connected between first and second nodes and outputting said drive voltage,
an input node receiving a drive signal of which logic level is varied in response to said ON instruction and said OFF instruction,
an inverter for inverting the logic level of said drive signal received at said input node,
a logic circuit for determining whether a current detection value obtained by said current detection portion is equal to or smaller than said second threshold value,
a first delay circuit receiving said drive signal and delaying both of a rising edge and a falling edge of said drive signal by a first delay time period,
a second delay circuit receiving an output from said inverter and delaying both of a rising edge and a falling edge of the output from said inverter by a second delay time period,
a first resistor element having one end connected to the control electrode of said first power semiconductor element,
a first drive transistor connected between the other end of said first resistor element and said first node and receiving an output from said first delay circuit at a control electrode,
a second resistor element having one end connected to the control electrode of said first power semiconductor element,
a second drive transistor connected between the other end of said second resistor element and said second node and receiving an output from said second delay circuit at a control electrode,
a third delay circuit receiving said drive signal and delaying both of the rising edge and the falling edge of said drive signal,
a fourth delay circuit receiving the output from said inverter and delaying both of the rising edge and the falling edge of the output from said inverter,
a third resistor element having one end connected to the control electrode of said second power semiconductor element,
a third drive transistor connected between the other end of said third resistor element and said first node and receiving an output from said third delay circuit at a control electrode,
a fourth resistor element having one end connected to the control electrode of said second power semiconductor element, and
a fourth drive transistor connected between the other end of said fourth resistor element and said second node and receiving an output from said fourth delay circuit at a control electrode,
said third delay circuit further receives a result of determination by said logic circuit, delays an edge corresponding to switching to ON of said third drive transistor by a third delay time period greater than said first delay time period, and delays an edge corresponding to switching to OFF of said third drive transistor by said third delay time period when said current detection value is equal to or smaller than said second threshold value or by said first delay time period when said current detection value exceeds said second threshold value, and
said fourth delay circuit further receives the result of determination by said logic circuit, and delays an edge corresponding to switching to ON of said fourth drive transistor by a fourth delay time period greater than said second delay time period, and delays an edge corresponding to switching to OFF of said fourth drive transistor by said fourth delay time period when said current detection value is equal to or smaller than said second threshold value or by said second delay time period when said current detection value exceeds said second threshold value.

* * * * *